United States Patent
Nakanishi et al.

(10) Patent No.: US 9,721,957 B2
(45) Date of Patent: Aug. 1, 2017

(54) STATIC RANDOM ACCESS MEMORY (SRAM) CELLS INCLUDING VERTICAL CHANNEL TRANSISTORS

(71) Applicant: Samsung Electronics Co., Ltd., Suwon-si, Gyeonggi-do (KR)

(72) Inventors: Toshiro Nakanishi, Seongnam-si (KR); Donghwan Kim, Suwon-si (KR); Suhwan Kim, Seoul (KR); Yubin Kim, Suwon-si (KR); Jin Soak Kim, Seoul (KR); Gabjin Nam, Seoul (KR); Sungkweon Baek, Hwaseong-si (KR); Taehyun An, Seoul (KR); Eunae Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 14/563,695

(22) Filed: Dec. 8, 2014

(65) Prior Publication Data

US 2015/0179655 A1 Jun. 25, 2015

(30) Foreign Application Priority Data

Dec. 20, 2013 (KR) .................. 10-2013-0160353

(51) Int. Cl.
*H01L 27/11* (2006.01)
*H01L 51/05* (2006.01)
*H01L 51/00* (2006.01)

(52) U.S. Cl.
CPC ........ *H01L 27/1104* (2013.01); *H01L 51/057* (2013.01); *H01L 51/0575* (2013.01); *H01L 51/0048* (2013.01)

(58) Field of Classification Search
CPC . H01L 27/1104; H01L 27/281; H01L 51/0048
USPC ......................................... 257/903
See application file for complete search history.

(56) References Cited

U.S. PATENT DOCUMENTS

| | | | |
|---|---|---|---|
| 4,566,025 A * | 1/1986 | Jastrzebski | H01L 21/28 257/331 |
| 5,583,362 A | 12/1996 | Maegawa | |
| 5,705,405 A | 1/1998 | Cunningham | |
| 5,780,911 A | 7/1998 | Park et al. | |
| 6,534,807 B2 | 3/2003 | Mandelman et al. | |
| 7,138,685 B2 | 11/2006 | Hsu et al. | |
| 7,605,447 B2 | 10/2009 | Doris et al. | |
| 7,829,952 B2 | 11/2010 | Moniwa et al. | |
| 8,064,249 B2 | 11/2011 | Jang et al. | |
| 8,129,796 B2 | 3/2012 | Masuoka et al. | |
| 8,183,636 B2 | 5/2012 | Berthold et al. | |
| 8,198,654 B2 | 6/2012 | Masuoka et al. | |
| 8,400,811 B2 | 3/2013 | Carman et al. | |

(Continued)

FOREIGN PATENT DOCUMENTS

| | | |
|---|---|---|
| JP | 2004-039806 A | 2/2004 |
| JP | 2012-004473 A | 1/2012 |
| KR | 10-2002-0056348 A | 7/2002 |

*Primary Examiner* — Mark Prenty
(74) *Attorney, Agent, or Firm* — Ward and Smith, P.A.

(57) ABSTRACT

A static random access memory (SRAM) cell can include a first pull-up transistor, a first pull-down transistor, a second pull-up transistor, a second pull-down transistor, a first access transistor, and a second access transistor, all being coupled together in a 6 transistor SRAM cell, wherein each of the transistors is configured as a vertical channel transistor.

13 Claims, 80 Drawing Sheets

(56) References Cited

U.S. PATENT DOCUMENTS

| | | | |
|---|---|---|---|
| 8,969,949 B2* | 3/2015 | Chuang | H01L 27/11 257/220 |
| 2009/0173934 A1 | 7/2009 | Jain | |
| 2011/0062529 A1 | 3/2011 | Masuoka et al. | |
| 2011/0299325 A1 | 12/2011 | Kim | |

* cited by examiner

STATIC RANDOM ACCESS MEMORY (SRAM) CELLS INCLUDING VERTICAL CHANNEL TRANSISTORS

CROSS-REFERENCE TO RELATED APPLICATION

This U.S. non-provisional patent application claims priority under 35 U.S.C. §119 to Korean Patent Application No. 10-2013-0160353, filed on Dec. 20, 2013, in the Korean Intellectual Property Office, the disclosure of which is hereby incorporated by reference in its entirety.

BACKGROUND

The inventive concepts relate to semiconductor devices and methods of manufacturing the same and, more particularly, to static random access memory (SRAM) cells and methods of manufacturing the same.

Semiconductor devices are widely used because of their small size, multi-function, and/or low manufacture costs. Some semiconductor devices may include memory cells for storing logical data.

Memory cells may be categorized as either nonvolatile memory cells or volatile memory cells. The nonvolatile memory cells may retain stored data even when power is interrupted. Nonvolatile memory cells may include flash memory cells, phase change memory cells, and magnetic memory cells. In contrast, volatile memory cells may lose stored data when power is interrupted. Volatile memory cells may include dynamic random access memory (DRAM) cells and SRAM cells. SRAM cells typically exhibit a higher operational speed and lower power consumption than DRAM cells. However, the planar area used by a SRAM cell may be greater than that used by a DRAM cell.

SUMMARY

Embodiments of the inventive concepts are directed to highly integrated SRAM cells and methods of manufacturing the same.

In one aspect, the SRAM cell may include: a first access gate, a first shared gate, a second access gate, and a second shared gate laterally spaced apart from each other on a substrate; a first access vertical channel portion penetrating the first access gate; a first pull-up vertical channel portion and a first pull-down vertical channel portion which penetrate the first shared gate; a second access vertical channel portion penetrating the second access gate; a second pull-up vertical channel portion and a second pull-down vertical channel portion which penetrate the second shared gate; and a gate dielectric layer disposed between each of the vertical channel portions and corresponding ones of the gates. Bottom end portions of each of the first access vertical channel portion, the first pull-up vertical channel portion and the first pull-down vertical channel portion may be electrically connected to the second shared gate. Bottom end portions of each of the second access vertical channel portion, the second pull-up vertical channel portion and the second pull-down vertical channel portion may be electrically connected to the first shared gate.

In some embodiments, the SRAM cell may further include: a first node electrode electrically connected to the bottom end portions of the first access, first pull-up and first pull-down vertical channel portions; and a second node electrode electrically connected to the bottom end portions of the second access, second pull-up and second pull-down vertical channel portions. The first node electrode may be electrically connected to the second shared gate, and the second node electrode may be electrically connected to the first shared gate.

In some embodiments, the SRAM cell may further include: a first node extension laterally extending from the first node electrode and electrically connected to the second shared gate; and a second node extension laterally extending from the second node electrode and electrically connected to the first shared gate.

In some embodiments, the first node extension may be electrically connected to the second shared gate through a first local interconnection or a first local interconnection contact plug, and the second node extension may be electrically connected to the first shared gate through a second local interconnection or a second local interconnection contact plug.

In some embodiments, the first node electrode may be disposed under the first access gate and the first shared gate. The first access vertical channel portion, the first pull-up vertical channel portion, and the first pull-down vertical channel portion may further penetrate the first node electrode to contact the substrate. The second node electrode may be disposed under the second access gate and the second shared gate. The second access vertical channel portion, the second pull-up vertical channel portion, and the second pull-down vertical channel portion may further penetrate the second node electrode to contact the substrate.

In some embodiments, the first and second access vertical channel portions, the first and second pull-up vertical channel portions, and the first and second pull-down vertical channel portions may include a single-crystalline semiconductor material.

In some embodiments, the SRAM cell may further include: a device isolation pattern disposed in the substrate to define a first active portion and a second active portion; a first N-type dopant region and a second N-type dopant region in the first active portion and the second active portion, respectively; and a first P-type dopant region and a second P-type dopant region formed in the first N-type dopant region and the second N-type dopant region, respectively. In this case, the first node electrode may be in contact with the first N-type dopant region and the first P-type dopant region, and the second node electrode may be in contact with the second N-type dopant region and the second P-type dopant region. The first access vertical channel portion and the first pull-down vertical channel portion may be in contact with the first N-type dopant region, and the first pull-up vertical channel portion may be in contact with the first P-type dopant region. The second access vertical channel portion and the second pull-down vertical channel portion may be in contact with the second N-type dopant region, and the second pull-up vertical channel portion may be in contact with the second P-type dopant region.

In some embodiments, the first access vertical channel portion, the first pull-up vertical channel portion, and the first pull-down vertical channel portion may be electrically connected to a top surface of the first node electrode. The second access vertical channel portion, the second pull-up vertical channel portion, and the second pull-down vertical channel portion may be electrically connected to a top surface of the second node electrode.

In some embodiments, the SRAM cell may further include: a first access capping pattern and a first shared capping pattern on the first access gate and the first shared gate, respectively; and a second access capping pattern and a second shared capping pattern on the second access gate and the second shared gate, respectively. The gate dielectric layer may extend to between a top surface of each of the gates and a bottom surface of each of the capping patterns and between a bottom surface of each of the gates and the substrate.

In some embodiments, the SRAM cell may further include: a word line electrically connected to the first and second access gates; a first bit line electrically connected to a top end of the first access vertical channel portion; and a second bit line electrically connected to a top end of the second access vertical channel portion. In an operating mode, a power source voltage may be applied to top ends of the first and second pull-up vertical channel portions, and a ground voltage may be applied to top ends of the first and second pull-down vertical channel portions.

In some embodiments, the first and second access vertical channel portions, the first and second pull-up vertical channel portions, and the first and second pull-down vertical channel portions may include one of a group IV semiconductor material, a group III-V compound semiconductor material, and a carbon nanotube.

In another aspect, the method may include: sequentially forming a sacrificial layer and a capping insulating layer on a substrate; forming vertical channel portions penetrating the capping insulating layer and the sacrificial layer, the vertical channel portions including first and second access vertical channel portions, first and second pull-up vertical channel portions, and first and second pull-down vertical channel portions; successively patterning the capping insulating layer and the sacrificial layer to form first to fourth sacrificial patterns and first to fourth capping patterns; removing the first to fourth sacrificial patterns to form first to fourth empty regions; forming a gate dielectric layer in the first to fourth empty regions; and forming a first access gate, a first shared gate, a second access gate, and a second shared gate in the first to fourth empty regions, respectively.

In some embodiments, the method may further include: forming a first node electrode and a second node electrode laterally spaced apart from each other on the substrate. Bottom end portions of the first access, first pull-up and first pull-down vertical channel portions may be electrically connected to the first node electrode. Bottom end portions of the second access, second pull-up and second pull-down vertical channel portions may be electrically connected to the second node electrode. The first node electrode may be electrically connected to the second shared gate, and the second node electrode may be electrically connected to the first shared gate.

In some embodiments, forming the vertical channel portions may include: forming channel holes penetrating the capping insulating layer and the sacrificial layer, the channel holes exposing the substrate, and the channel holes including first and second access channel holes, first and second pull-up channel holes, and first and second pull-down channel holes; and performing an epitaxial process using the substrate exposed by the channel holes as a seed.

In some embodiments, the first and second node electrodes may be formed before or after the formation of the vertical channel portions.

In some embodiments, a static random access memory (SRAM) cell can include a first pull-up transistor, a first pull-down transistor, a second pull-up transistor, a second pull-down transistor, a first access transistor, and a second access transistor, which may all be coupled together in a 6 transistor SRAM cell, wherein each of the transistors is configured as a vertical channel transistor.

In some embodiments, the first pull-up transistor can include a first vertical channel pull-up transistor that is coupled to a power supply voltage, and the first pull-down transistor can include a first pull-down vertical channel transistor that is coupled to a reference voltage and that is coupled to the first pull-up vertical channel transistor to provide a first inverter circuit of the SRAM, and the second pull-up transistor can include a second pull-up vertical channel transistor that is coupled to the power supply voltage, and the second pull-down transistor can include a second pull-down vertical channel transistor that is coupled to the reference voltage and that is coupled to the second pull-up vertical channel transistor to provide a second inverter circuit of the SRAM that is cross-coupled to the first inverter circuit. The first access transistor can include a first access vertical channel transistor that is coupled to a first bit line, a word line, the first inverter circuit, and to the second inverter circuit, and the second access transistor can include a second access vertical channel transistor that is coupled to a second bit line, the word line, and to the first inverter circuit.

In some embodiments, bottom ends of respective vertical channels in each of the first access vertical channel transistor, the first pull-up vertical channel transistor and the first pull-down vertical channel transistor can be electrically connected to a shared gate in the second inverter circuit and bottom ends of each of respective vertical channels in each of the second access vertical channel transistor, the second pull-up vertical channel transistor and the second pull-down vertical channel transistor can be electrically connected to a shared gate in the first inverter circuit.

In some embodiments, the first shared gate can be electrically coupled to a planar second node electrode and wherein the second shared gate can be electrically coupled to a planar first node electrode, where the SRAM cell can further include a first node planar extension that laterally extends from the planar first node electrode to the second shared gate. A second node planar extension can laterally extend from the planar second node electrode to the first shared gate.

In some embodiments, a first access vertical channel, a first pull-up vertical channel, and a first pull-down vertical channel can be electrically connected to a top surface of the planar first node electrode and a second access vertical channel, a second pull-up vertical channel, and a second pull-down vertical channel can be electrically connected to a top surface of the planar second node electrode.

BRIEF DESCRIPTION OF THE DRAWINGS

The inventive concepts will become more apparent in view of the attached drawings and accompanying detailed description.

FIGS. 2A to 10A are plan views illustrating methods of manufacturing an SRAM cell according to some embodiments of the inventive concept;

FIGS. 2B to 10B are cross-sectional views taken along lines I-I' of FIGS. 2A to 10A, respectively;

FIGS. 2C to 10C are cross-sectional views taken along lines II-II' of FIGS. 2A to 10A, respectively;

FIGS. 2D to 10D are cross-sectional views taken along lines III-III' of FIGS. 2A to 10A, respectively;

FIGS. 2E to 10E are cross-sectional views taken along lines IV-IV' of FIGS. 2A to 10A, respectively;

FIGS. 18A to 21A are plan views illustrating methods of manufacturing an SRAM cell according to still other embodiments of the inventive concept;

FIGS. 18B to 21B are cross-sectional views taken along lines A-A' of FIGS. 18A to 21A, respectively;

FIGS. 18C to 21C are cross-sectional views taken along lines B-B' of FIGS. 18A to 21A, respectively;

FIGS. 18D to 21D are cross-sectional views taken along lines C-C' of FIGS. 18A to 21A, respectively;

FIGS. 24A to 27A are plan views illustrating methods of manufacturing an SRAM cell according to embodiments of the inventive concept;

FIGS. 24B to 27B are cross-sectional views taken along lines I-I' of FIGS. 24A to 27A, respectively;

FIGS. 24C to 27C are cross-sectional views taken along lines II-II' of FIGS. 24A to 27A, respectively;

FIGS. 24D to 27D are cross-sectional views taken along lines III-III' of FIGS. 24A to 27A, respectively;

FIGS. 24E to 27E are cross-sectional views taken along lines IV-IV' of FIGS. 24A to 27A, respectively;

DETAILED DESCRIPTION OF THE EMBODIMENTS

Figure 1:
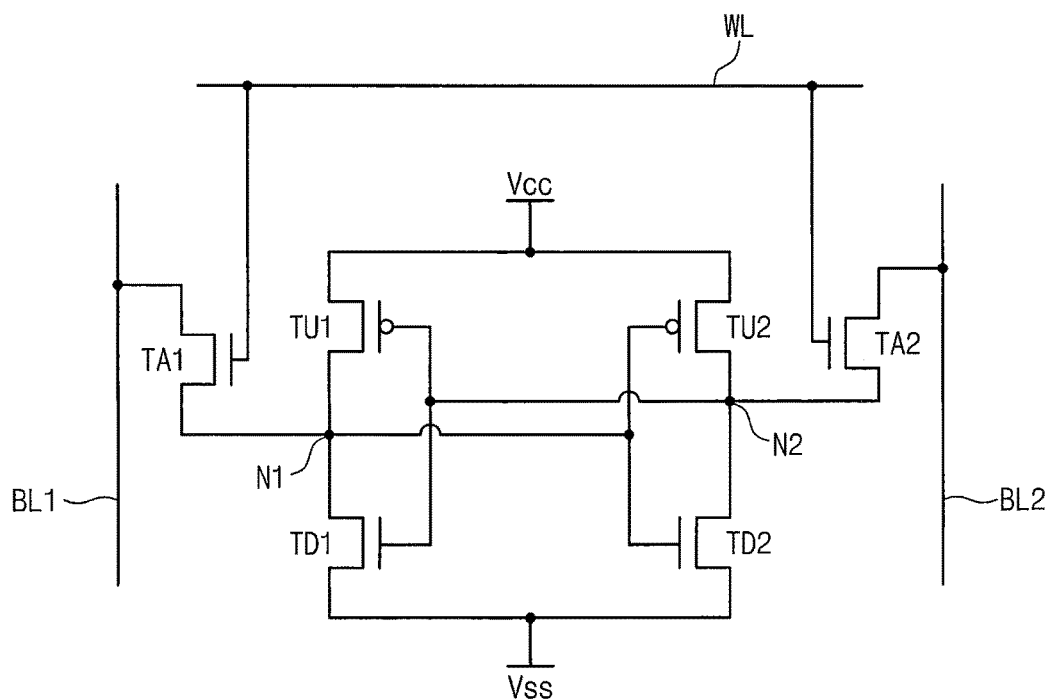
FIG. 1 is an equivalent circuit diagram of an SRAM cell according to example embodiments of the inventive concept.

The inventive concept is described hereinafter with reference to the accompanying drawings, in which exemplary embodiments of the inventive concepts are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to necessarily illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

FIG. 1 is an equivalent circuit diagram of an SRAM cell according to example embodiments of the inventive concept.

Referring to FIG. 1, an SRAM cell according to embodiments of the inventive concepts includes a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 are PMOS transistors. In contrast, the first and second pull-down transistors TD1 and TD2 and the first and second access transistors TA1 and TA2 are NMOS transistors.

A first source/drain of the first pull-up transistor TU1 and a first source/drain of the first pull-down transistor TD1 are connected to a first node N1. A second source/drain of the first pull-up transistor TU1 is connected to a power line Vcc, and a second source/drain of the first pull-down transistor TD1 is connected to a ground line Vss. A gate of the first pull-up transistor TU1 is electrically connected to a gate of the first pull-down transistor TD1. Thus, the first pull-up transistor TU1 and the first pull-down transistor TD1 may constitute a first inverter. The connected gates of the first pull-up and first pull-down transistors TU1 and TD1 may correspond to an input terminal of the first inverter, and the first node N12 may correspond to an output terminal of the first inverter.

A first source/drain of the second pull-up transistor TU2 and a first source/drain of the second pull-down transistor TD2 are connected to a second node N2. A second source/drain of the second pull-up transistor TU2 is connected to the power line Vcc, and a second source/drain of the second pull-down transistor TD2 is connected to the ground line Vss. A gate of the second pull-up transistor TU2 is electrically connected to a gate of the second pull-down transistor TD2. Thus, the second pull-up transistor TU2 and the second pull-down transistor TD2 may constitute a second inverter. The connected gates of the second pull-up and second pull-down transistors TU2 and TD2 may correspond to an input terminal of the second inverter, and the second node N2 may correspond to an output terminal of the second inverter.

The first and second inverters are combined with each other to constitute a latch structure. In other words, the gates of the first pull-up and the first pull-down transistors TU1 and TD1 may be electrically connected to the second node N2, and the gates of the second pull-up and the second pull-down transistors TU2 and TD2 may be electrically connected to the first node N1. A first source/drain of the first access transistor TA1 is connected to the first node N1, and a second source/drain of the first access transistor TA1 is connected to a first bit line BL1. A first source/drain of the second access transistor TA2 is connected to the second node N2, and a second source/drain of the second access transistor TA2 is connected to the second bit line BL2. Gates of the first and second access transistors TA1 and TA2 are electrically connected to a word line WL. Thus, the SRAM cell may be realized. According to embodiments of the inventive concepts, all the transistors TU1, TU2, TD1, TD2, TA1 and TA2 includes vertical channel portions.

FIGS. 2A to 10A are plan views illustrating methods of manufacturing an SRAM cell according to some embodiments of the inventive concept. FIGS. 2B to 10B are cross-sectional views taken along lines I-I' of FIGS. 2A to 10A, respectively. FIGS. 2C to 10C are cross-sectional views taken along lines II-II' of FIGS. 2A to 10A, respectively. FIGS. 2D to 10D are cross-sectional views taken along lines III-III' of FIGS. 2A to 10A, respectively. FIGS. 2E to 10E are cross-sectional views taken along lines IV-IV' of FIGS. 2A to 10A, respectively.

Referring to FIGS. 2A, 2B, 2C, 2D, and 2E, a device isolation pattern 103 may be formed in a substrate 100 to define a first active portion A1 and a second active portion A2. The first and second active portions A1 and A2 may correspond to portions of the substrate 100 which are surrounded by the device isolation pattern 103. The substrate 100 may be a semiconductor substrate. For example, the substrate 100 may be a group IV semiconductor substrate (e.g., a silicon substrate, a germanium substrate, or a silicon-germanium substrate). Alternatively, the substrate 100 may be a group III-V compound semiconductor substrate. Hereinafter, the substrate 100 of the silicon substrate will be described as an example.

The device isolation pattern 103 may be a trench-type device isolation pattern. The device isolation pattern 103 may include at least one of silicon oxide, silicon nitride, and silicon oxynitride. The first and second active portions A1 and A2 may have bar-shapes extending in parallel along a first direction D1 when viewed from a plan view. The first and second active portions A1 and A2 may be spaced part from each other in a second direction D2 perpendicular to the first direction D1 when viewed from the plan view. In some embodiments, the first and second active portions A1 and A2 may be doped with P-type dopants (i.e., a first conductivity type impurity).

A first N-type dopant region 105a and a second N-type dopant region 105b may be formed in the first active portion A1 and the second active portion A2, respectively. Bottoms of the first and second N-type dopant regions 105a and 105b may be higher than a bottom surface of the device isolation pattern 103. A first P-type dopant region 107a and a second P-type dopant region 107b may be locally formed in the first N-type dopant region 105a and the second N-type dopant region 105b, respectively.

In some embodiments, the first P-type dopant region 107a may be formed in a central region of the first active portion A1 when viewed from the plan view. A top surface of the first N-type dopant region 105a may be substantially coplanar with a top surface of the first P-type dopant region 107a. Likewise, the second P-type dopant region 107b may be formed in a central region of the second active portion A2 when viewed from the plan view. A top surface of the second N-type dopant region 105b may be substantially coplanar with a top surface of the second P-type dopant region 107b.

Figure 2A:
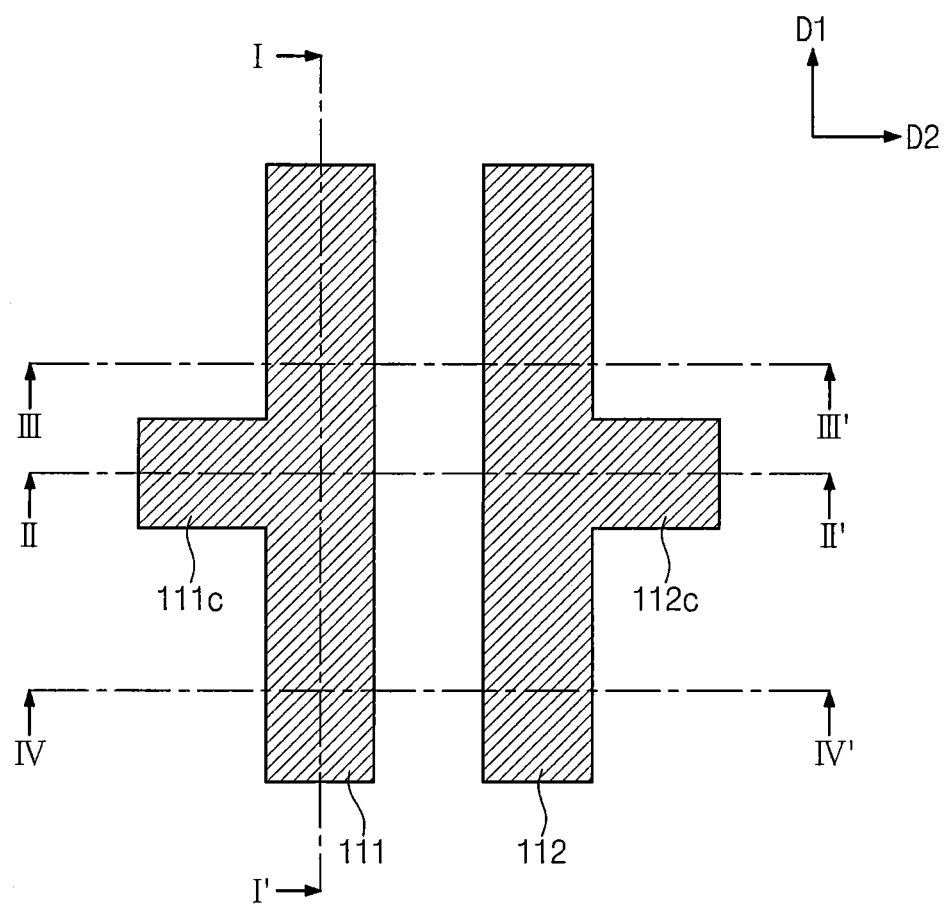
Figure 2B:
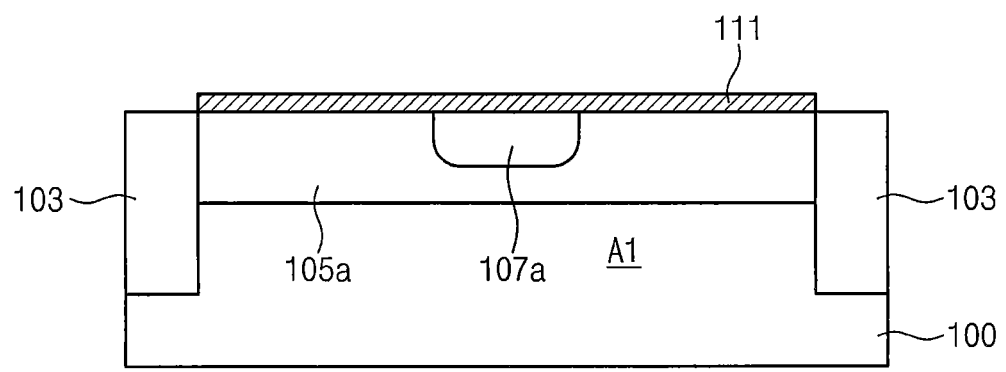
Figure 2C:
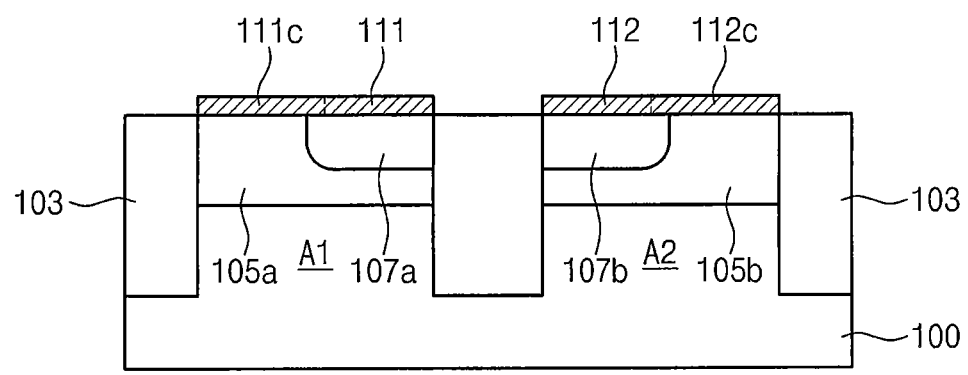
Figure 2D:
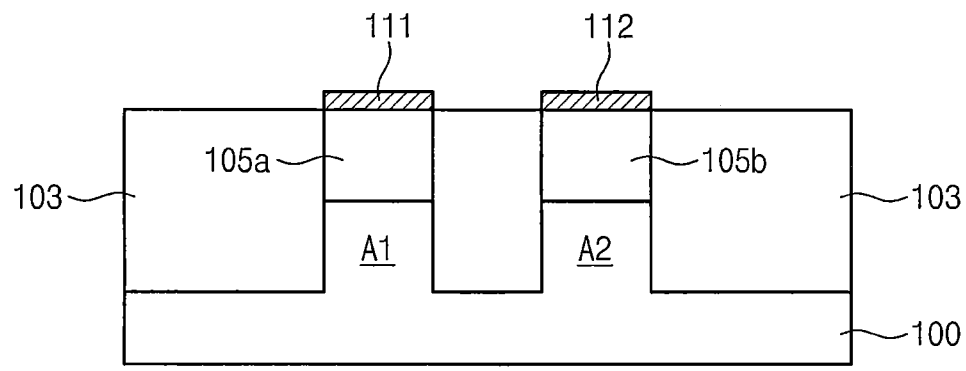
Figure 2E:
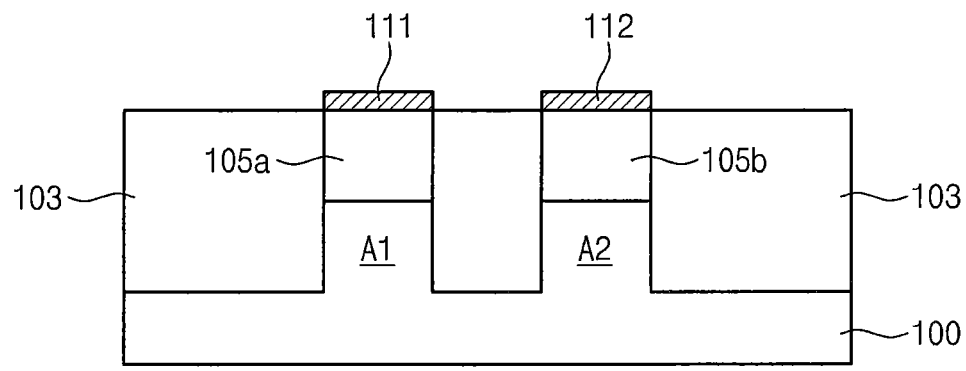

As illustrated in FIGS. 2B and 2C, bottoms of the first and second P-type dopant regions 107a and 107b may be higher than the bottoms of the first and second N-type dopant regions 105a and 105b, respectively. Thus, a portion of the first N-type dopant region 105a may be between the first P-type dopant region 107a and the first active portion A1 disposed under the first N-type dopant region 105a, and a portion of the second N-type dopant region 105b may be disposed between the second P-type dopant region 107b and the second active portion A2 disposed under the second N-type dopant region 105b. As a result, the first and second P-type dopant regions 107a and 107b may be isolated from the first and second active portions A1 and A2 disposed under the first and second N-type dopant regions 105a and 105b.

A first node electrode 111 may be formed on the first active portion A1. The first node electrode 111 may be in contact with the top surface of the first P-type dopant region 107a and the top surface of the first N-type dopant region 105a. The first node electrode 111 may include a metal material. Thus, the first P-type and first N-type dopant regions 107a and 105a may be electrically connected to each other through the first node electrode 111. Likewise, a second node electrode 112 may be formed on the second active portion A1. The second node electrode 112 may be in contact with the top surface of the second P-type dopant region 107b and the top surface of the second N-type dopant region 105b. The second node electrode 112 may be formed of the same material (i.e., the metal material) as the first node electrode 111. Thus, the second P-type and second N-type dopant regions 107b and 105b may be electrically connected to each other through the second node electrode 112.

The first and second node electrodes 111 and 112 may have bar-shapes extending in parallel along the first direction D1 when viewed from the plan view. The first and second node electrodes 111 and 112 may be spaced apart from each other in the second direction D2.

A first node extension 111c may laterally extend from the first node electrode 111. The first node extension 111c and the first node electrode 111 may be one unitary body. In other words, the first node extension 111c and the first node electrode 111 may be in contact with each other without an interface therebetween so as to be different portions of the same structure, in some embodiments according to the inventive concept. In some embodiments, the first active portion A1 may also extend under the first node extension 111c, as illustrated in FIG. 2C. Alternatively, the first active portion A1 may not extend, and the first node extension 111c may be disposed on the device isolation pattern 103 at a side of the first active portion A1.

Likewise, a second node extension 112c may laterally extend from the second node electrode 112. The second node extension 112c and the second node electrode 112 may be a unitary body. In some embodiments, the second active portion A2 may also extend under the second node extension 112c, as illustrated in FIG. 2C. Alternatively, the second active portion A2 may not extend, and the second node extension 112c may be disposed on the device isolation pattern 103 at a side of the second active portion A2.

The first and second node electrodes 111 and 112 and the first and second node extensions 111c and 112c may be formed after the formation of the dopant regions 105a, 105b, 107a and 107b. The first and second node electrodes 111 and 112 and the first and second node extensions 111c and 112c may be formed by a metal-semiconductor reaction process (e.g., a silicide process). That is, a metal layer may react with the first and second active portions A1 and A2 (containing silicon) to form the first and second node electrodes 111 and 112 and the first and second node extensions 111c and 112c.

Subsequently, an unreacted metal layer may be removed. In this case, the first and second node electrodes 111 and 112 and the first and second node extensions 111c and 112c may include, for example, tungsten silicide, nickel silicide, titanium silicide, or cobalt silicide.

Alternatively, the first and second node electrodes 111 and 112 and the first and second node extensions 111c and 112c may be formed by a patterning process. For example, a node electrode layer may be formed on the substrate 100 having the first and second active portions A1 and A2, and the node electrode layer may be then patterned to form the first and second node electrodes 111 and 112 and the first and second node extensions 111c and 112c. The node electrode layer may be formed of the metal-containing material. For example, the node electrode layer may include at least one of a transition metal (e.g., titanium or tantalum) and a conductive metal nitride (e.g., titanium nitride or tantalum nitride).

In some embodiments, the first and second node electrodes 111 and 112 may be disposed between the first node extension 111 c and the second node extension 112c, and the first and second node extensions 111c and 112c may be arranged in the second direction D2.

Referring to FIGS. 3A, 3B, 3C, 3D, and 3E, a lower insulating layer 115 may be formed on the substrate 100 having the first and second node electrodes 111 and 112 and the first and second node extensions 111c and 112c. Next, a sacrificial layer 120 and a capping insulating layer 130 may be sequentially formed on the lower insulating layer 115. The sacrificial layer 120 may be formed of a material having an etch selectivity with respect to the lower and capping insulating layers 115 and 130. For example, the lower and capping insulating layers 115 and 130 may be formed of silicon oxide layers, and the sacrificial layer 120 may be formed of a silicon nitride layer.

The capping insulating layer 130, the sacrificial layer 120, the lower insulating layer 115, and the first and second node electrodes 111 and 112 may be patterned to form channel holes 133a1, 133a2, 133u1, 133u2, 133d1 and 133d2. A first access channel hole 133a1, a first pull-up channel hole 133u1, and a first pull-down channel hole 133d1 may expose the first active portion A1. A second access channel hole 133a2, a second pull-up channel hole 133u2, and a second pull-down channel hole 133d2 may expose the second active portion A2.

Figure 3A:
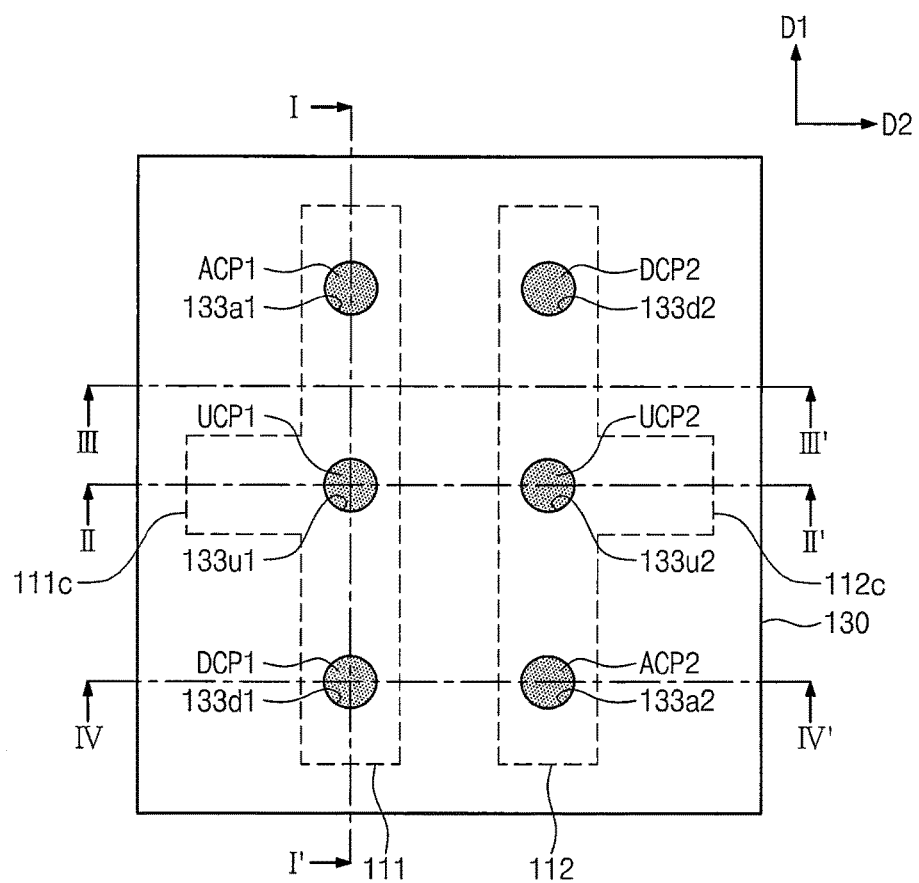

The first access channel hole 133a1 and the first pull-down channel hole 133d1 may expose the first N-type dopant region 105a, and the first pull-up channel hole 133u1 may expose the first P-type dopant region 107a. In some embodiments, the first pull-down channel hole 133d1, the first pull-up channel hole 133u1, and the first access channel hole 133a1 may be sequentially arranged along the first direction D1, as illustrated in FIG. 3A.

The second access channel hole 133a2 and the second pull-down channel hole 133d2 may expose the second N-type dopant region 105b, and the second pull-up channel hole 133u2 may expose the second P-type dopant region 107b. In some embodiments, the second access channel hole 133a2, the second pull-up channel hole 133u2, and the second pull-down channel hole 133d2 may be sequentially arranged along the first direction D1, as illustrated in FIG. 3A.

Thus, the first access channel hole 133a1 and the second pull-down channel hole 133d2 may be arranged along the second direction D2. The first pull-up channel hole 133u1 and the second pull-up channel hole 133u2 may be arranged along the second direction D2. Thus, the first and second P-type dopant regions 107a and 107b may be arranged along the second direction D2. The first pull-down channel hole 133d1 and the second access channel hole 133a2 may be arranged along, the second direction D2.

A first access vertical channel portion ACP1, a first pull-up vertical channel portion UCP1, a first pull-down vertical channel portion DCP1, a second access vertical channel portion ACP2, a second pull-up vertical channel portion UCP2, and a second pull-down vertical channel portion DCP2 may be formed in the first access channel hole 133a1, the first pull-up channel hole 133u1, the first pull-down channel hole 133d1, the second access channel hole 133a2, the second pull-up channel hole 133u2, and the second pull-down channel hole 133d2, respectively.

Figure 3B:
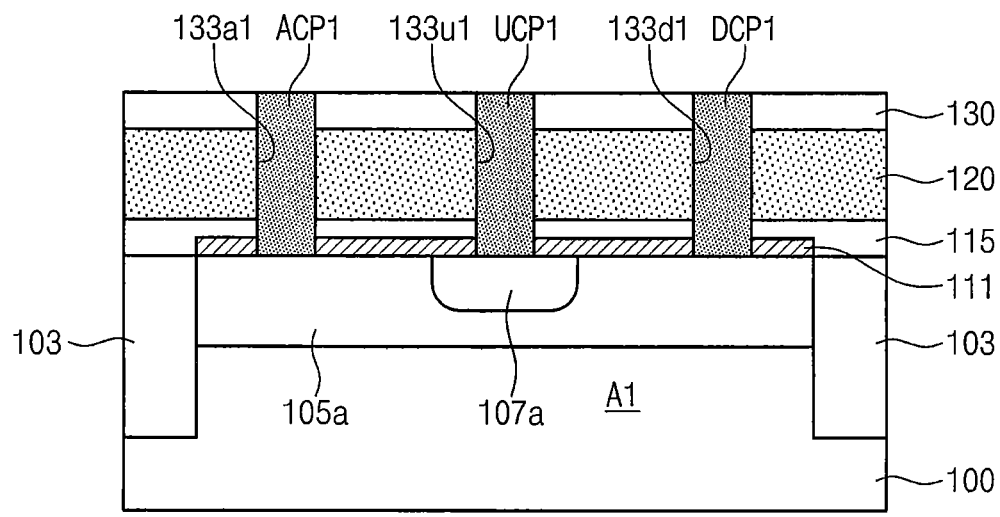

The vertical channel portions ACP1, UCP1, DCP1, ACP2, UCP2 and DCP2 may be in contact with the first and second active portions A1 and A2. Bottom end portions of the first access, first pull-up and first pull-down vertical channel portions ACP1, UCP1 and DCP1 are electrically connected to the first node electrode 111. Thus, the bottom end portions of the first access, first pull-up and first pull-down vertical channel portions ACP1, UCP1 and DCP1 are electrically connected to each other by the first node electrode 111. In some embodiments, sidewalls of the bottom end portions of the first access, first pull-up and first pull-down vertical channel portions ACP1, UCP1 and DCP1 may be in contact with the first node electrode 111, as illustrated in FIG. 3B. In some embodiments, the vertical channel portions ACP1, UCP1, DCP1, ACP2, UCP2 and DCP2 may have pillar-shapes as illustrated in FIGS. 3A to 3E.

Figure 3C:
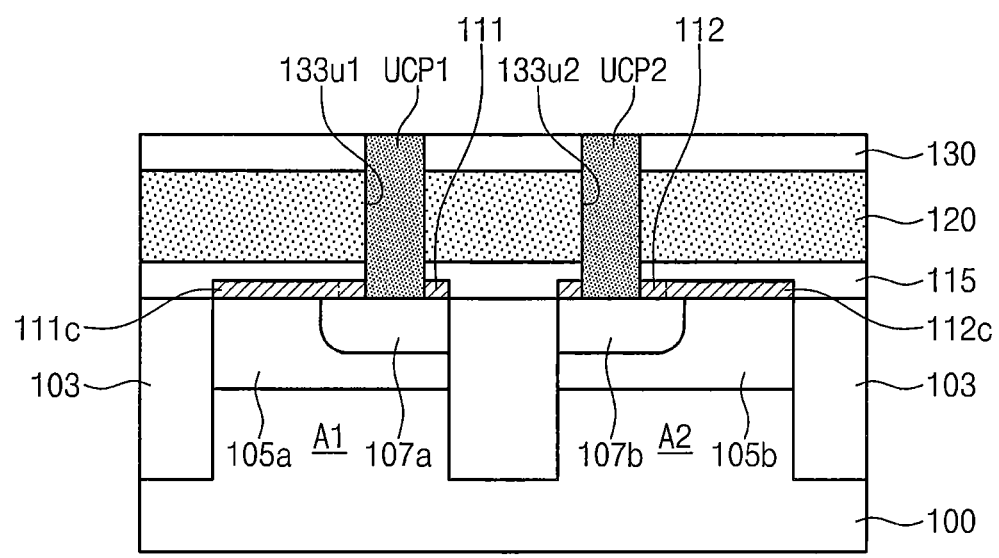
Figure 3D:
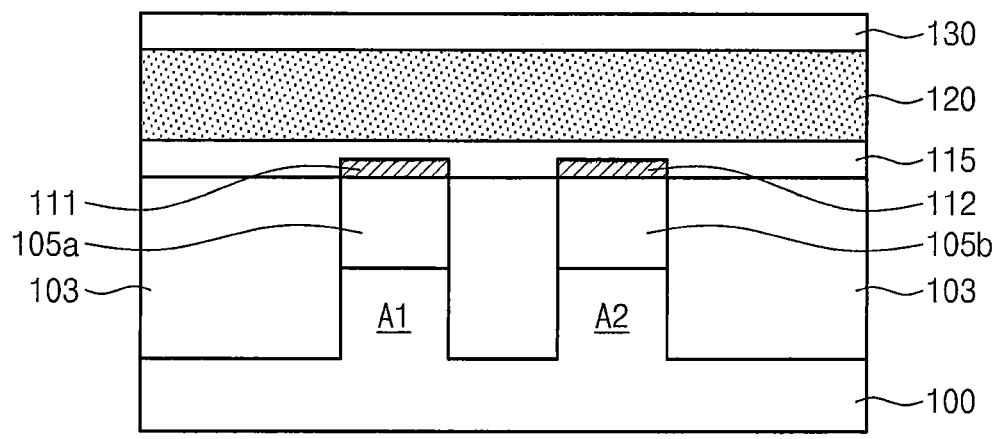
Figure 3E:
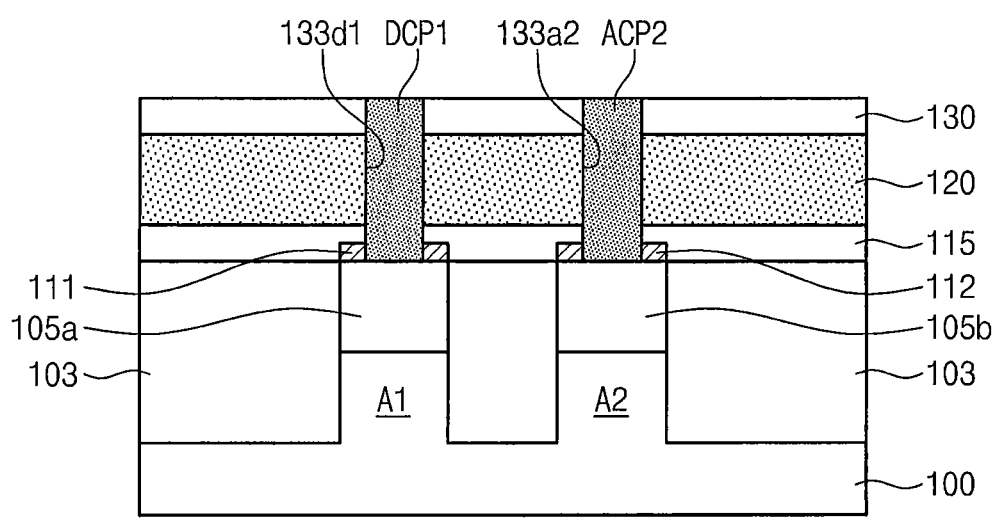
Figure 4A:
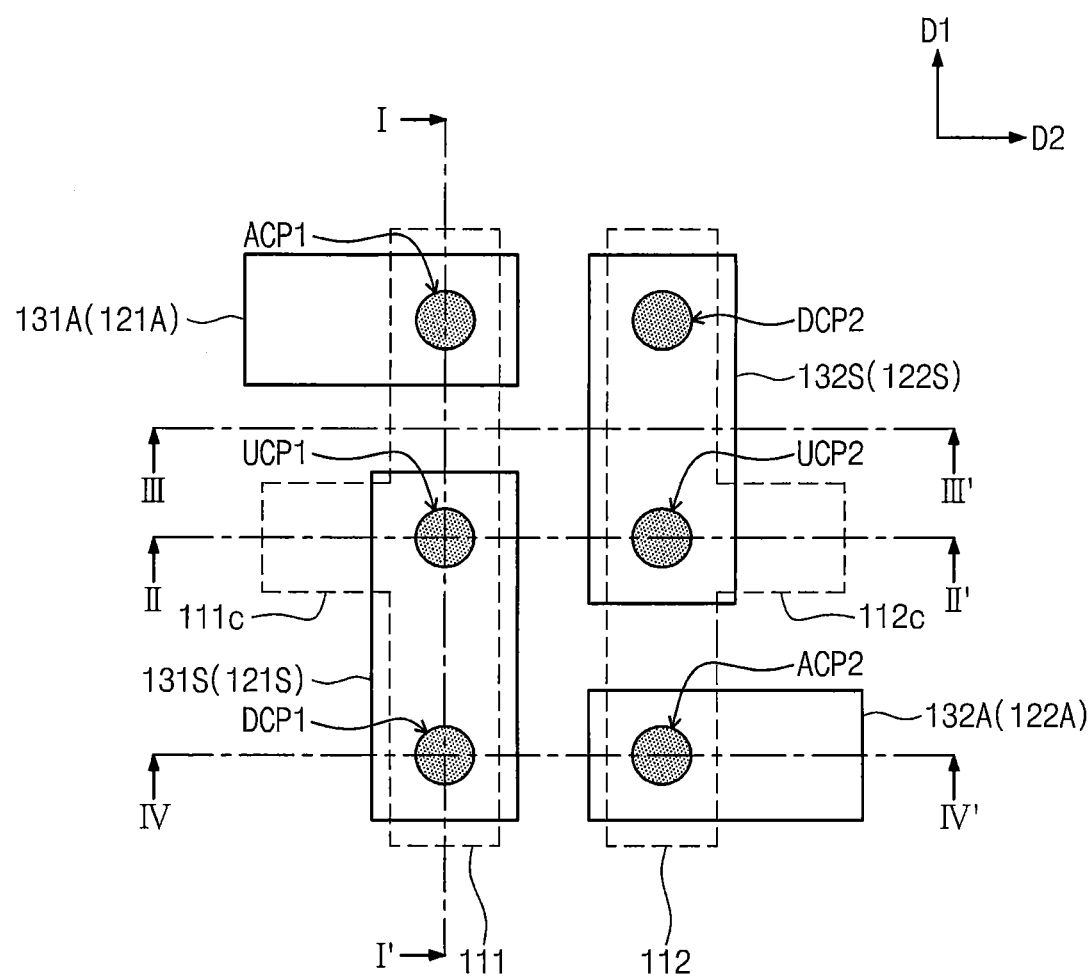
Figure 4B:
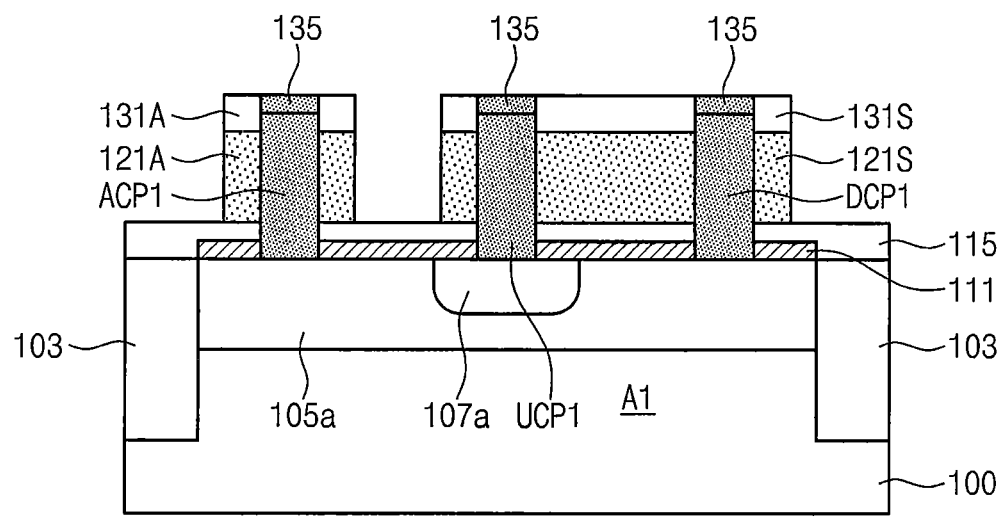
Figure 4C:
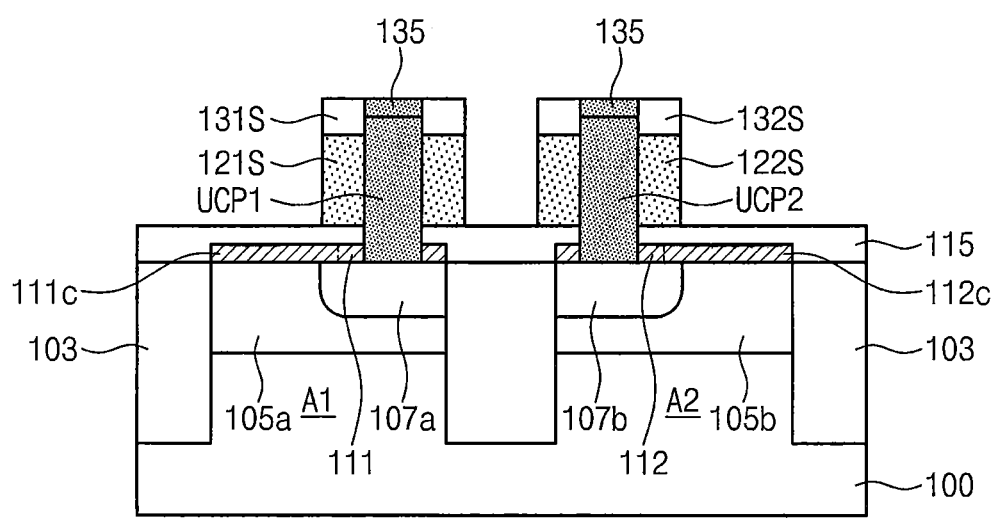
Figure 4D:
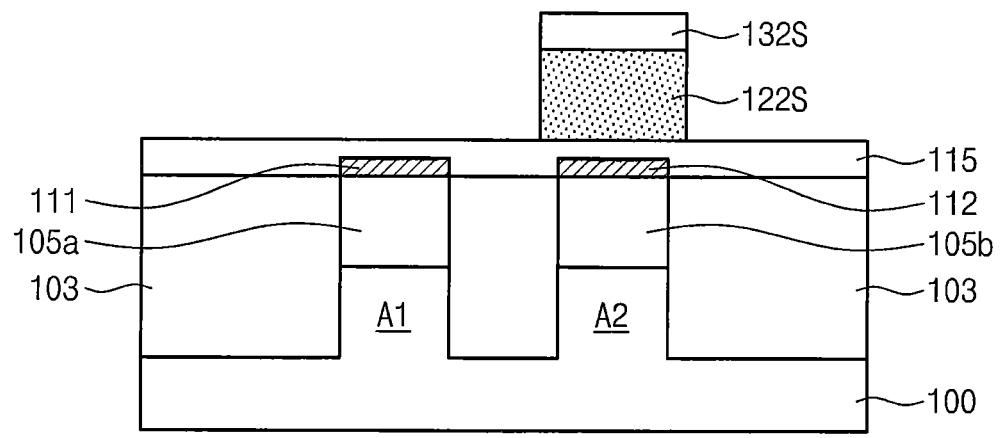
Figure 4E:
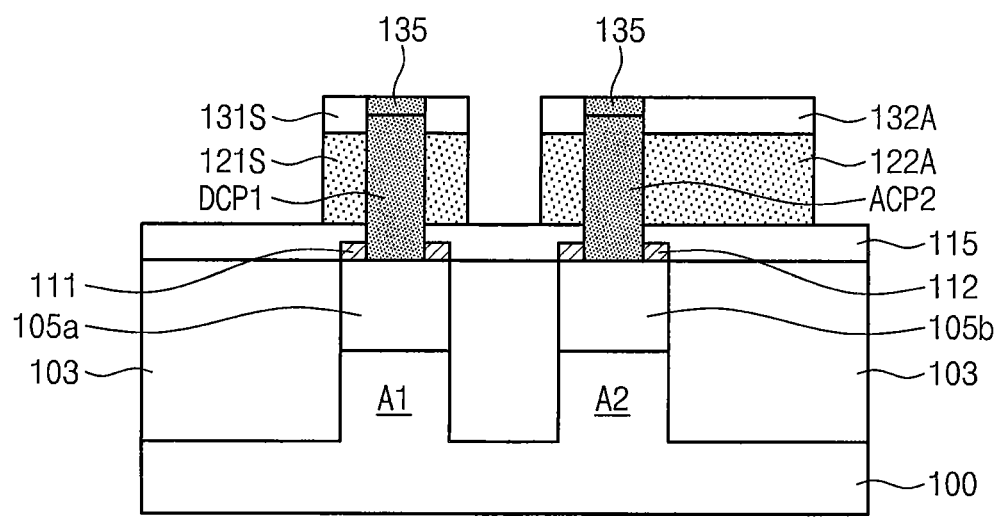
Figure 5A:
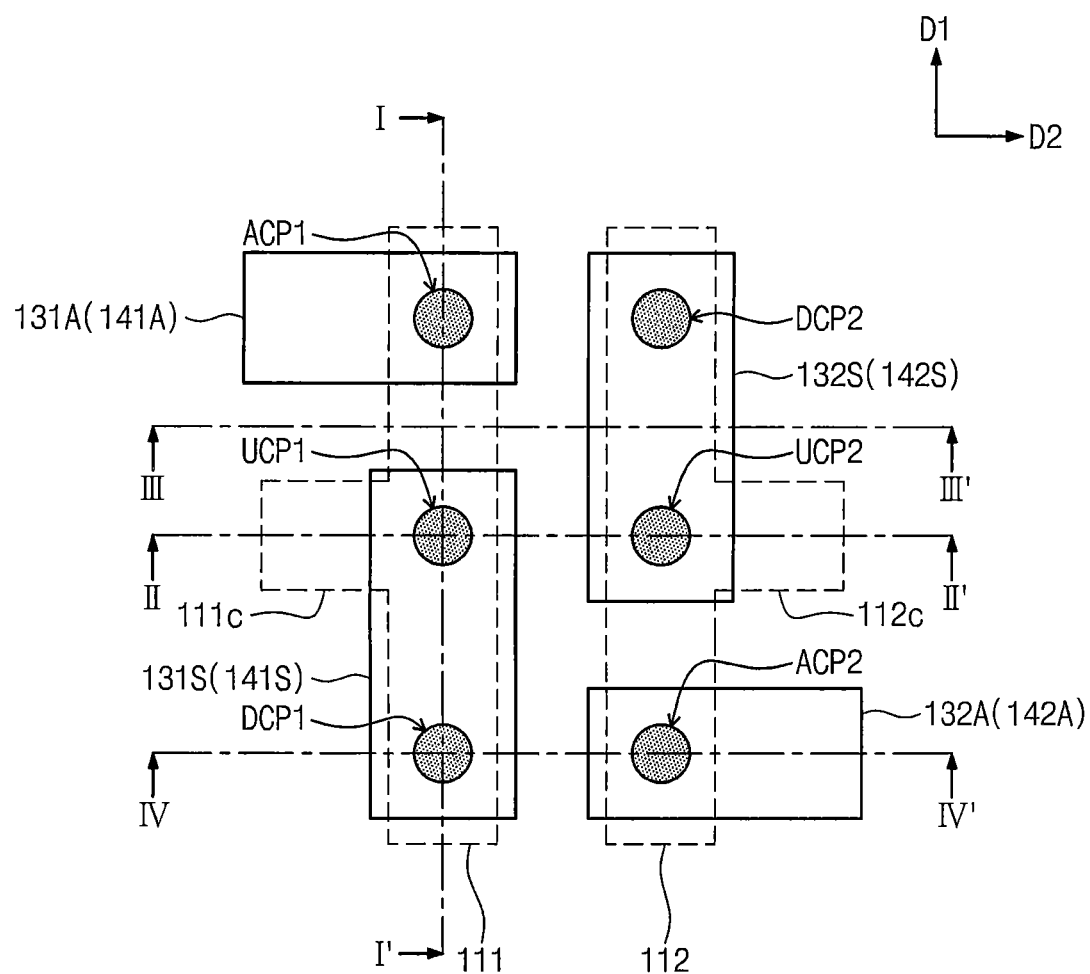
Figure 5B:
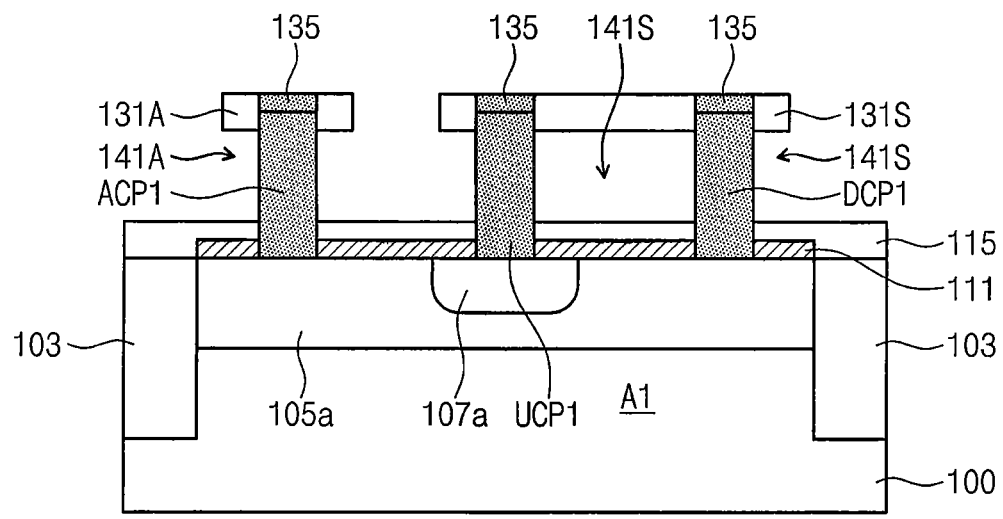
Figure 5C:
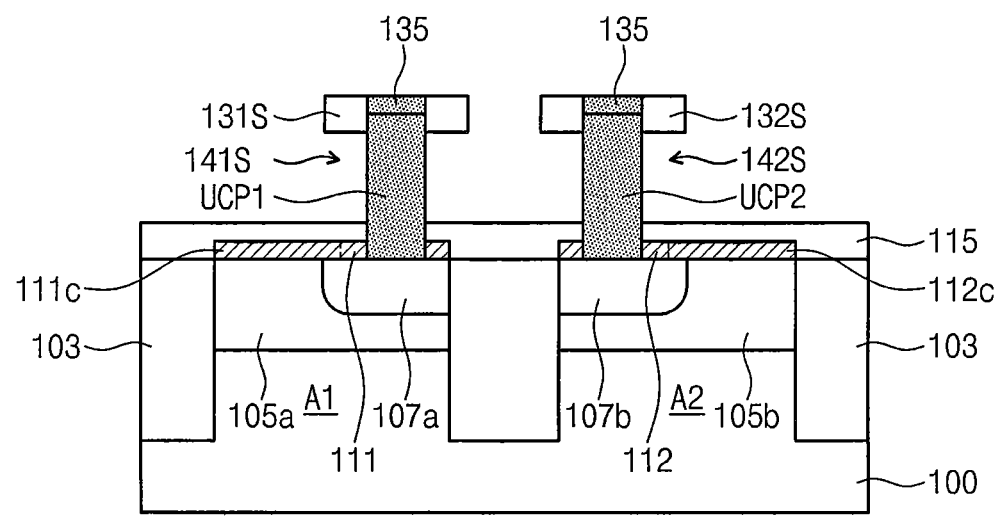
Figure 5D:
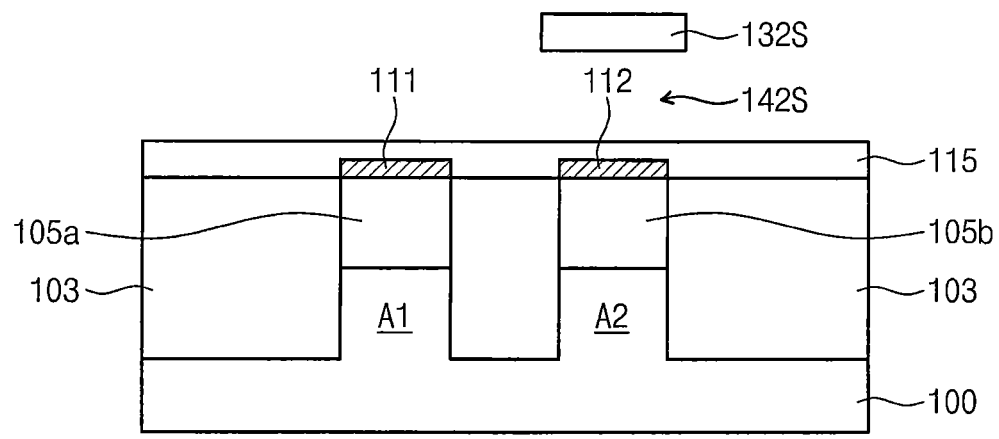
Figure 5E:
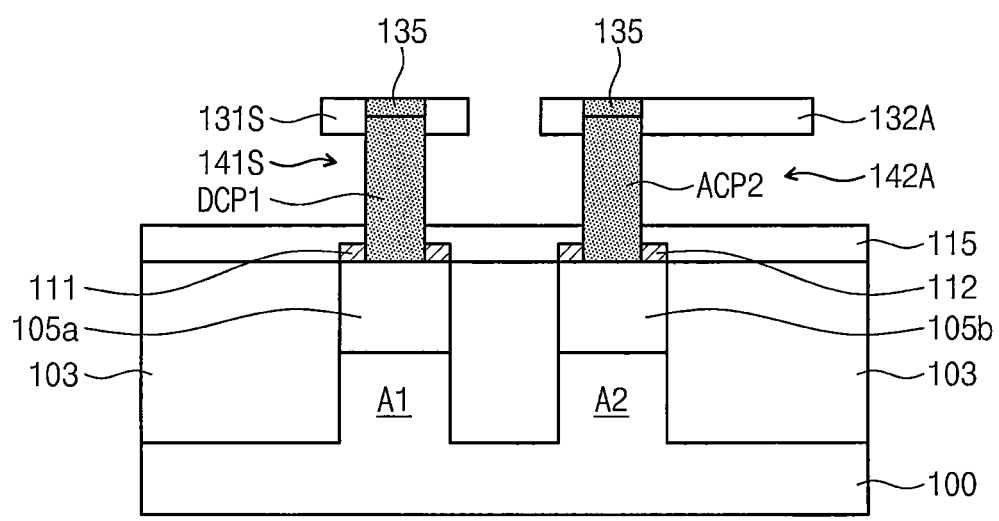
Figure 6A:
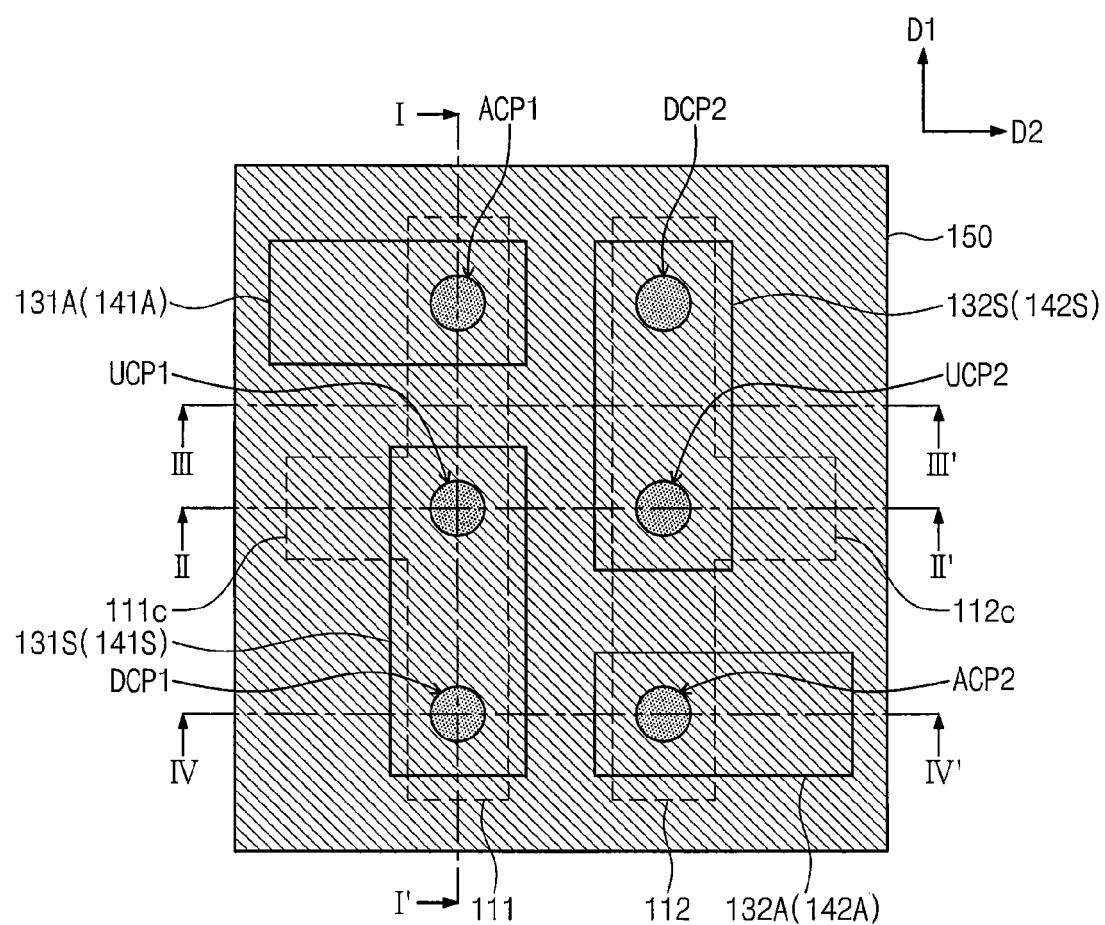
Figure 6B:
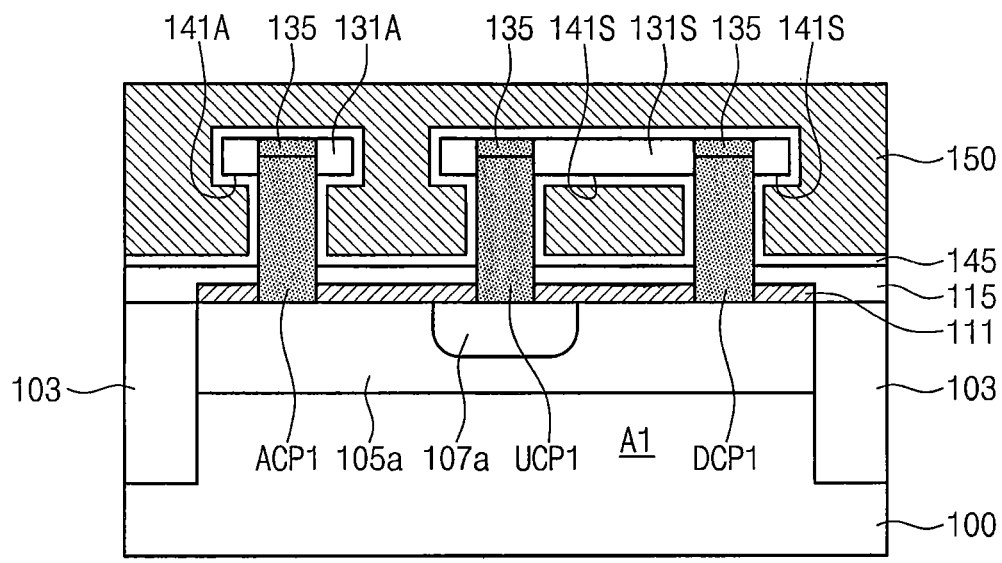
Figure 6C:
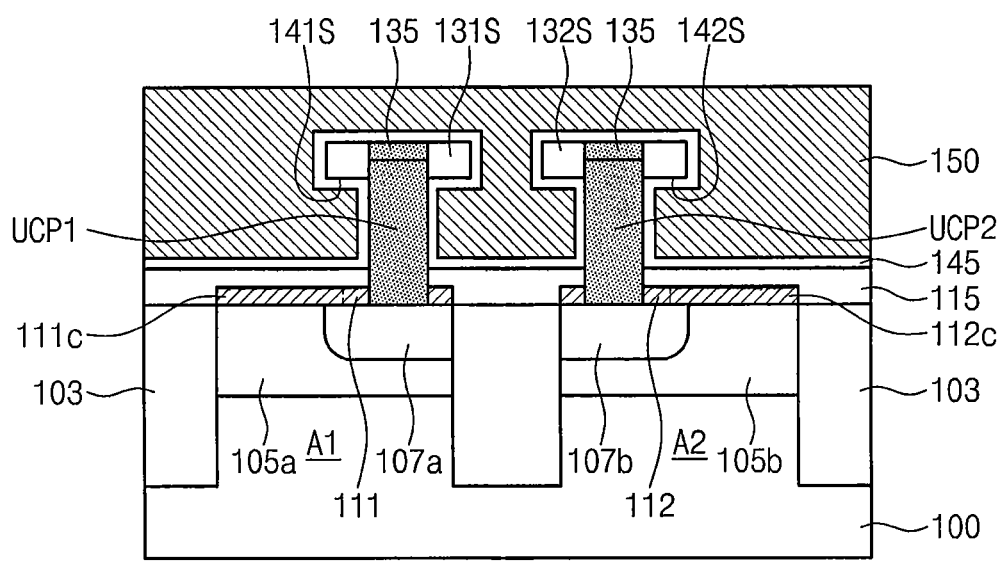
Figure 6D:
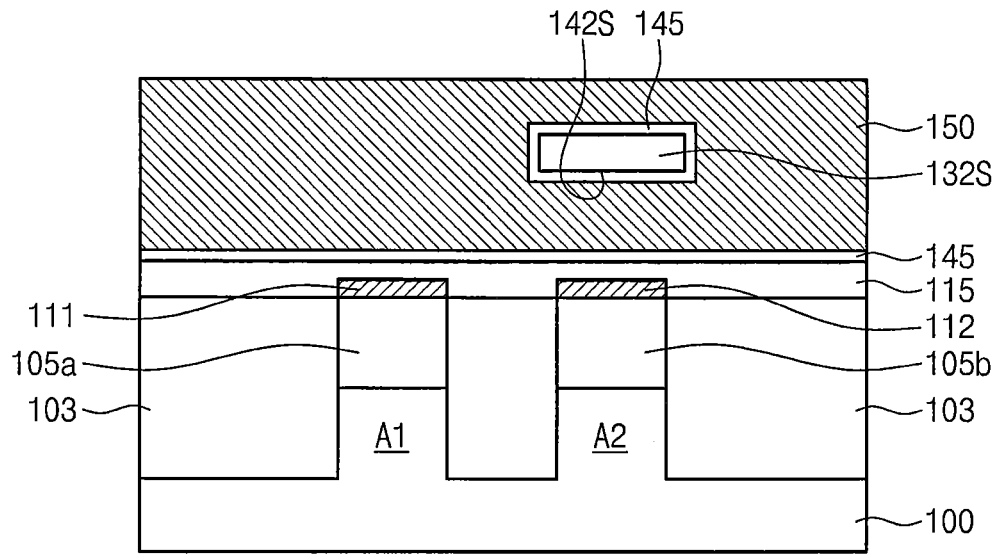
Figure 6E:
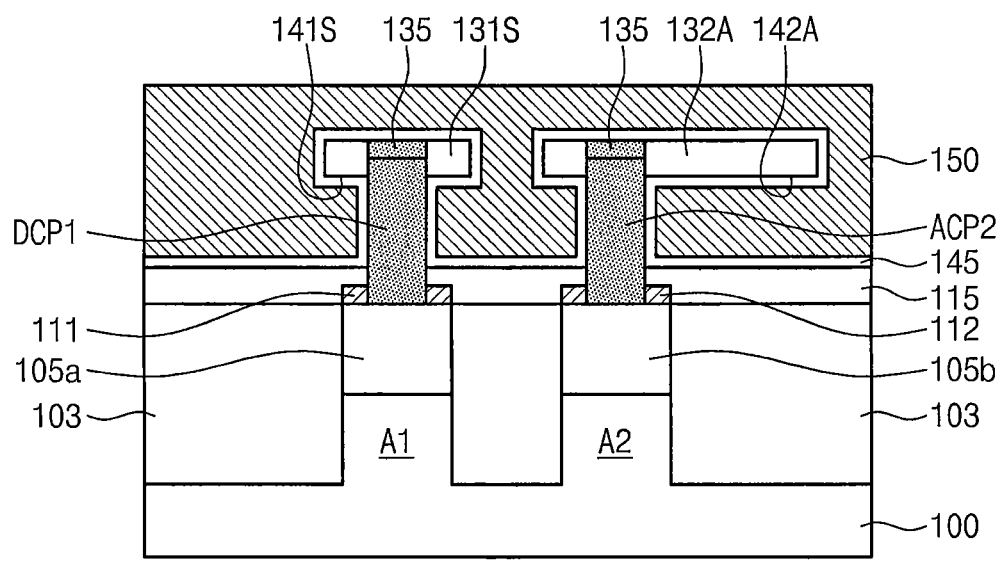
Figure 7A:
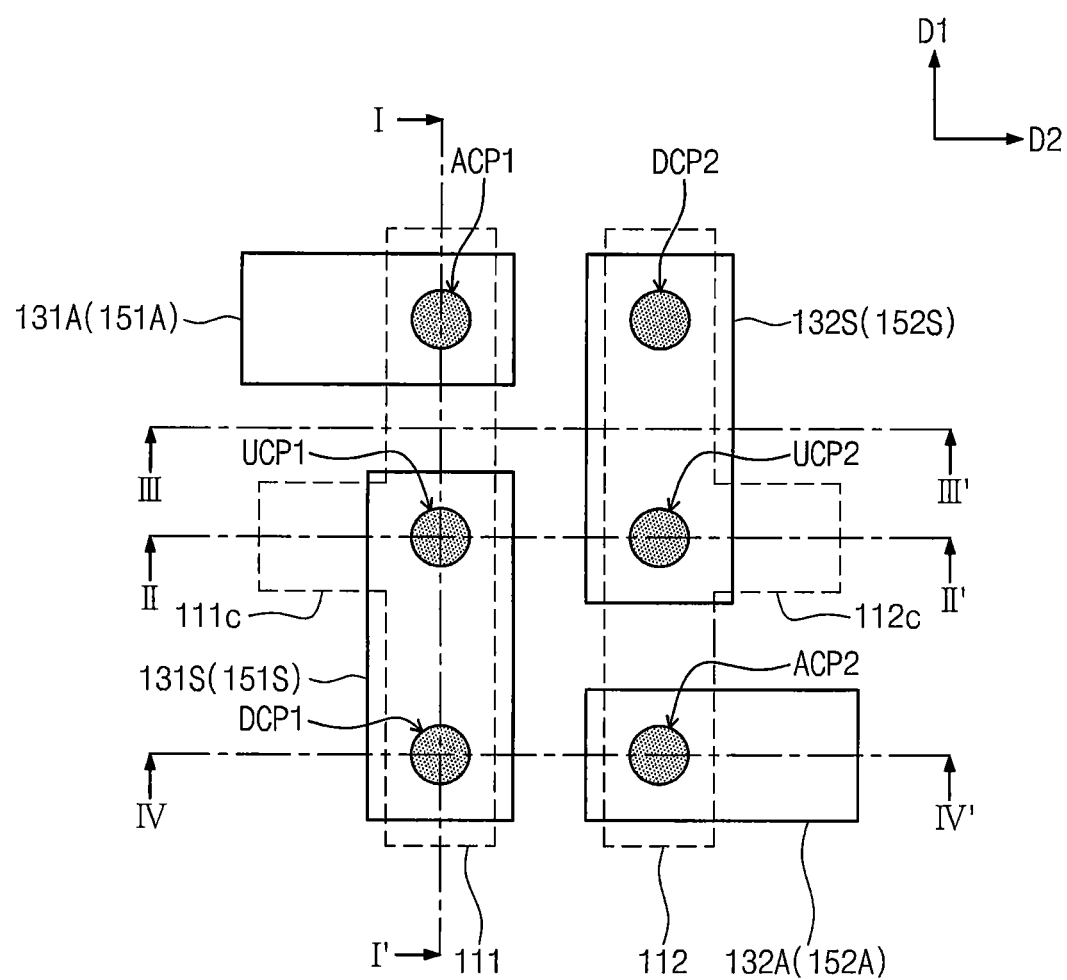
Figure 7B:
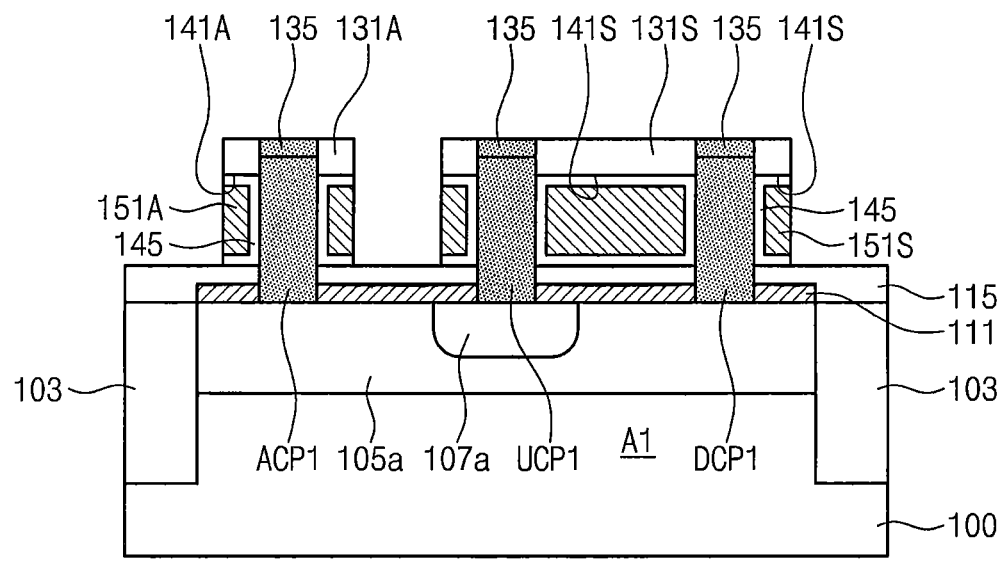
Figure 7C:
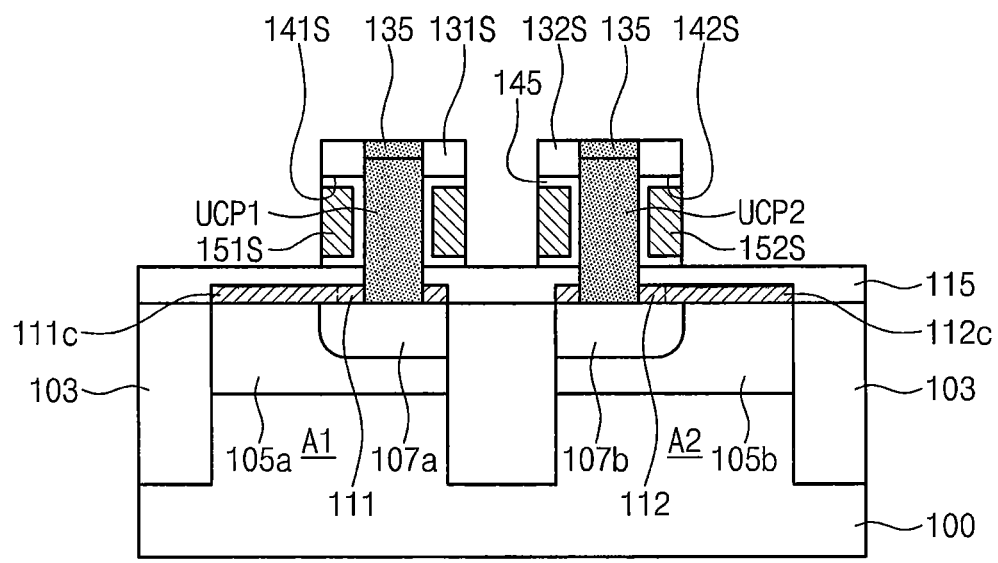
Figure 7D:
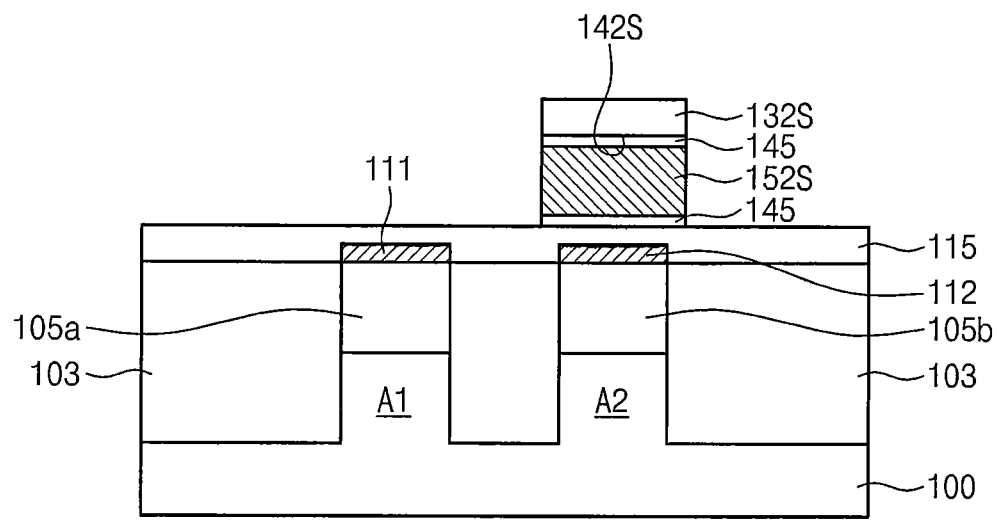
Figure 7E:
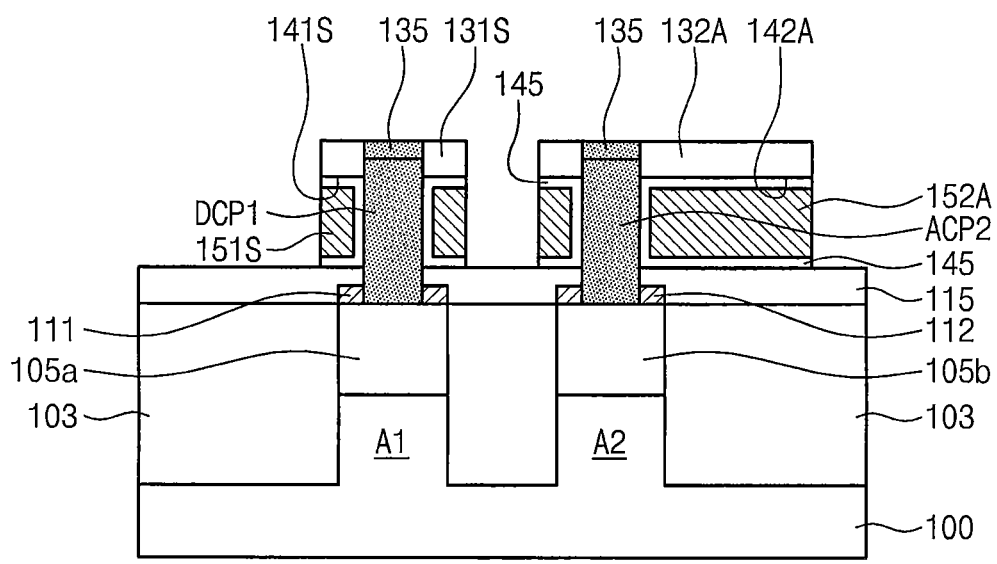

Likewise, bottom end portions of the second access, second pull-up and second pull-down vertical channel portions ACP2, UCP2 and DCP2 are electrically connected to the second node electrode 112. Thus, the bottom end portions of the second access, second pull-up and second pull-down vertical channel portions ACP2, UCP2 and DCP2 are electrically connected to each other by the second node electrode 112. In some embodiments, sidewalls of the bottom end portions of the second access, second pull-up and second pull-down vertical channel portions ACP2, UCP2 and DCP2 may be in contact with the second node electrode 112, as illustrated in FIGS. 3C and 3E.

In some embodiments, the vertical channel portions ACP1, UCP1, DCP1, ACP2, UCP2 and DCP2 may include a semiconductor material formed by an epitaxial process using the active portions A1 and A2 exposed by the channel holes 133a1, 133a2, 133u1, 133u2, 133d1 and 133d2 as a seed. In some embodiments, the epitaxial process may be a selective epitaxial growth (SEG) process or a laser-induced epitaxial growth (LEG) process. Thus, the vertical channel portions ACP1, UCP1, DCP1, ACP2, UCP2 and DCP2 may include a crystalline semiconductor material (e.g., a single-crystalline semiconductor material). For example, the vertical channel portions ACP1, UCP1, DCP1, ACP2, UCP2 and DCP2 may include a crystalline group IV semiconductor material or a crystalline group III-V compound semiconductor material.

In other embodiments, the vertical channel portions ACP1, UCP1, DCP1, ACP2, UCP2 and DCP2 may include a carbon nanotube. In this case, a nuclear layer may be formed on the first and second active portions A1 and A2 exposed by the channel holes 133a1, 133a2, 133u1, 133u2, 133d1 and 133d2 before the formation of the vertical channel portions ACP1, UCP1, DCP1, ACP2, UCP2 and DCP2. For example, the nuclear layer may include nickel silicide.

The first and second pull-up vertical channel portions UCP1 and UCP2 may correspond to channel portions of the first and second pull-up transistors TU1 and TU2 of FIG. 1, respectively. Thus, the first and second pull-up vertical channel portions UCP1 and UCP2 may include the semiconductor material doped with N-type dopants. The first and second access vertical channel portions ACP1 and ACP2 and the first and second pull-down vertical channel portions DCP1 and DCP2 may correspond to channel portions of the first and second access transistors TA1 and TA2 and the pull-down transistors TD1 and TD2 of FIG. 1, respectively. Thus, the first and second access vertical channel portions ACP1 and ACP2 and the first and second pull-down vertical channel portions DCP1 and DCP2 may include the semiconductor material doped with P-type dopants.

If the vertical channel portions ACP1, UCP1, DCP1, ACP2, UCP2 and DCP2 include the carbon nanotube, the pull-up vertical channel portions UCP1 and UCP2 may include an undoped carbon nanotube, and the access and pull-down vertical channel portions ACP1, ACP2, DCP1 and DCP2 may include a carbon nanotube doped with potassium (K).

Referring to FIGS. 4A, 4B, 4C, 4D, and 4E, upper electrodes 135 may be formed on top ends of the vertical channel portions ACP1, UCP1, DCP1, ACP2, UCP2 and DCP2, respectively. Bottom ends of the upper electrodes 135 may be disposed at the same level as or a higher level than a bottom surface of the capping insulating layer 130. In some embodiments, the upper electrodes 135 may be doped regions. In this case, the upper electrodes 135 may be formed in top end portions of the vertical channel portions ACP1, UCP1, DCP1, ACP2, UCP2 and DCP2, respectively. In this case, the upper electrodes 135 disposed on the access and pull-down vertical channel portions ACP1, ACP2, DCP1 and DCP2 may be doped with dopants of a different conductivity type from that of the upper electrodes 135 disposed on the pull-up vertical channel portions UCP1 and UCP2. In other words, the upper electrodes 135 disposed on the access and pull-down vertical channel portions ACP1, ACP2, DCP1 and DCP2 may be doped with N-type dopants, and the upper electrodes 135 disposed on the pull-up vertical channel portions UCP1 and UCP2 may be doped with P-type dopants.

Alternatively, the upper electrodes 135 may include a metal-containing material. In this case, top end portions of the vertical channel portions ACP1, UCP1, DCP1, ACP2, UCP2 and DCP2 may be recessed, and then a metal-containing material layer may be formed to fill the channel holes 133a1, 133a2, 133u1, 133u2, 133d1 and 133d2 on the recessed vertical channel portions ACP1, UCP1, DCP1, ACP2, UCP2 and DCP2. Subsequently, the metal-containing material layer may be planarized until the capping insulating layer 130 is exposed, thereby forming the upper electrodes 135. In still other embodiments, the upper electrodes 135 may be omitted.

The capping insulating layer 130 and the sacrificial layer 120 may be successively patterned to form first to fourth sacrificial patterns 121A, 121S, 122A and 122S and first to fourth capping patterns 131A, 131S, 132A and 132S. The first to fourth sacrificial patterns 121A, 121S, 122A and 122S are laterally spaced apart from each other. The first to fourth capping patterns 131A, 131S, 132A and 132S are formed on the first to fourth sacrificial patterns 121A, 121S, 122A and 122S, respectively. The first to fourth capping patterns 131A, 131S, 132A and 132S have sidewalls aligned with sidewalls of the first to fourth sacrificial patterns 121A, 121S, 122A and 122S, respectively. The capping patterns 131A, 131S, 132A and 132S correspond to portions of the capping insulating layer 130, respectively. Thus, the capping patterns 131A, 131S, 132A and 132S are formed of an insulating material.

The first, second, third and fourth sacrificial patterns 121A, 121S, 122A and 122S may be defined as a first access sacrificial pattern 121A, a first shared sacrificial pattern 121S, a second access sacrificial pattern 122A, and a second shared sacrificial pattern 122S, respectively. Likewise, the first, second, third and fourth capping patterns 131A, 131S, 132A and 132S may be defined as a first access capping pattern 131A, a first shared capping pattern 131S, a second access capping pattern 132A, and a second shared capping pattern 132S, respectively.

The first access vertical channel portion ACP1 penetrates the first access capping pattern 131A and the first access sacrificial pattern 121A. The first pull-up vertical channel portion UCP1 and the first pull-down vertical channel portion DCP1 penetrate the first shared capping pattern 131S and the first shared sacrificial pattern 121S. The second access vertical channel portion ACP2 penetrates the second access capping pattern 132A and the second access sacrificial pattern 122A. The second pull-up vertical channel portion UCP2 and the second pull-down vertical channel portion DCP2 penetrate the second shared capping pattern 132S and the second shared sacrificial pattern 122S.

The first access sacrificial pattern 121A and the first shared sacrificial pattern 121S may be disposed over the first node electrode 111. In some embodiments, the first access sacrificial pattern 121A may laterally extend in a direction far away from the second node electrode 112. The second access sacrificial pattern 122A and the second shared sacrificial pattern 122S may be disposed over the second node electrode 112. In some embodiments, the second access sacrificial pattern 122A may laterally extend in a direction far away from the first node electrode 111.

Referring to FIGS. 5A, 5B, 5C, 5D, and 5E, the sacrificial patterns 121A, 121S, 122A and 122S may be selectively removed to form first to fourth empty regions 141A, 141S, 142A and 142S. The first, second, third and fourth empty regions 141A, 141S, 142A and 142S may be defined as a first access empty region 141A, a first shared empty region 141S, a second access empty region 142A, and a second shared empty region 142S, respectively. Since the sacrificial patterns 121A, 121S, 122A and 122S are etch selective with respect to the capping patterns 131A, 131S, 132A and 132S and the lower insulating layer 115, the capping patterns 131A, 131S, 132A and 132S and the lower insulating layer 115 remain after the removal of the sacrificial patterns 121A, 121S, 122A and 122S. Thus, the empty regions 141A, 141S, 142A and 142S are formed under the capping patterns 131A, 131S, 132A and 132S, respectively.

The first access empty region 141A may expose a sidewall of the first access vertical channel portion ACP1, and the first shared empty region 141S may expose sidewalls of the first pull-up and first pull-down vertical channel portions UCP1 and DCP1. The second access empty region 142A may expose a sidewall of the second access vertical channel portion ACP2, and the second shared empty region 142S may expose sidewalls of the second pull-up and second pull-down vertical channel portions UCP2 and DCP2.

Referring to FIGS. 6A, 6B, 6C, 6D, and 6E, a gate dielectric layer 145 may be formed on the exposed sidewalls of the vertical channel portions ACP1, UCP1, DCP1, ACP2, UCP2 and DCP2 in the empty regions 141A, 141S, 142A and 142S. In some embodiments, the gate dielectric layer 145 may be formed by a thermal oxidation process. Thus, the formation of the gate dielectric layer 145 may be confined to the exposed sidewalls of the vertical channel portions ACP1, UCP1, DCP1, ACP2, UCP2 and DCP2.

Alternatively, the gate dielectric layer 145 may be formed of a high-k dielectric layer having a dielectric constant greater than that of silicon oxide. For example, the high-k dielectric layer may be an insulating metal oxide layer such as an aluminum oxide layer and/or a hafnium oxide layer. In this case, the gate dielectric layer 145 may be formed by a chemical vapor deposition (CVD) process and/or an atomic layer deposition (ALD) process. Thus, the gate dielectric layer 145 may be conformally formed on inner surfaces of the empty regions 141A, 141S, 142A and 142S, top surfaces of the capping patterns 131A, 131S, 132A and 132S, and the lower insulating layer 115. In still other embodiments, the gate dielectric layer 145 may include the thermal oxide layer and the high-k dielectric layer.

Next, a gate conductive layer 150 is formed on the substrate 100 having the gate dielectric layer 145. The gate conductive layer 150 fills the remainder of the empty regions 141A, 141S, 142A and 142S. The gate conductive layer 150 may include at least one of a doped semiconductor material, a metal (e.g., tungsten, aluminum, titanium, and/or tantalum), and a conductive metal nitride (e.g., titanium nitride, tantalum nitride, and/or tungsten nitride). The gate conductive layer 150 may fill a space between the capping patterns 131A, 131S, 132A and 132S, as illustrated in FIGS. 6A to 6E. Alternatively, the gate conductive layer 150 may completely fill the empty regions 141A, 141S, 142A and 142S but may only partially fill the space between the capping patterns 131A, 131S, 132A and 132S.

Referring to FIGS. 7A, 7B, 7C, 7D, and 7E, the gate conductive layer 150 outside the empty regions 141A, 141S, 142A and 142S may be removed to form gates 151A, 151S, 152A and 152S in the empty regions 141A, 141S, 142A and 142S, respectively. The gate conductive layer 150 outside the empty regions 141A, 141S, 142A and 142S may be removed by at least one of a dry etching process and a wet etching process. A first access gate 151A may be formed in the first access empty region 141A, and a first shared gate 151S may be formed in the first shared empty region 141S. A second access gate 152A may be formed in the second access empty region 142A, and a second shared gate 152S may be formed in the second shared empty region 142S.

The first access gate 151A surrounds the sidewall of the first access vertical channel portion ACP1, and the first shared gate 151S surrounds the sidewalls of the first pull-up and first pull-down vertical channel portions UCP1 and DCP1. The second access gate 152A surrounds the sidewall of the second access vertical channel portion ACP2, and the second shared gate 152S surround the sidewalls of the second pull-up and second pull-down vertical channel portions UCP2 and DCP2.

The first access gate 151A and the first access vertical channel portion ACP1 constitute a first access transistor. The first pull-up vertical channel portion UCP1 and a portion of the first shared gate 151S surrounding it constitute a first pull-up transistor. The first pull-down vertical channel portion DCP1 and another portion of the first shared gate 151S surrounding it constitute a first pull-down transistor. The second access gate 152A and the second access vertical channel portion ACP2 constitute a second access transistor. The second pull-up vertical channel portion UCP2 and a portion of the second shared gate 152S surrounding it constitute a second pull-up transistor. The second pull-down vertical channel portion DCP2 and another portion of the second shared gate 152S surrounding it constitute a second pull-down transistor.

The six transistors are included in an SRAM cell. As a result, all of the first and second access, first and second pull-up and first and second pull-down transistors have channel portions substantially vertical to the top surface of the substrate 100 in the SRAM cell according to embodiments of the inventive concepts. Thus, an occupied area of the SRAM cell may be reduced to realize a more highly integrated semiconductor device.

Referring to FIGS. 8A, 8B, 8C, 8D, and 8E, a first interlayer insulating layer 155 may be formed on the substrate 100 having the gates 151A, 151S, 152A and 152S. For example, the first interlayer insulating layer 155 may include at least one of a silicon oxide layer, a silicon nitride layer, and a silicon oxynitride layer.

First to fourth contact plugs C1, C2, C3 and C4 may be formed. The first and third contact plugs C1 and C3 may penetrate the first interlayer insulating layer 155 and the lower insulating layer 115. The first and third contact plugs C1 and C3 may be connected to the first and second node extensions 111c and 112c, respectively. The second contact plug C2 may successively penetrate the first interlayer insulating layer 155, the second shared capping pattern 132S, and the gate dielectric layer 145. The second contact plug C2 may be connected to the second shared gate 152S. The fourth contact plug C4 may successively penetrate the first interlayer insulating layer 155, the first shared capping pattern 131S, and the gate dielectric layer 145. The fourth contact plug C4 may be connected to the first shared gate 152S. The first to fourth contact plugs C1, C2, C3 and C4 may be formed at the same time. For example, the first to fourth contact plugs C1, C2, C3 and C4 may include at least one of a metal (e.g., tungsten, titanium, and/or tantalum) and a conductive metal nitride (e.g., titanium nitride, tantalum nitride, and/or tungsten nitride).

A first local interconnection L1 and a second local interconnection L2 may be formed on the first interlayer insulating layer 155. The first local interconnection L1 is connected to the first and second contact plugs C1 and C2, and the second local interconnection L2 is connected to the third and fourth contact plugs C3 and C4. Thus, the first node electrode 111 is electrically connected to the second shared gate 152S by the first node extension 111c and the first local interconnection L1. Likewise, the second node electrode 112 is electrically connected to the first shared gate 151S by the second node extension 112c and the second local interconnection L2. As a result, a latch structure of the SRAM cell may be realized. For example, the first and second local interconnections L1 and L2 may include at least one of a metal (e.g., tungsten, titanium, and/or tantalum) and a conductive metal nitride (e.g., titanium nitride, tantalum nitride, and/or tungsten nitride).

Figure 8A:
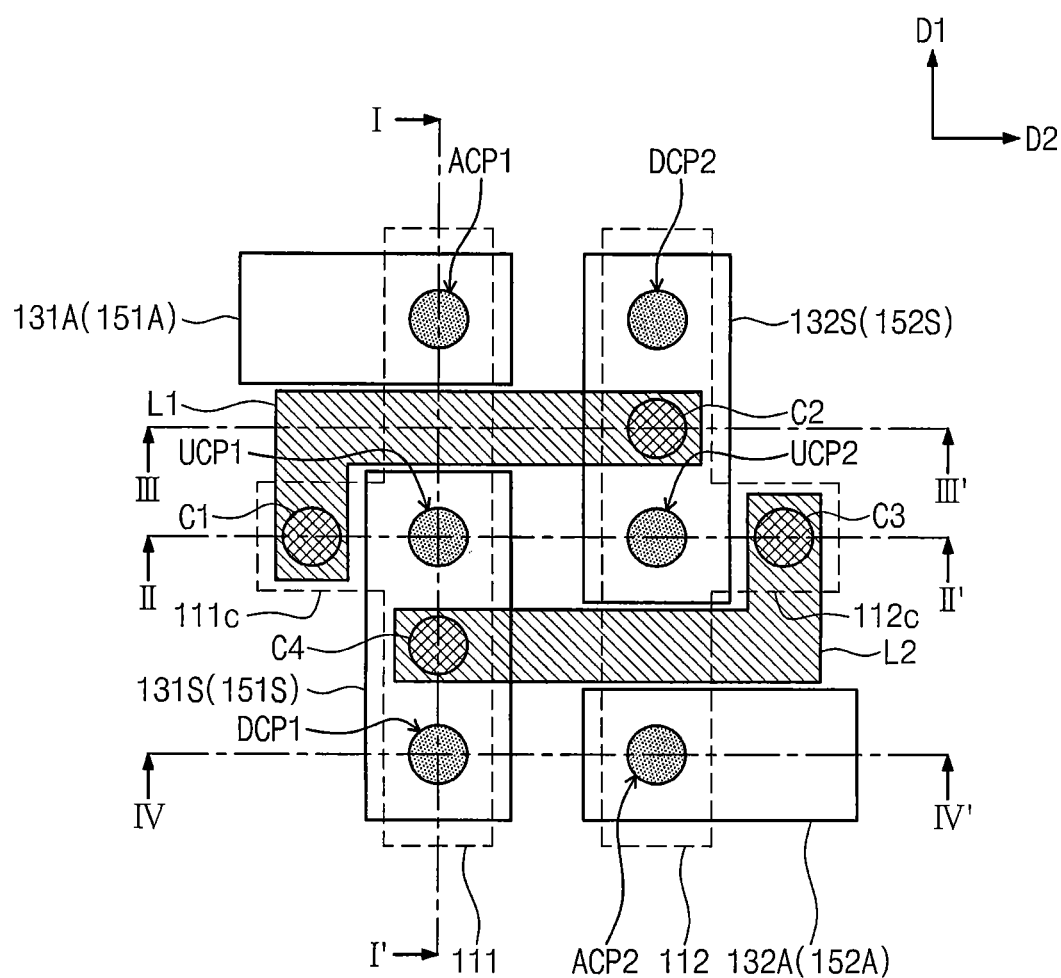
Figure 8B:
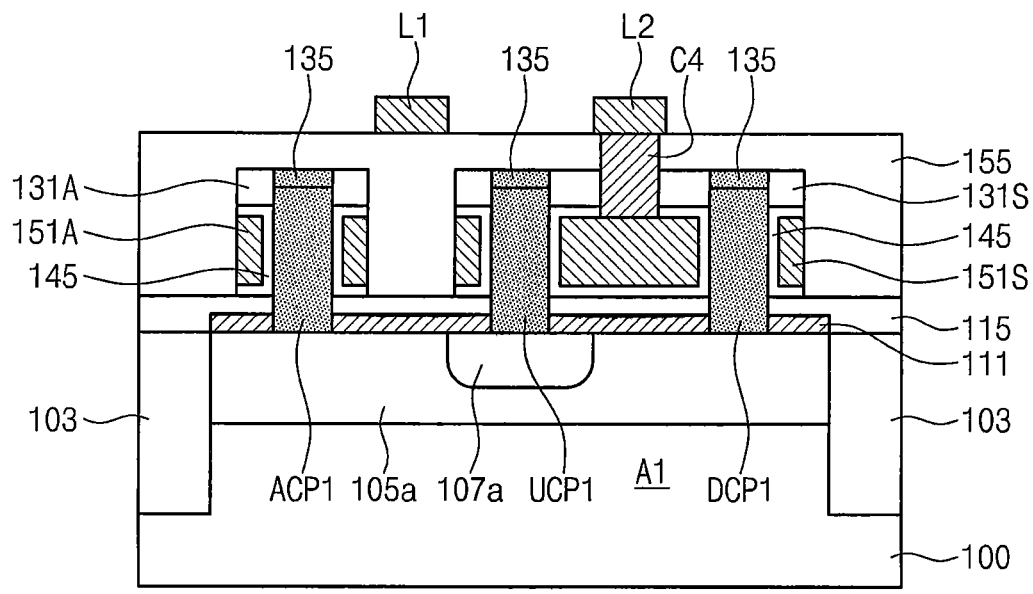
Figure 8C:
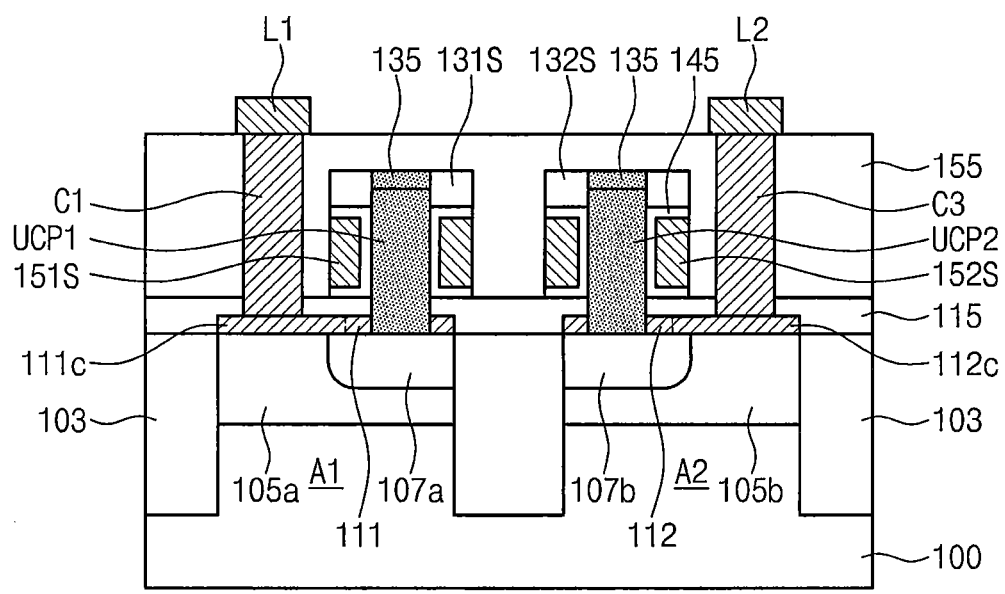
Figure 8D:
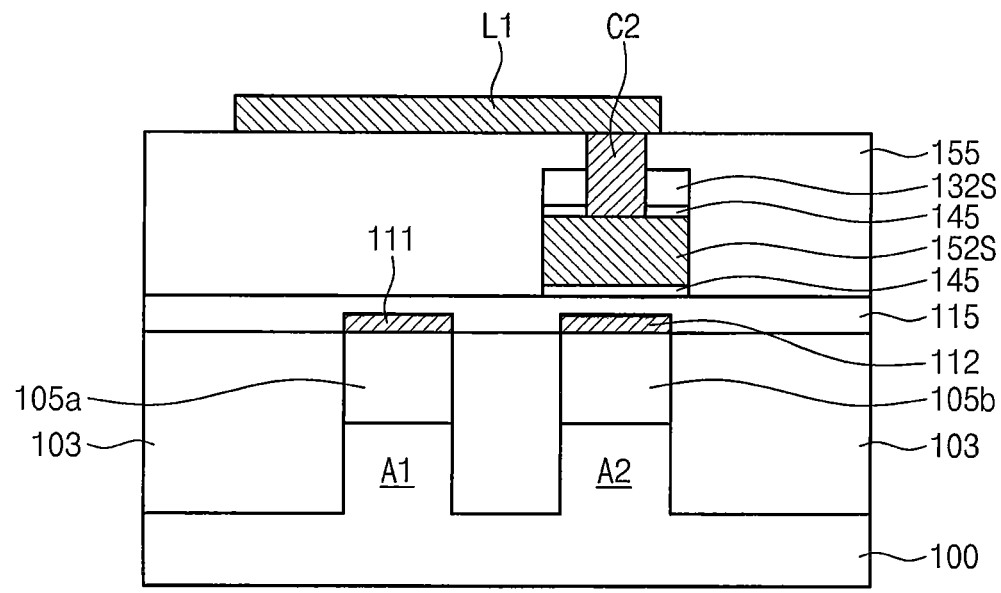
Figure 8E:
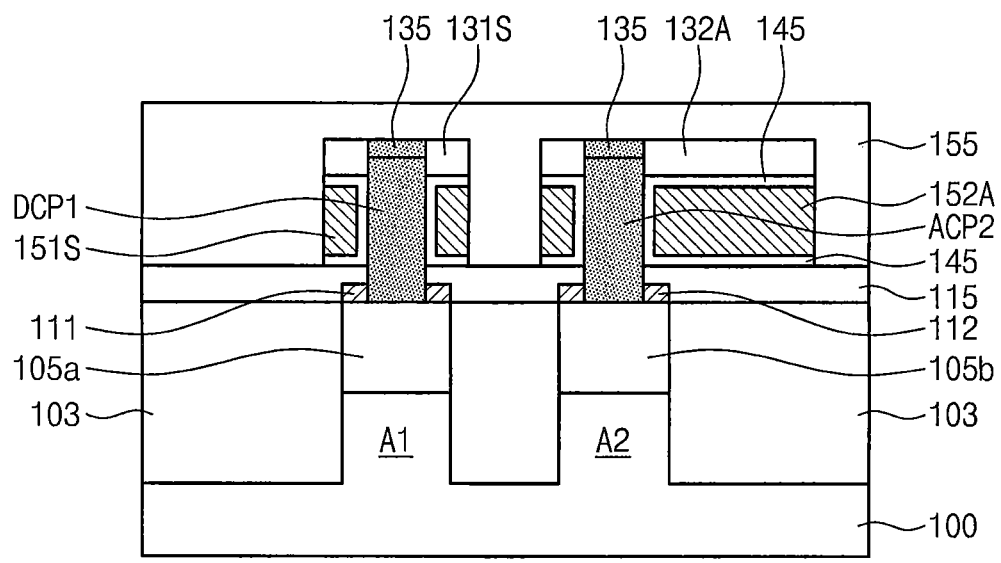
Figure 9A:
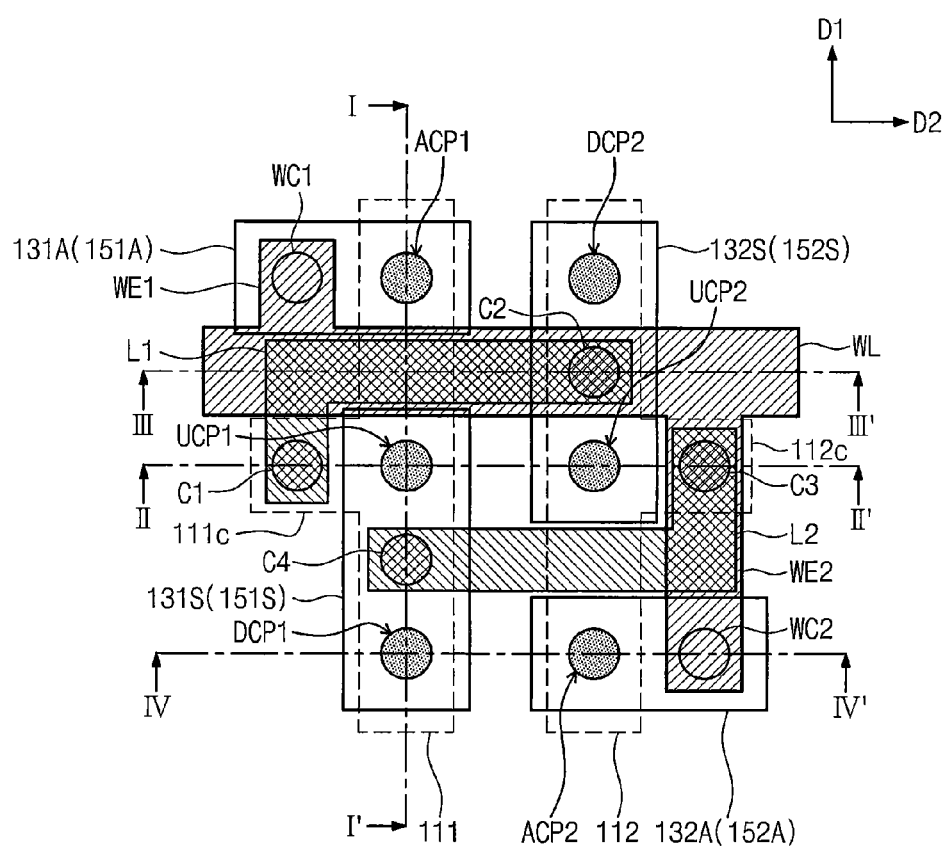
Figure 9B:
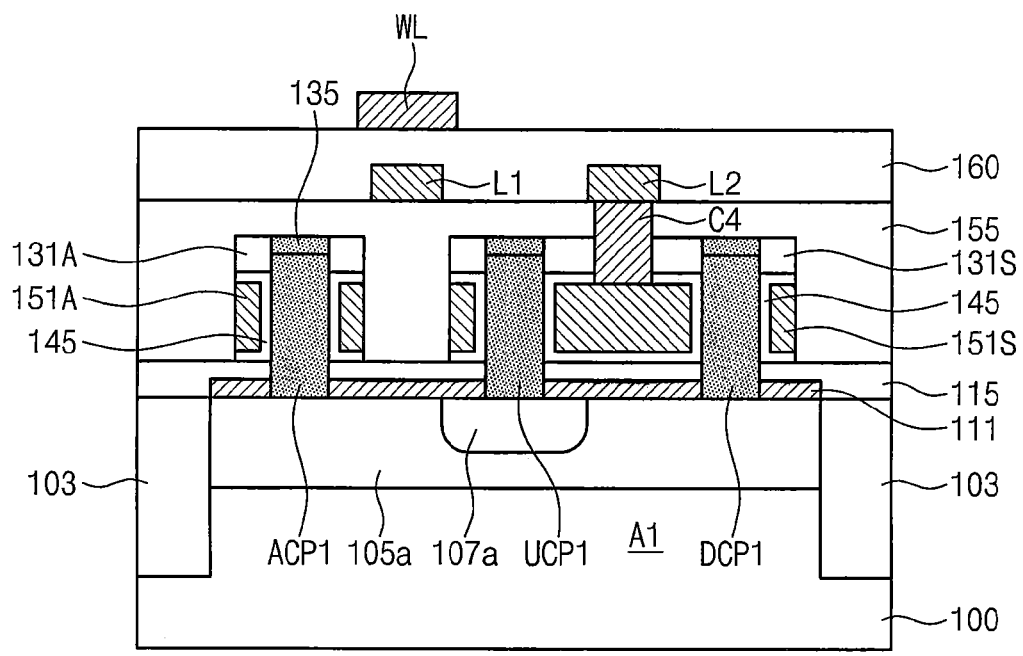
Figure 9C:
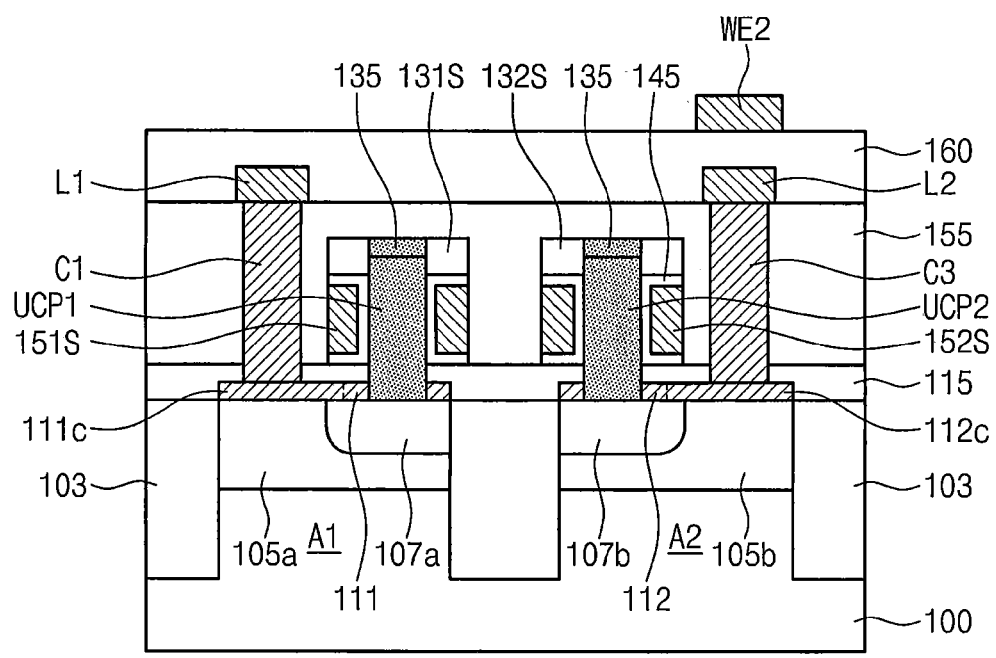
Figure 9D:
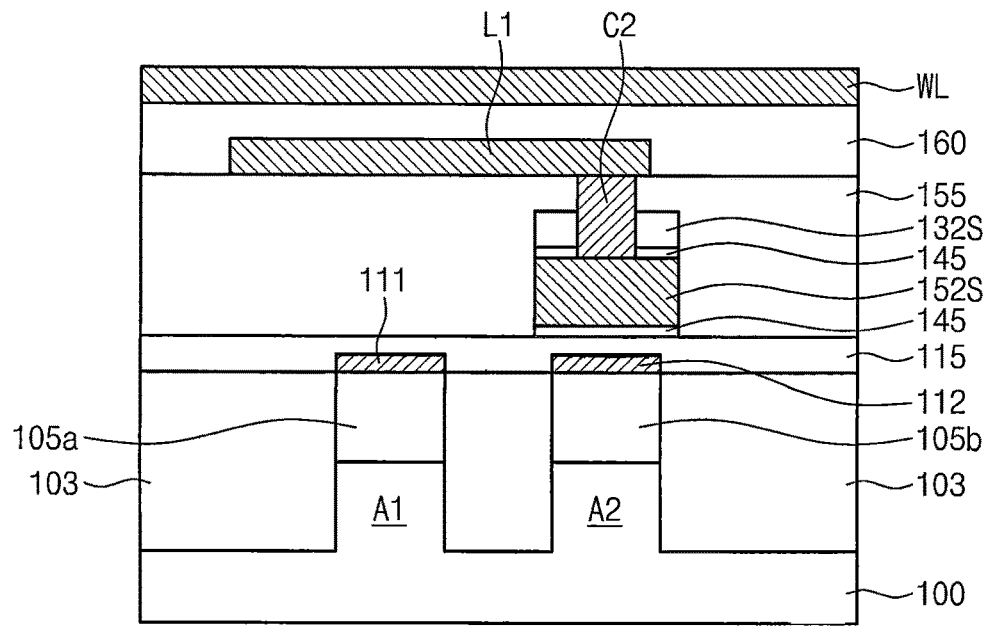
Figure 9E:
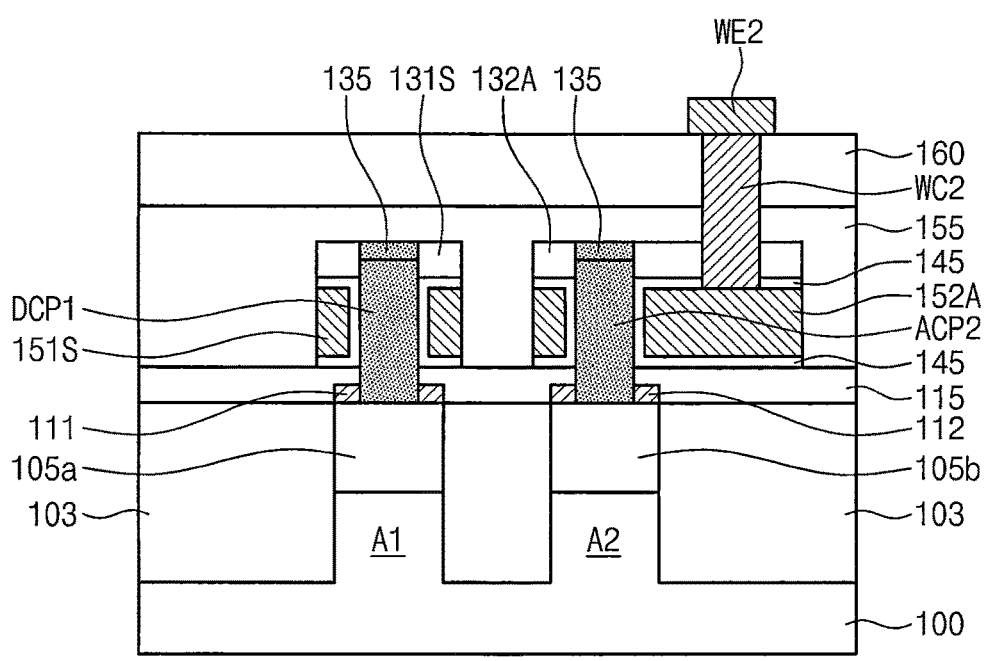
Figure 10A:
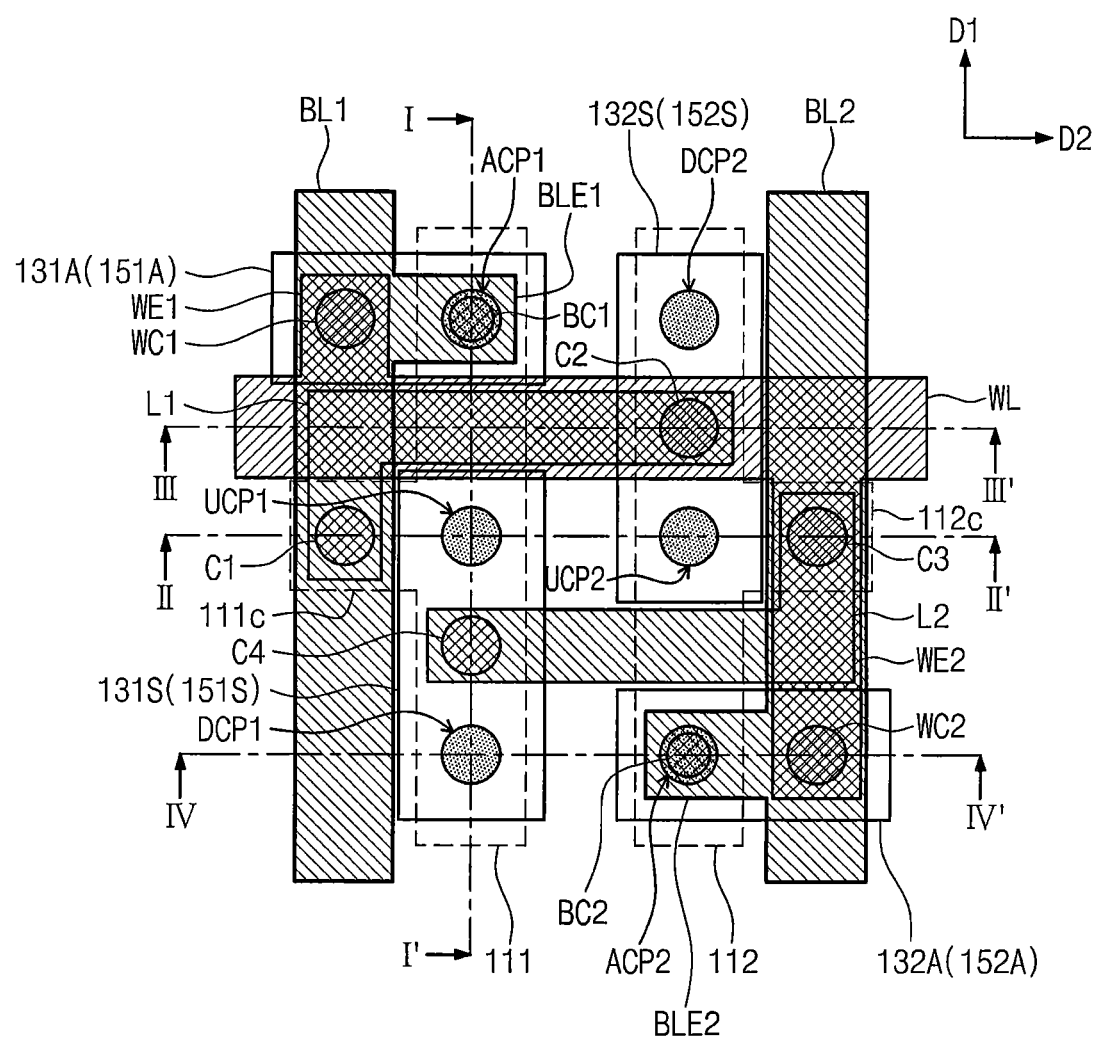
Figure 10B:
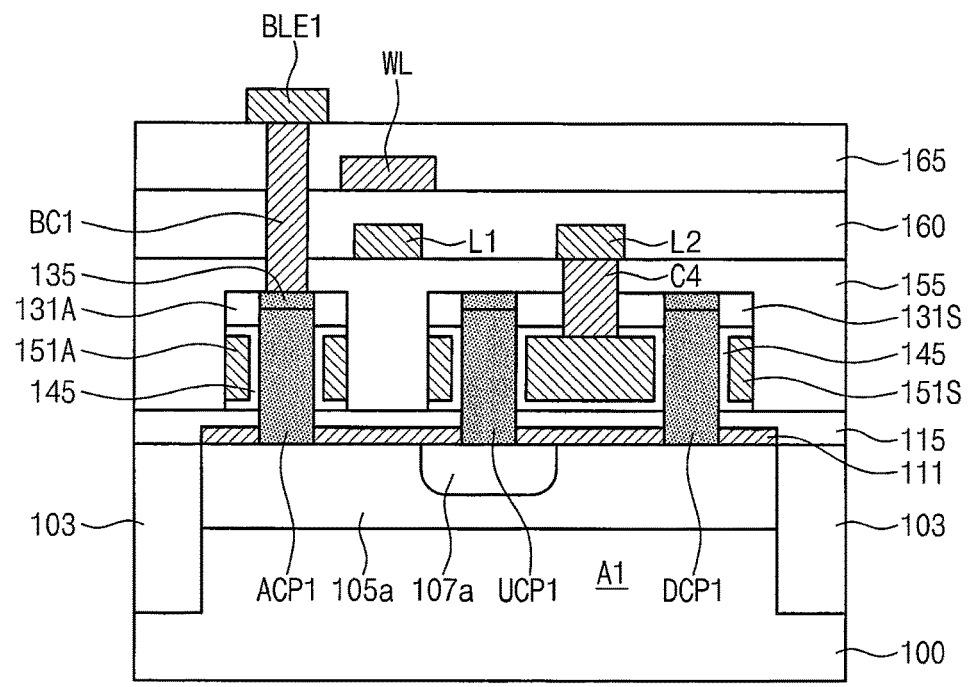
Figure 10C:
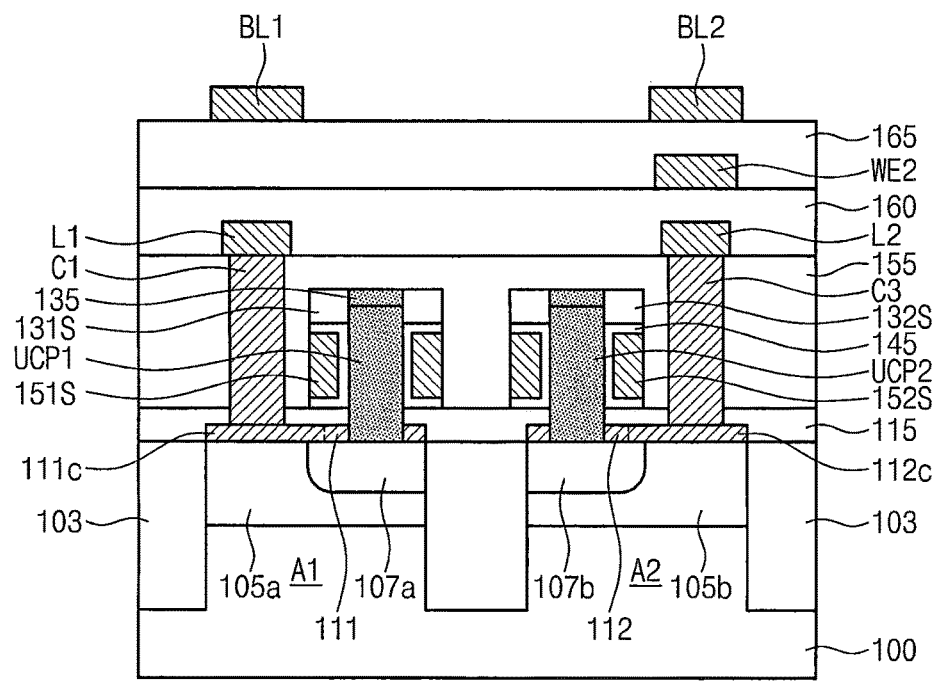
Figure 10D:
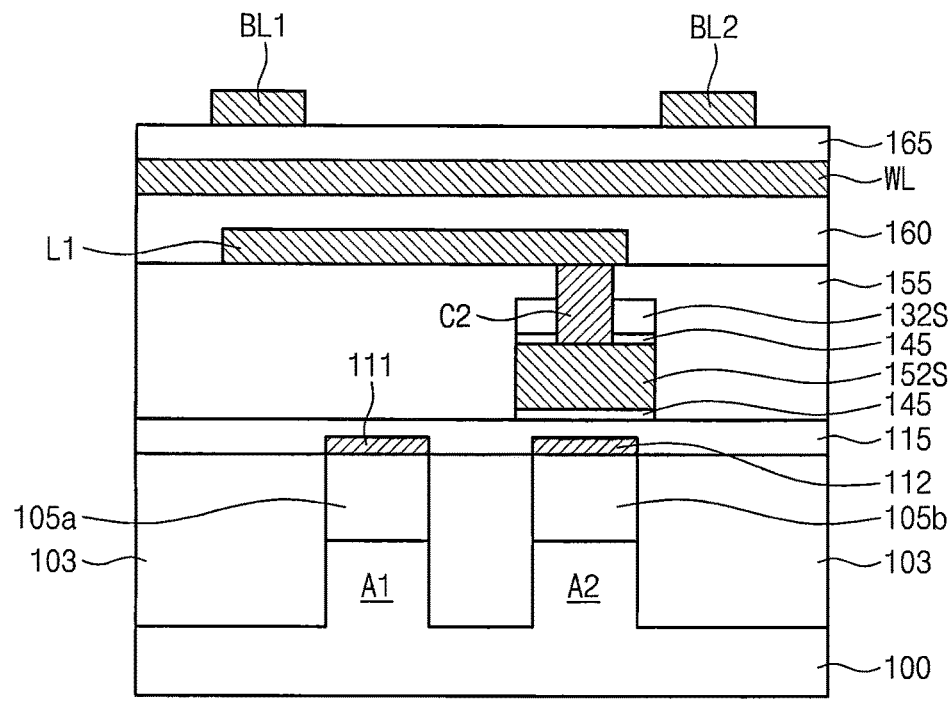
Figure 10E:
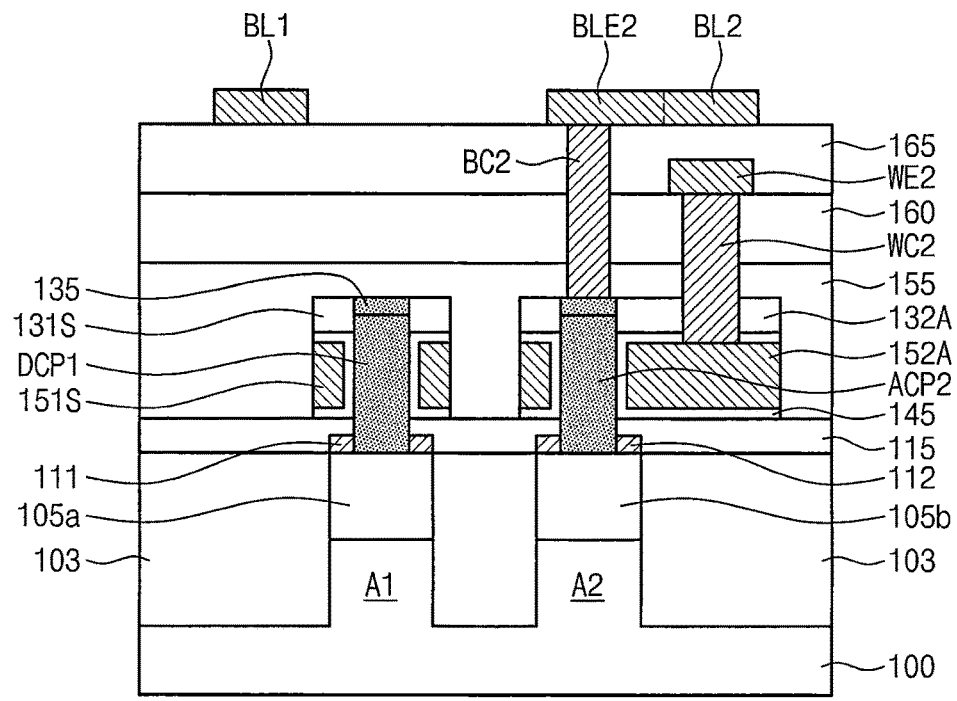

As illustrated in FIG. 8A, the second contact plug C2 may be offset from a line II-II' in the first direction D1. The line II-II' passes through a center of the first contact plug C1 and extends in the second direction D2. In other words, the first and second contact plugs C1 and C2 may not be arranged in the second direction D2. The first and second local interconnections L1 and L2 do not overlap with the vertical channel portions ACP1, UCP1, DCP1, ACP2, UCP2 and DCP2. Thus, the first local interconnection L1 may be L-shaped when viewed from a plan view. Likewise, the second local interconnection L2 may also be L-shaped.

Referring to FIGS. 9A, 9B, 9C, 9D, and 9E, a second interlayer insulating layer 160 may be formed on the substrate 100 having the local interconnections L1 and L2. For example, the second interlayer insulating layer 160 may include at least one of a silicon oxide layer, a silicon nitride layer, and a silicon oxynitride layer.

A first word line contact plug WC1 may be formed to penetrate the second and first interlayer insulating layers 160 and 155, the first access capping pattern 131A, and the gate dielectric layer 145. Thus, the first word line contact plug WC1 may be connected to the first access gate 151A. A second word line contact plug WC2 may be formed to penetrate the second and first interlayer insulating layers 160 and 155, the second access capping pattern 132A, and the gate dielectric layer 145. Thus, the second word line contact plug WC2 may be connected to the second access gate 152A. The first and second word line contact plugs WC1 and WC2 may be formed at the same time. For example, the word line contact plugs WC1 and WC2 may include at least one of a metal (e.g., tungsten, aluminum, titanium, and/or tantalum) and a conductive metal nitride (e.g., titanium nitride, tantalum nitride, and/or tungsten nitride).

A word line WL may be formed on the second interlayer insulating layer 160. The word line WL may extend in the second direction D2. The word line WL may be connected to the first and second word line contact plugs WC1 and WC2. The word line WL may not overlap with the vertical channel portions ACP1, UCP1, DCP1, ACP2, UCP2 and DCP2. A first word line extension WE1 may extend from the word line WL onto the first word line contact plug WC1. A second word line extension WE2 may extend from the word line WL onto the second word line contact plug WC2. The word line WL may be electrically connected to the first and second access gates 151A and 152A through the first and second word line extensions WE1 and WE2 and the first and second word line contact plugs WC1 and WC2.

The word line WL and the word line extensions WE1 and WE2 may be formed by a patterning process. In other words, a word line conductive layer may be formed on the second interlayer insulating layer 160, and the word line conductive layer may be then patterned to form the word line WL and the word line extensions WE1 and WE2. For example, the word line WL and the word line extensions WE1 and WE2 may include at least one of a metal (e.g., tungsten, aluminum, titanium, and/or tantalum) and a conductive metal nitride (e.g., titanium nitride, tantalum nitride, and/or tungsten nitride).

Referring to FIGS. 10A, 10B, 10C, 10D, and 10E, a third interlayer insulating layer 165 may be formed on the substrate 100 having the word line WL. For example, the third interlayer insulating layer 165 may include at least one of a silicon oxide layer, a silicon nitride layer, and a silicon oxynitride layer.

First and second bit line contact plugs BC1 and BC2 may be formed to penetrate the third, second and first interlayer insulating layers 165, 160 and 155. The first and second bit line contact plugs BC1 and BC2 may be electrically connected to top ends of the first and second access vertical channel portions ACP1 and ACP2, respectively. In some embodiments, the first and second bit line contact plugs BC1 and BC2 may be in contact with the upper electrodes 135 on the first and second access vertical channel portions ACP1 and ACP2, respectively.

The first and second bit line contact plugs BC1 and BC2 may be formed at the same time. The first and second bit line contact plugs BC1 and BC2 may include at least one of a metal (e.g., tungsten, aluminum, titanium, and/or tantalum) and a conductive metal nitride (e.g., titanium nitride, tantalum nitride, and/or tungsten nitride).

First and second bit lines BL1 and BL2 may be formed on the third interlayer insulating layer 165. The first and second bit lines BL1 and BL2 may extend in parallel in the first direction D1 to cross over the word line WL. The first and second bit lines BL1 and BL2 are laterally spaced apart from each other. The first and second bit lines BL1 and BL2 may be electrically connected to the first and second bit line contact plugs BC1 and BC2, respectively. The first and second bit lines BL1 and BL2 may not overlap with the pull-up and pull-down vertical channel portions UCP1, UCP2, DCP1 and DCP2. In some embodiments, a first bit line extension BLE1 may extend from the first bit line BL1 to contact the first bit line contact plug BC1. A second bit line extension BLE2 may extend from the second bit line BL2 to contact the second bit line contact plug BC2.

The bit lines BL1 and BL2 and the bit line extensions BLE1 and BLE2 may be formed simultaneously using a patterning process. The bit lines BL1 and BL2 and the bit line extensions BLE1 and BLE2 may include at least one of a metal (e.g., tungsten, aluminum, titanium, and/or tantalum) and a conductive metal nitride (e.g., titanium nitride, tantalum nitride, and/or tungsten nitride).

Subsequent processes will be described with reference to FIGS. 11A to 11E. Referring to FIGS. 11A, 11B, 11C, 11D, and 11E, a fourth interlayer insulating layer 170 may be formed on the substrate 100 having the bit lines BL1 and BL2. For example, the fourth interlayer insulating layer 170 may include at least one of a silicon oxide layer, a silicon nitride layer, and a silicon oxynitride layer.

First and second power contact plugs PC1 and PC2 and first and second ground contact plugs GC1 and GC2 may be formed to penetrate the fourth, third, second and first interlayer insulating layers 170, 165, 160 and 155. The first and second power contact plugs PC1 and PC2 may be electrically connected to top ends of the first and second pull-up vertical channel portions UCP1 and UCP2, respectively. The first and second ground contact plugs GC1 and GC2 may be electrically connected to top ends of the first and second pull-down vertical channel portions DCP1 and DCP2, respectively. In some embodiments, the first and second power contact plugs PC1 and PC2 and the first and second ground contact plugs GC1 and GC2 may be in contact with the upper electrodes 135 disposed on the first and second pull-up vertical channel portions UCP1 and UCP2 and the first and second pull-down vertical channel portions DCP1 and DCP2, respectively. For example, the power and ground contact plugs PC1, PC2, GC1 and GC2 may include at least one of a metal (e.g., tungsten, aluminum, copper, titanium, and/or tantalum) and a conductive metal nitride (e.g., titanium nitride, tantalum nitride, and/or tungsten nitride).

A first ground line VssL1, a power line VccL, and a second ground line VssL2 may be formed on the fourth interlayer insulating layer 170. The first ground line VssL1 is connected to a top surface of the first ground contact plug GC1, and the second ground line VssL2 is connected to a top surface of the second ground contact plug GC2. The power line VccL is connected to top surfaces of the first and second power contact plugs PC1 and PC2. The first ground, power and second ground lines VssL1, VccL and VssL2 may extend in parallel in the second direction D2. For example, the ground and power lines VssL1, VccL and VssL2 may include at least one of a metal (e.g., tungsten, aluminum, copper, titanium, and/or tantalum) and a conductive metal nitride (e.g., titanium nitride, tantalum nitride, and/or tungsten nitride).

According to the aforementioned method of manufacturing the SRAM cell, the sacrificial patterns 121A, 121S, 122A and 122S are removed to form the empty regions 141A, 141S, 142A and 142S after the formation of the vertical channel portions ACP1, UCP1, DCP1, ACP2, UCP2 and DCP2. Subsequently, the gates 151A, 151S, 152A and 152S are formed in the empty regions 141A, 141S, 142A and 142S, respectively. As a result, the vertical channel portions ACP1, UCP1, DCP1, ACP2, UCP2 and DCP2 and the gates 151A, 151S, 152A and 152S of the SRAM cell may be easily manufactured. Additionally, since the gates 151A, 151S, 152A and 152S are formed to fill the empty regions 141A, 141S, 142A and 142S, the conductive material of the gates 151A, 151S, 152A and 152S may be selected from various materials. Thus, performance and/or characteristics of the SRAM cell may be improved.

Additionally, the vertical channel portions ACP1, UCP1, DCP1, ACP2, UCP2 and DCP2 may be formed by the epitaxial process using the active portions A1 and A2 exposed by the channel holes 133a1, 133a2, 133u1, 133u2, 133d1 and 133d2 as the seed. Thus, the vertical channel portions ACP1, UCP1, DCP1, ACP2, UCP2 and DCP2 may include a single-crystalline semiconductor material. As a result, the performance and/or characteristics of the SRAM cells may be improved.

Moreover, in some embodiments, since all the transistors of the SRAM cell described herein have vertical channel portions, the area occupied by the SRAM cell may be reduced to realize a more highly integrated semiconductor device.

Figure 11A:
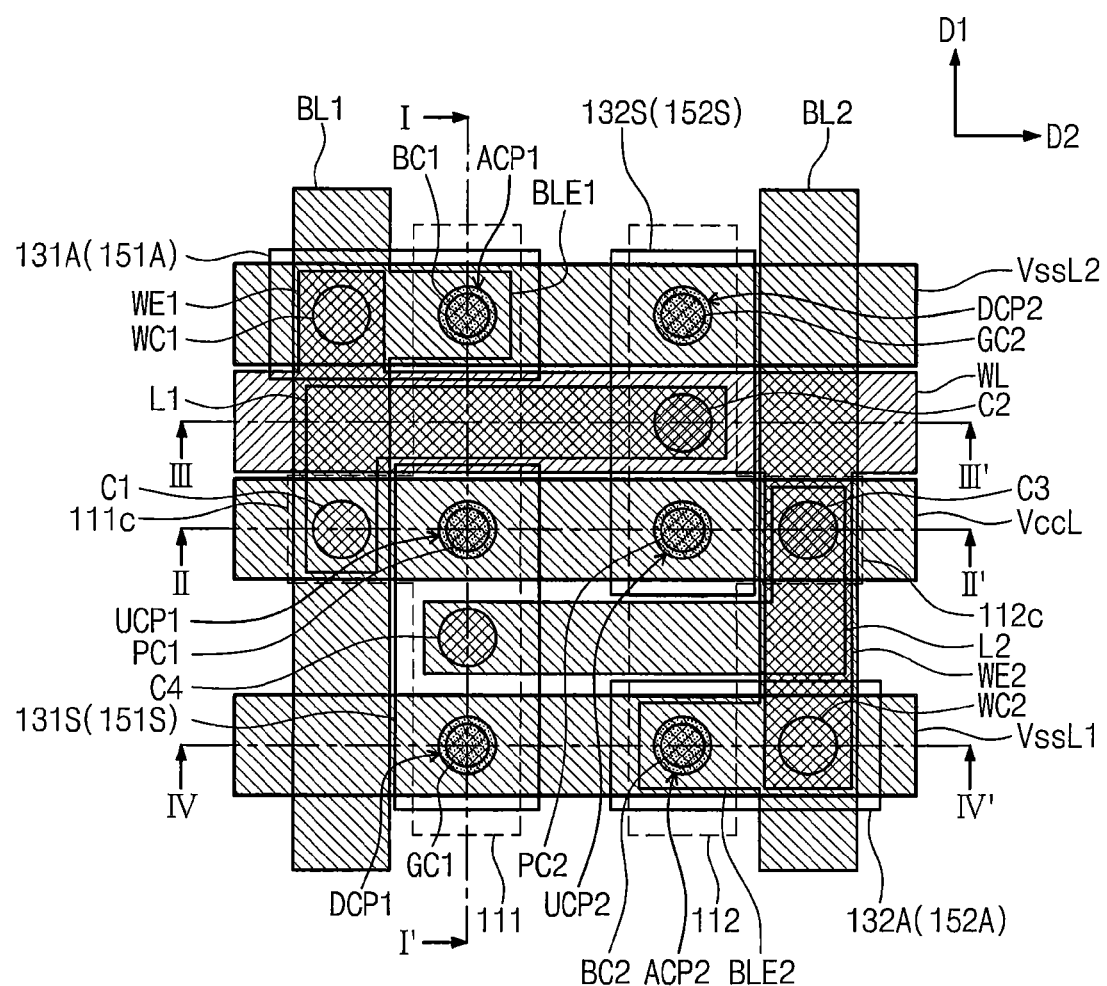
FIG. 11A is a plan view illustrating an SRAM cell according to some embodiments of the inventive concept.
Figure 11B:
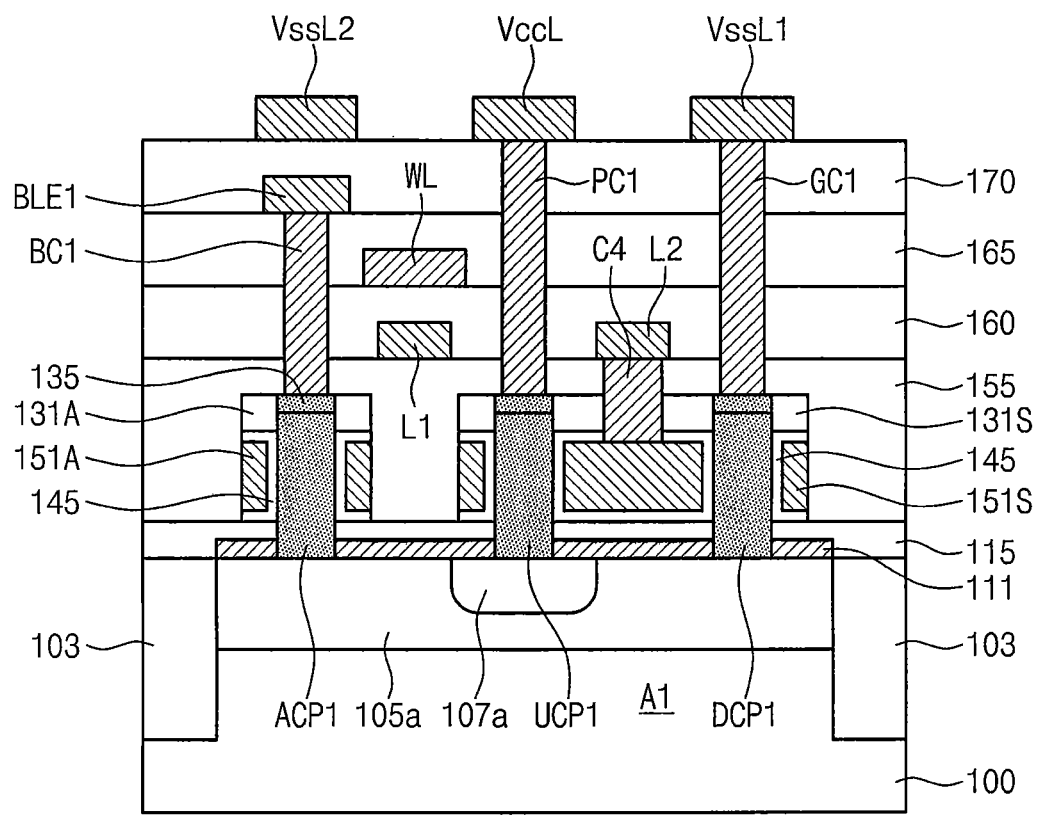
FIGS. 11B, 11C, 11D, and 11E are cross-sectional views taken along lines I-I', II-II', III-III', and IV-IV' of FIG. 11A, respectively.
Figure 11C:
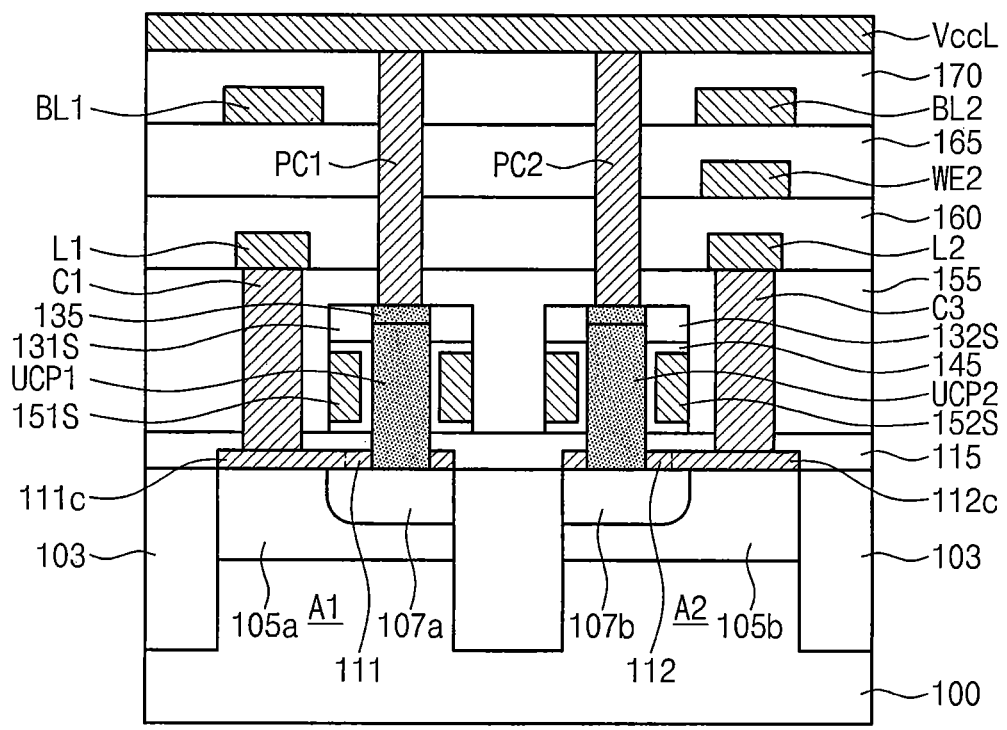
Figure 11D:
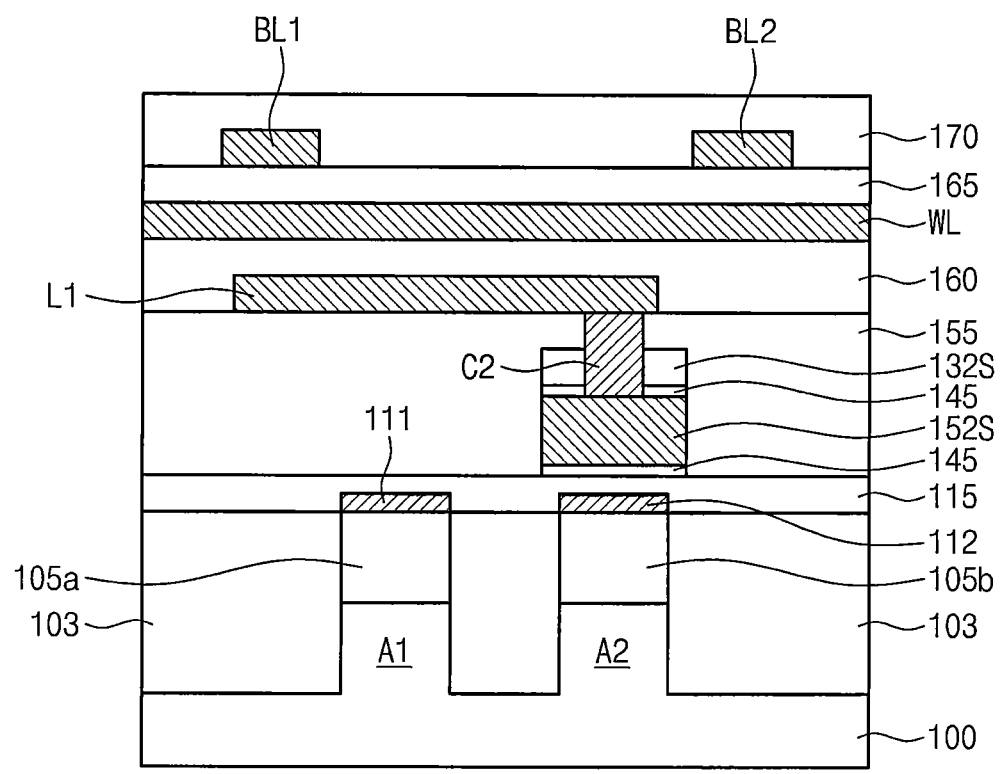
Figure 11E:
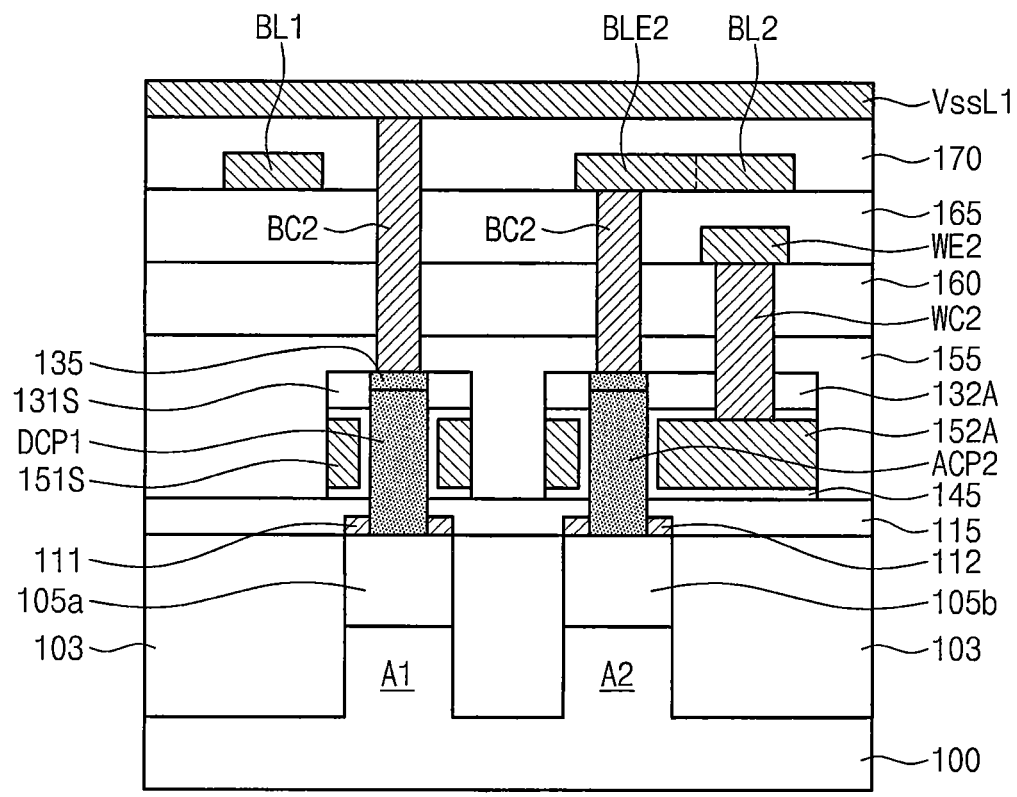
Figure 11F:
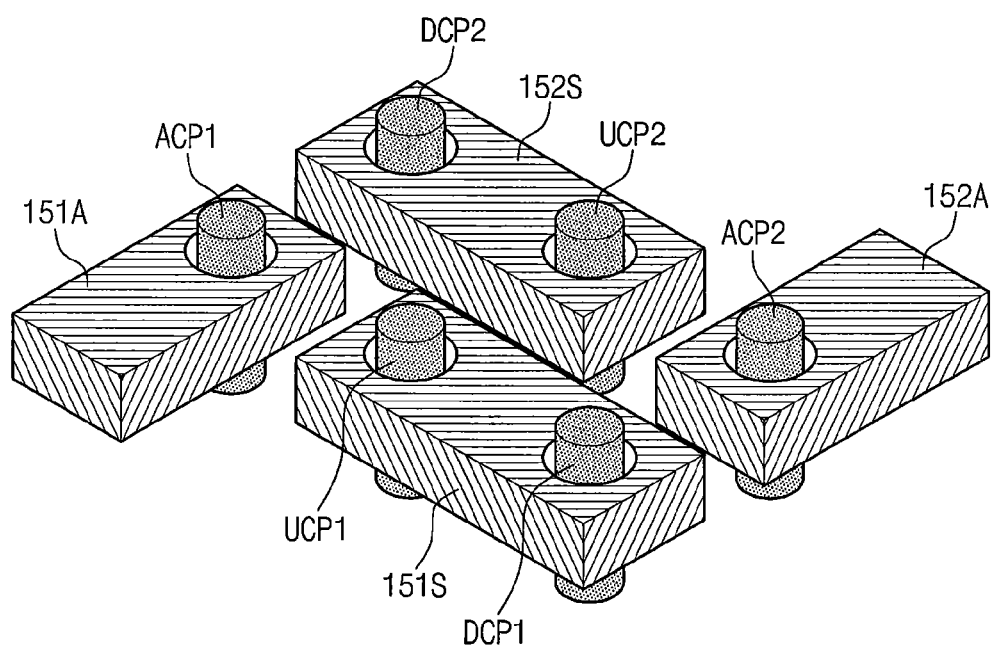
FIG. 11F is a perspective view illustrating gate electrodes and vertical channel portions of FIG. 11A.

Next, the SRAM cell according to the present embodiment will be described with reference to FIGS. 11A to 11F. Hereinafter, the aforementioned descriptions will be omitted or mentioned briefly. FIG. 11A is a plan view illustrating an SRAM cell according to some embodiments of the inventive concepts. FIGS. 11B, 11C, 11D, and 11E are cross-sectional views taken along lines I-I', II-II', III-III', and IV-IV' of FIG. 11A, respectively. FIG. 11F is a perspective view illustrating gate electrodes and vertical channel portions of FIG. 11A.

Referring to FIGS. 11A to 11F, a device isolation pattern 103 may be disposed in a substrate 100 to define first and second active portions A1 and A2. The first and second active portions A1 and A2 are the same as described with reference to FIGS. 2A to 2E. First and second N-type dopant regions 105a and 105b may be disposed in the first and second active portions A1 and A2, respectively. First and second P-type dopant regions 107a and 107b may be disposed in the first and second N-type dopant regions 105a and 105b, respectively. The N-type and P-type dopant regions 105a, 105b, 107a and 107b are the same as described with reference to FIGS. 2A to 2E.

First and second node electrodes 111 and 112 spaced apart from each other are disposed on the substrate 100. The first and second node electrodes 111 and 112 are disposed on the first and second active portions A1 and A2, respectively. The first node electrode 111 may be in contact with the first N-type and first P-type dopant regions 105a and 107a, and the second node electrode 112 may be in contact with the second N-type and second P-type dopant regions 105b and 107b. Thus, the first N-type and first P-type dopant regions 105a and 107a are electrically connected to each other by the first node electrode 111, and the second N-type and second P-type dopant regions 105b and 107b are electrically connected to each other by the second node electrode 112. First and second node extensions 111c and 112c may laterally extend from the first and second node electrodes 111 and 112, respectively. The shapes of the node electrodes 111 and 112 and the node extensions 111c and 112c are the same as described with reference to FIGS. 2A to 2E.

A lower insulating layer 115 covers the node electrodes 111 and 112 and the node extensions 111c and 112c. Gates 151A, 151S, 152A and 152S are disposed on the lower insulating layer 115. The gates 151A, 151S, 152A and 152S are laterally spaced apart from each other. A first access gate 151A and a first shared gate 151S may be disposed over the first node electrode 111, and a second access gate 152A and a second shared gate 152S may be disposed over the second node electrode 112.

First access, first shared, second access and second shared capping patterns 131A, 131S, 132A and 132S may be disposed on the first access, first shared, second access and second shared gates 151A, 151S, 152A and 152S, respectively. The capping patterns 131A, 131S, 132A and 132S are laterally spaced apart from each other. The capping patterns 131A, 131S, 132A and 132S are formed of an insulating material.

A first access vertical channel portion ACP1 may penetrate the first access capping pattern 131A, the first access gate 151A, the lower insulating layer 115 and the first node electrode 111, to contact the first N-type dopant region 105a. A first pull-up vertical channel portion UCP1 may penetrate the first shared capping pattern 131S, the first shared gate 151S, the lower insulating layer 115 and the first node electrode 111, to contact the first P-type dopant region 107a. A first pull-down vertical channel portion DCP1 may penetrate the first shared capping pattern 131S, the first shared gate 151S, the lower insulating layer 115 and the first node electrode 111, to contact the first N-type dopant region 105a.

Likewise, a second access vertical channel portion ACP2 may penetrate the second access capping pattern 132A, the second access gate 152A, the lower insulating layer 115 and the second node electrode 112, to contact the second N-type dopant region 105b. A second pull-up vertical channel portion UCP2 may penetrate the second shared capping pattern 132S, the second shared gate 152S, the lower insulating layer 115 and the second node electrode 112, to contact the second P-type dopant region 107b. A second pull-down vertical channel portion DCP2 may penetrate the second shared capping pattern 132S, the second shared gate 152S, the lower insulating layer 115 and the second node electrode 112, to contact the second N-type dopant region 105b.

Bottom end portions of the first access, first pull-up and first pull-down vertical channel portions ACP1, UCP1 and DCP1 may be electrically connected to each other by the first node electrode 111. In some embodiments, sidewalls of the bottom end portions of the first access, first pull-up and first pull-down vertical channel portions ACP1, UCP1 and DCP1 may contact the first node electrode 111. Bottom end portions of the second access, second pull-up and second pull-down vertical channel portions ACP2, UCP2 and DCP2 may be electrically connected to each other by the second node electrode 112. In some embodiments, sidewalls of the bottom end portions of the second access, second pull-up and second pull-down vertical channel portions ACP2, UCP2 and DCP2 may contact the second node electrode 112.

The first access, second access, first pull-down and second pull-down vertical channel portions ACP1, ACP2, DCP1 and DCP2 have characteristics of channel portions of NMOS transistors, and the first pull-up and second pull-up vertical channel portions UCP1 and UCP2 have characteristics of channel portions of PMOS transistors.

A gate dielectric layer 145 is disposed between each of the vertical channel portions ACP1, UCP1, DCP1, ACP2, UCP2 and DCP2 and the gate 151A, 151S, 152A or 152S corresponding thereto. In some embodiments, the gate dielectric layer 145 may extend to be disposed between a top surface of each of the gates 151A, 151S, 152A and 152S and each of the capping patterns 131A, 131S, 132A and 132S and between the lower insulating layer 115 and a bottom surface of each of the gates 151A, 151S, 152A and 152S.

Other features of the vertical channel portions ACP1, UCP1, DCP1, ACP2, UCP2 and DCP2, the gates 151A, 151S, 152A and 152S, and the gate dielectric layer 145 are the same as described with reference to FIGS. 3A to 3E, 6A to 6E, and 7A to 7E.

A first interlayer insulating layer 155 may cover the vertical channel portions ACP1, UCP1, DCP1, ACP2, UCP2 and DCP2, the gates 151A, 151S, 152A and 152S, and the capping patterns 131A, 131S, 132A and 132S. First and second local interconnections L1 and L2 are disposed on the first interlayer insulating layer 155. The first local interconnection L1 is electrically connected to the first node extension 111c and the second shared gate 152S through a first contact plug C1 and a second contact plug C2, respectively. Thus, the first node electrode 111 is electrically connected to the second shared gate 152S by the first local interconnection L1. The second local interconnection L2 is electrically connected to the second node extension 112c and the first shared gate 151S through a third contact plug C3 and a fourth contact plug C4, respectively. Thus, the second node electrode 112 is electrically connected to the first shared gate 151S through the second local interconnection L2.

As a result, the bottom end portions of the first access, first pull-up and first pull-down vertical channel portions ACP1, UCP1 and DCP1 are electrically connected to the second shared gate 152S, and the bottom end portions of the second access, second pull-up and second pull-down vertical channel portions ACP2, UCP2 and DCP are electrically connected to the first shared gate 151S. Thus, the latch structure of the SRAM cell is realized.

A second interlayer insulating layer 160 may be disposed on the first interlayer insulating layer 155 and the local interconnections L1 and L2. A word line WL may be disposed on the second interlayer insulating layer 160. The word line WL may be electrically connected to the first and second access gates 151A and 152A through first and second word line extensions WE1 and WE2 and first and second word line contact plugs WC1 and WC2.

A third interlayer insulating layer 165 may be disposed on the second interlayer insulating layer 160 and the word line WL. First and second bit lines BL1 and BL2 may be disposed on the third interlayer insulating layer 165. The first and second bit lines BL1 and BL2 may be electrically connected to top ends of the first and second access vertical channel portions ACP1 and ACP2 through first and second bit line extensions BLE1 and BLE2 and first and second bit line contact plugs BC1 and BC2, respectively.

A fourth interlayer insulating layer 170 may be disposed on the third interlayer insulating layer 165 and the first and second bit lines BL1 and BL2. First and second ground lines VssL1 and VssL2 and a power line VccL may be disposed on the fourth interlayer insulating layer 170. The first and second ground lines VssL1 and VssL2 may be electrically connected to top ends of the first and second pull-down vertical channel portions DCP1 and DCP2 through first and second ground contact plugs GC1 and GC2, respectively. The power line VccL may be electrically connected to top ends of the first and second pull-up vertical channel portions UCP1 and UCP2 through first and second power contact plugs PC1 and PC2. The ground and power lines VssL1, VssL2 and VccL may extend in the second direction D2.

According to the SRAM cell described herein, the transistors of the SRAM cell may have vertical channels provided by the vertical channel portions ACP1, UCP1, DCP1, ACP2, UCP2 and DCP2. Thus, a more highly integrated SRAM cell may be realized.

The inventive concepts are not limited to the aforementioned vertical and horizontal positions of the local interconnections L1 and L2 and the lines WL, BL1, BL2, VssL1, VssL2 and VccL. The vertical and horizontal positions of the local interconnections L1 and L2 and the lines WL, BL1, BL2, VssL1, VssL2 and VccL may vary.

Next, modified embodiments of the SRAM cell will be described. Hereinafter, the descriptions to the same elements as described above will be omitted or mentioned briefly for the purpose of ease and convenience in explanation.

Figure 12:
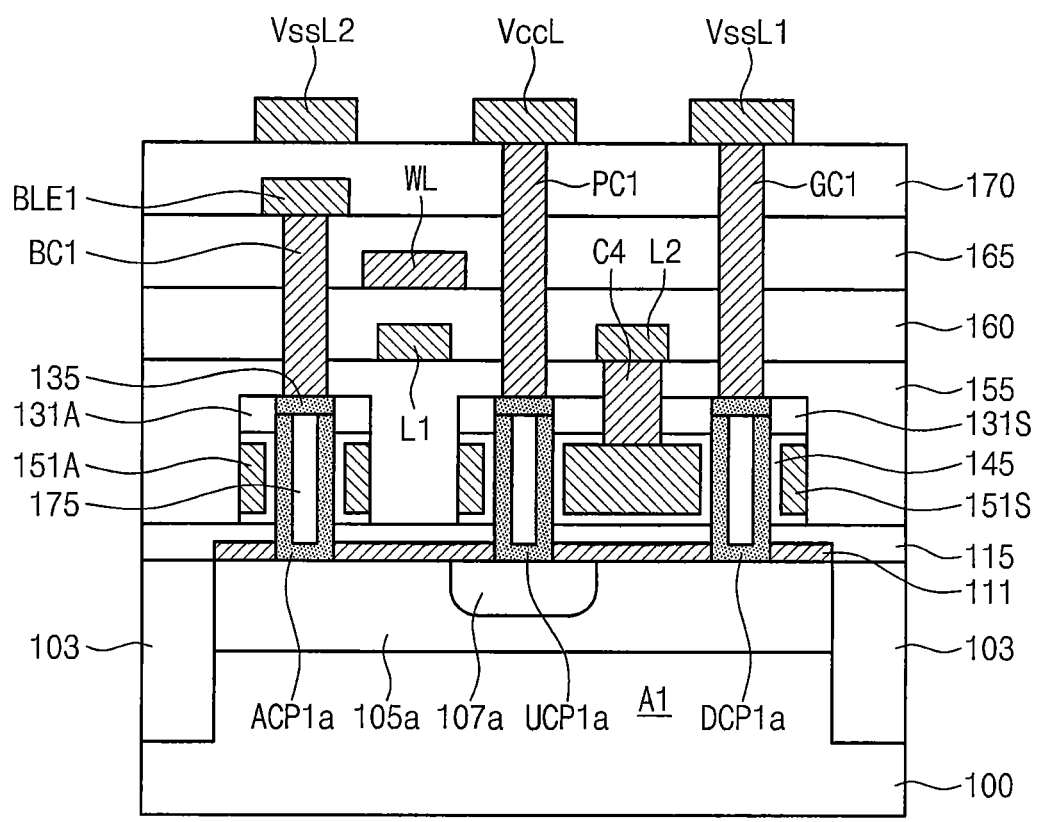
FIG. 12 is a cross-sectional view illustrating an SRAM cell according to some embodiments of the inventive concept.

FIG. 12 is a cross-sectional view illustrating a modified embodiment of an SRAM cell according to some embodiments of the inventive concepts. FIG. 12 is a cross-sectional view corresponding to the line I-I' of FIG. 11A.

Referring to FIG. 12, each of vertical channel portions ACP1$a$, UCP1$a$ and DCP1$a$ according to the present modified embodiment may have a hollow cylindrical shape. In this case, a filling insulating pattern 175 may fill an inner space surrounded by each of the vertical channel portions ACP1$a$, UCP1$a$ and DCP1$a$. An upper electrode 135 may be disposed on each of the filling insulating patterns 175 and each of the vertical channel portions ACP1 a, UCP1 a and DCP1$a$. FIG. 12 illustrates the first access, first pull-up and first pull-down vertical channel portions ACP1$a$, UCP1$a$ and DCP1$a$. However, second access, second pull-up and second pull-down vertical channel portions may have the same shape as the first access, first pull-up and first pull-down vertical channel portions ACP1$a$, UCP1$a$ and DCP1$a$.

In the manufacturing method described with reference to FIGS. 3A to 3E, a channel layer may be conformally formed on the substrate 100 having the channel holes 133$a$1, 133$a$2, 133$u$1, 133$u$2, 133$d$1 and 133$d$2 and then a filling insulating layer may be formed on the channel layer to fill the channel holes 133$a$1, 133$a$2, 133$u$1, 133$u$2, 133$d$1 and 133$d$2. The filling insulating layer and the channel layer may be planarized until the capping insulating layer 130 is exposed, thereby forming the vertical channel portions ACP1$a$, UCP1$a$ and DCP1$a$ and the filling insulating patterns 175. Top ends of the vertical channel portions ACP1$a$, UCP1$a$ and DCP1$a$ and the filling insulating patterns 175 may be recessed, and the upper electrodes 135 may be formed in the recessed regions, respectively.

Figure 13:
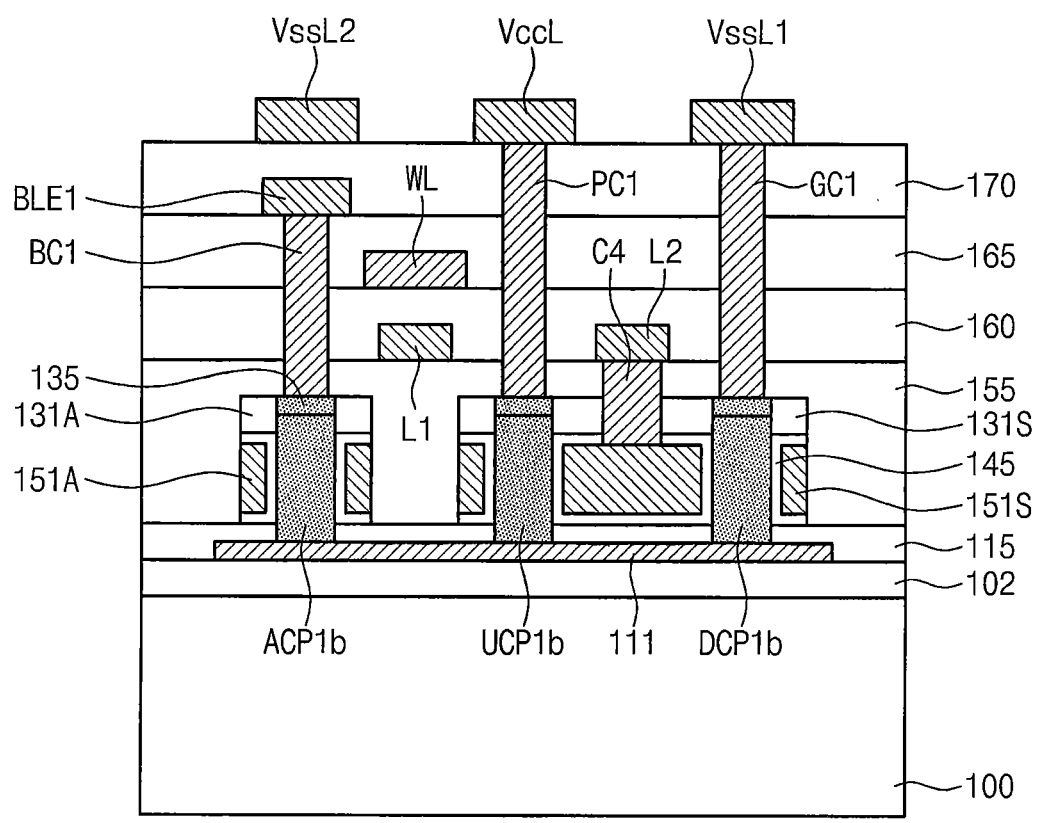
FIG. 13 is a cross-sectional view illustrating embodiments of an SRAM cell according to some embodiments of the inventive concept.

FIG. 13 is a cross-sectional view illustrating an SRAM cell according to some embodiments of the inventive concepts. FIG. 13 is a cross-sectional view corresponding to the line I-I' of FIG. 11A.

Referring to FIG. 13, vertical channel portions ACP1$b$, UCP1$b$ and DCP1$b$ according to the present modified embodiment do not penetrate the first node electrodes 111. In other words, first access, first pull-up and first pull-down vertical channel portions ACP1$b$, UCP1$b$ and DCP1$b$ may be electrically connected to a top surface of the first node electrode 111. Likewise, second access, second pull-up and second pull-down vertical channel portions may be electrically connected to a top surface of the second node electrode 112.

In the present modified embodiment, the active portions A1 and A2 and the dopant regions 105$a$, 105$b$, 107$a$ and 107$b$ of FIGS. 11A to 11E may be omitted. A buffer insulating layer 102 may be disposed on the substrate 100. The node electrodes and the node extensions may be disposed on the buffer insulating layer 102.

In the present modified embodiment, if the vertical channel portions ACP1$b$, UCP1$b$ and DCP1$b$ include a semiconductor material, the semiconductor material may be in a poly-crystalline state.

Figure 14A:
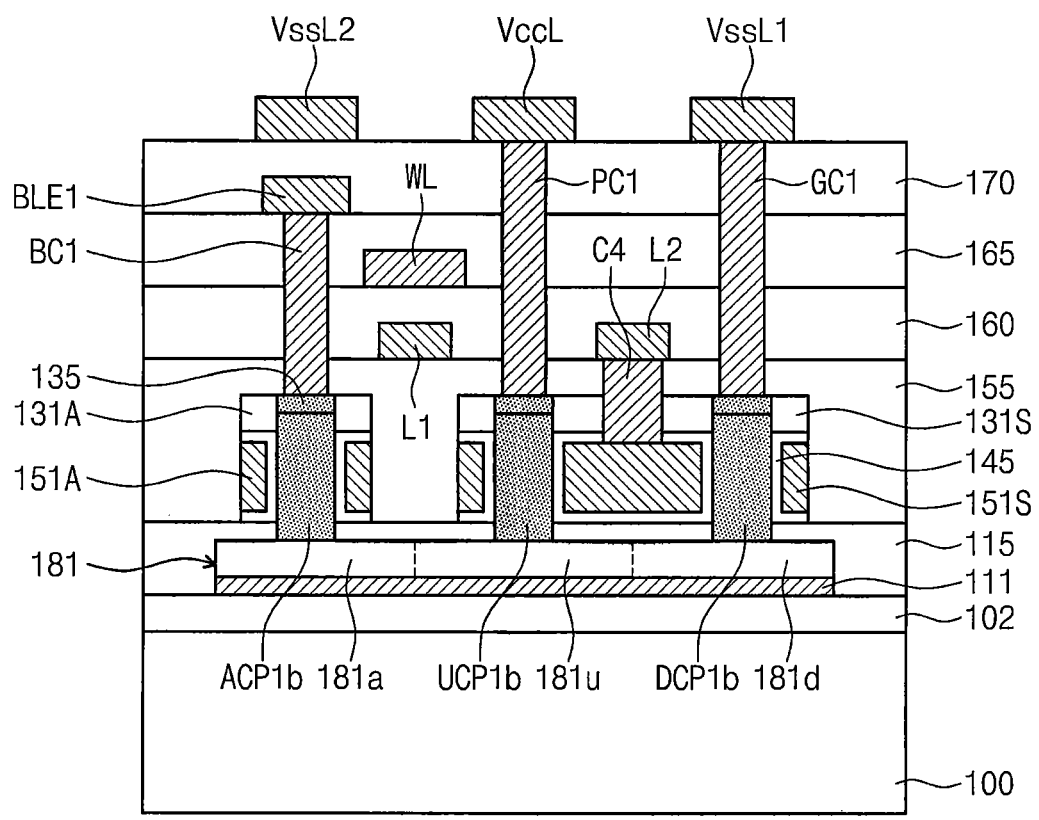
FIGS. 14A and 14B are cross-sectional views illustrating embodiments of an SRAM cell according to some embodiments of the inventive concept.
Figure 14B:
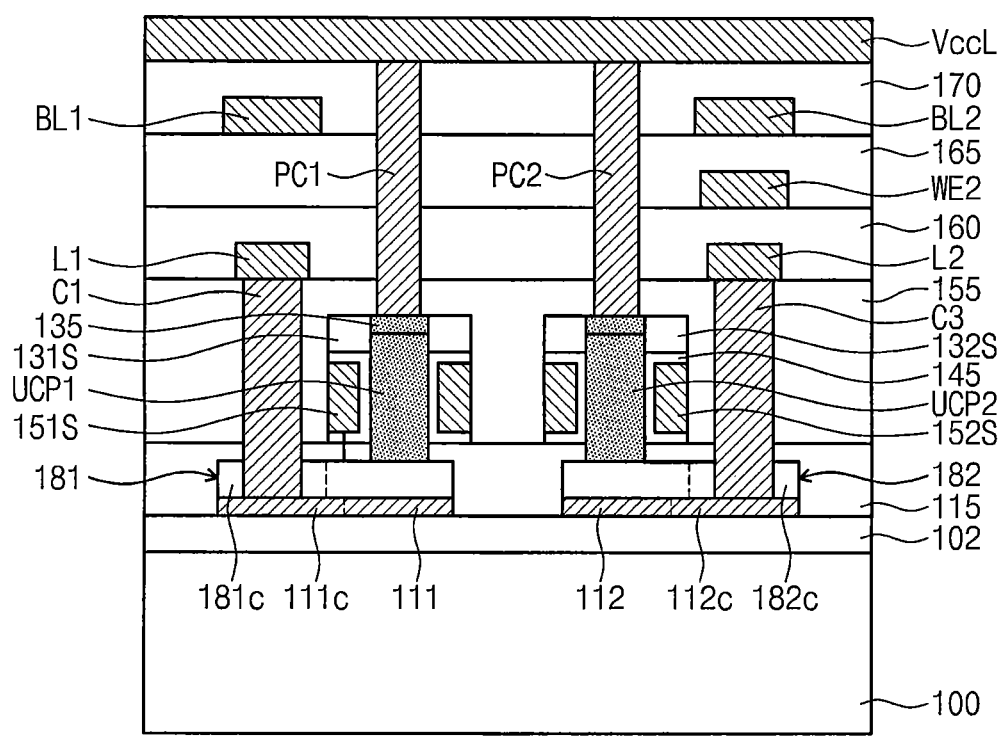

FIGS. 14A and 14B are cross-sectional views illustrating an SRAM cell according to some embodiments of the inventive concept. FIGS. 14A and 14B are cross-sectional views corresponding to the lines I-I' and II-II' of FIG. 11A, respectively.

Referring to FIGS. 14A and 14B, a first semiconductor pattern 181 may contact the top surface of the first node electrode 111, and a second semiconductor pattern 182 may be in contact with the top surface of the second node electrode 112. The lower insulating layer 115 may cover the first and second semiconductor patterns 181 and 182. The first and second semiconductor patterns 181 and 182 may be in a poly-crystalline state.

The first semiconductor pattern 181 may include a first access N-type region 181$a$, a first pull-up P-type region 181$u$, and a first pull-down N-type region 181$d$. The first access, first pull-up and first pull-down vertical channel portions ACP1, UCP1 and DCP1 may contact the top surfaces of the first access N-type region 181$a$, the first pull-up P-type region 181$u$ and the first pull-down N-type region 181$d$, respectively.

Likewise, the second semiconductor pattern 182 may include a second access N-type region, a second pull-up P-type region, and a second pull-down N-type region. The second access, second pull-up and second pull-down vertical channel portions ACP2, UCP2 and DCP2 may contact the top surfaces of the second access N-type region, the second pull-up P-type region and the second pull-down N-type region, respectively.

The first semiconductor pattern 181 may include a first extension 181$c$ covering the first node extension 111$c$, and the second semiconductor pattern 182 may include a second extension 182$c$ covering the second node extension 112$c$. In this case, the first contact plug C1 may penetrate the first interlayer insulating layer 155, the lower insulating layer 115 and the first extension 181$c$, to contact the first node extension 111$c$. The third contact plug C3 may penetrate the first interlayer insulating layer 155, the lower insulating layer 115 and the second extension 182$c$, to contact the second node extension 112$c$.

Figure 15A:
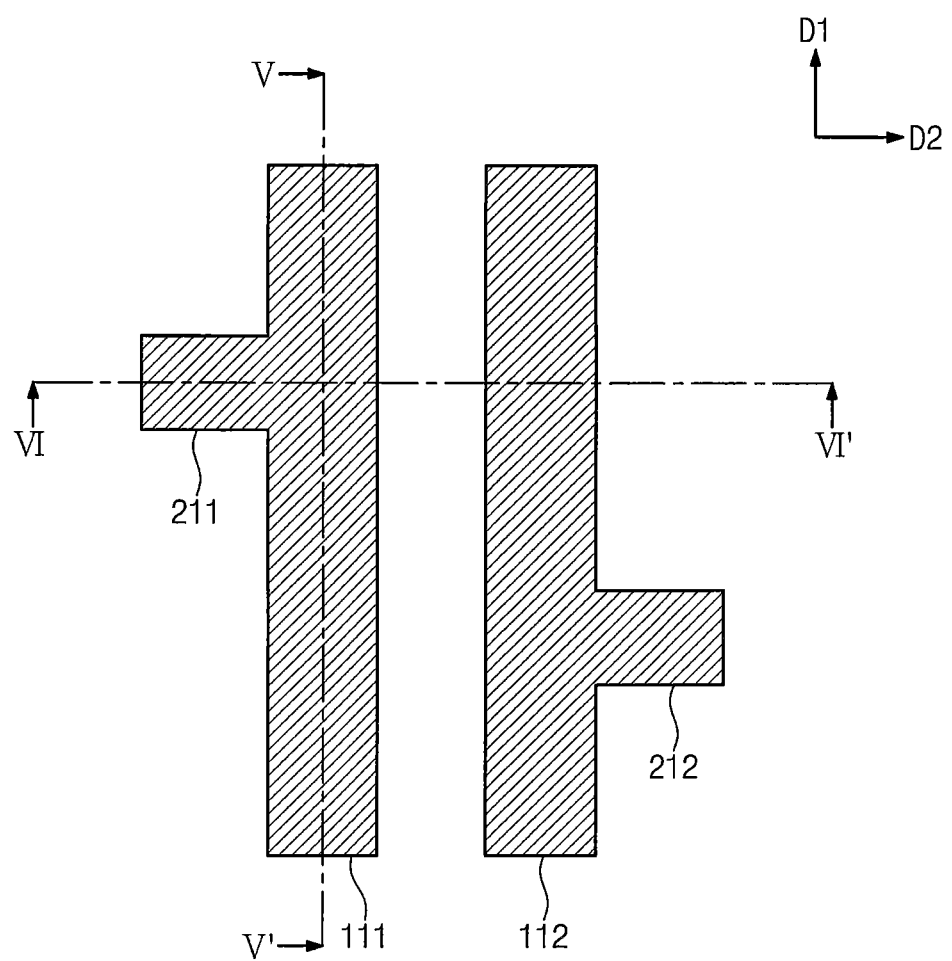
FIGS. 15A and 16A are plan views illustrating methods of manufacturing an SRAM cell according to embodiments of the inventive concept.
Figure 15B:
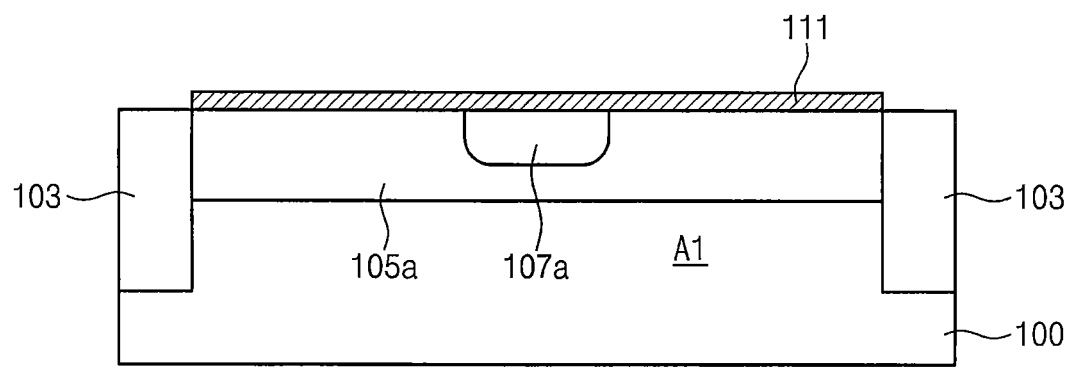
FIGS. 15B and 16B are cross-sectional views taken along lines V-V' of FIGS. 15A and 16A, respectively.
Figure 15C:
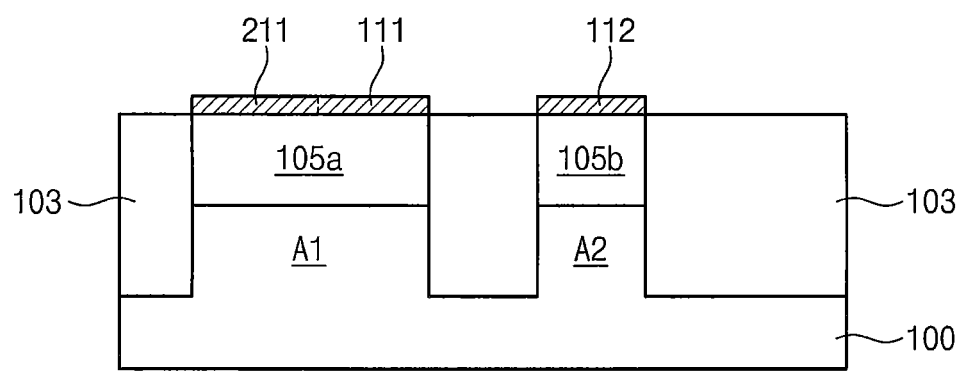
FIGS. 15C and 16C are cross-sectional views taken along lines VI-VI' of FIGS. 15A and 16A, respectively.
Figure 16A:
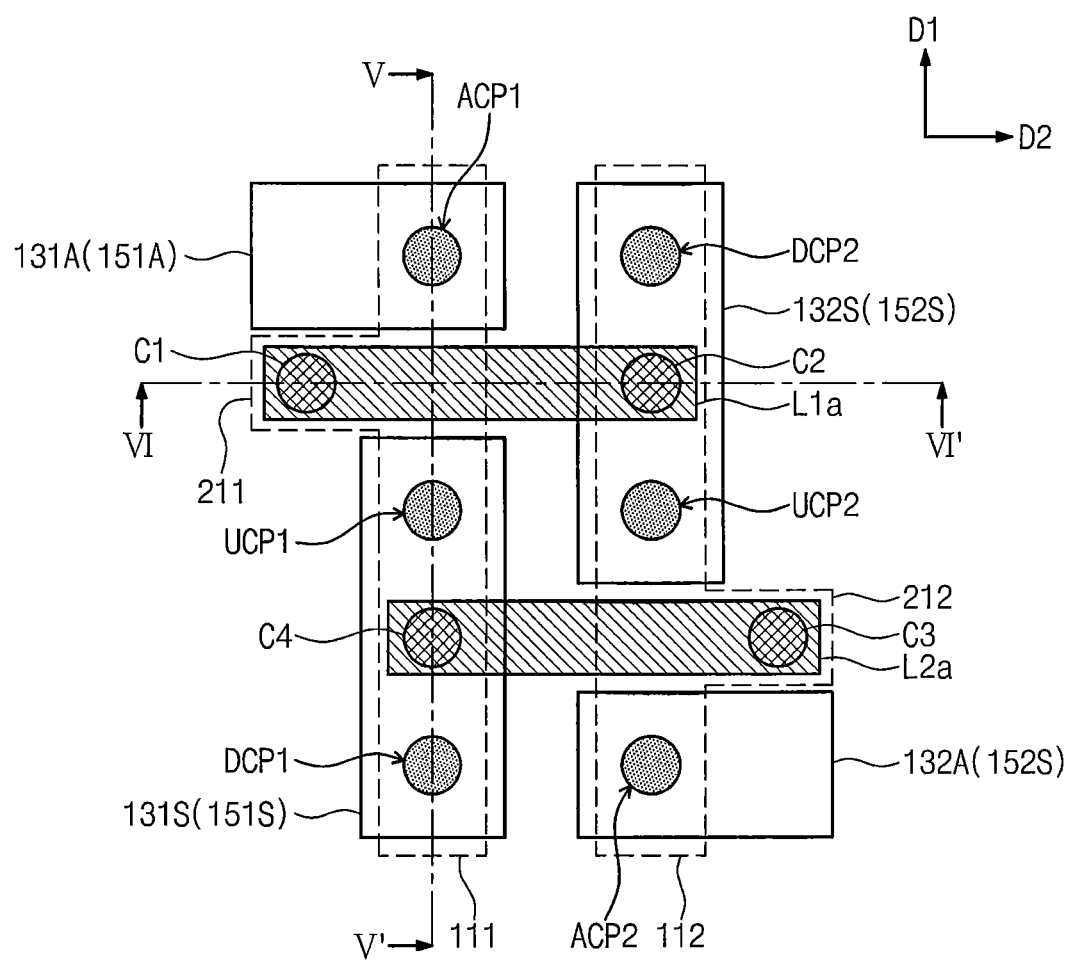
Figure 16B:
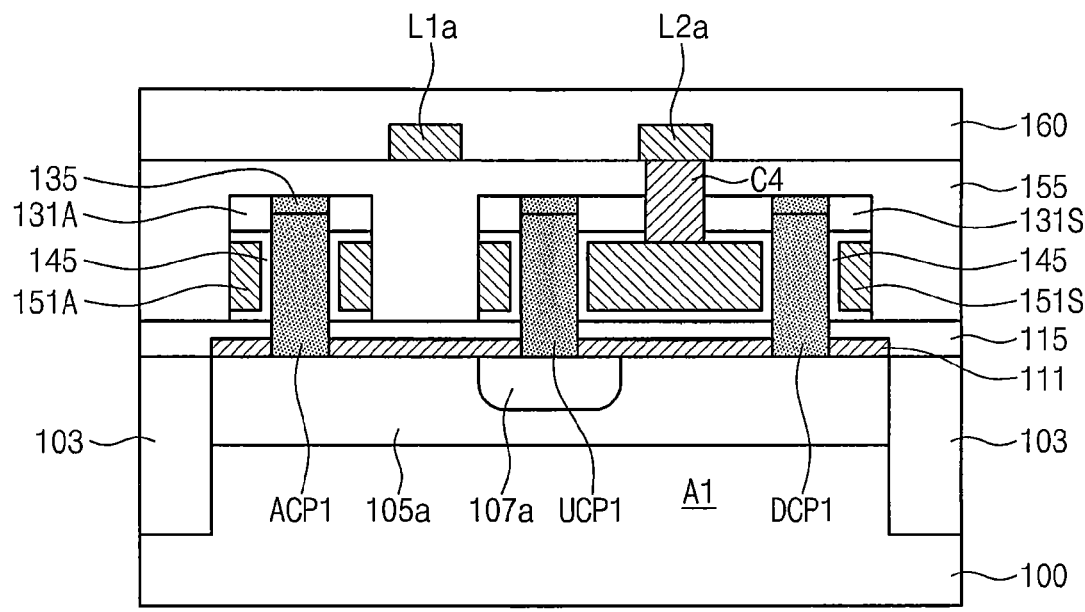
Figure 16C:
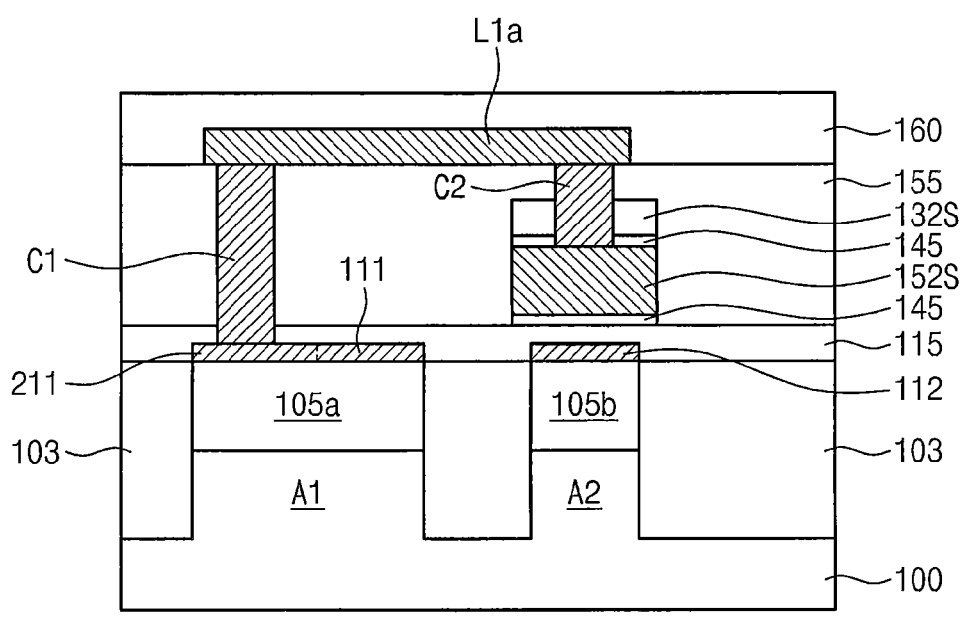

FIGS. 15A and 16A are plan views illustrating methods of manufacturing an SRAM cell according to embodiments of the inventive concept. FIGS. 15B and 16B are cross-sectional views taken along lines V-V' of FIGS. 15A and 16A, respectively. FIGS. 15C and 16C are cross-sectional views taken along lines VI-VI' of FIGS. 15A and 16A, respectively.

Referring to FIGS. 15A, 15B, and 15C, the first node electrode 111 and the second node electrode 112 may be formed on the first active portion A1 and the second active portion A2, respectively. At this time, first and second node extensions 211 and 212 may also be formed. The first and second node extensions 211 and 212 may extend from the first and second node electrodes 111 and 112, respectively.

Unlike the node extensions 111$c$ and 112$c$ of FIGS. 2A to 2E, the first and second node extensions 211 and 212 of the present embodiment are not arranged in the second direction D2 when viewed from a plan view. For example, the first node extension 211 may be offset from a line, which passes through a center of the second node extension 212 and extends in the second direction D2, in the first direction D1.

Referring to FIGS. 16A, 16B, and 16C, the lower insulating layer 115 may be formed to cover the node electrodes 111 and 112 and the node extensions 211 and 211. Next, the vertical channel portions ACP1, UCP1, DCP1, ACP2, UCP2 and DCP2, the capping patterns 131A, 131S, 132A and 132S, and the gates 151A, 151S, 152A and 152S may be formed by the same method as described with reference to FIGS. 3A to 7A, 3B to 7B, 3C to 7C, 3D to 7D, and 3E to 7E.

The first interlayer insulating layer 155 may be formed on the substrate 100. First to fourth contact plugs C1, C2, C3 and C4 may be formed to be connected to the first node extension 211, the second shared gate 152S, the second node extension 212, and the first shared gate 151S, respectively. At this time, the first and second contact plugs C1 and C2 may be aligned with each other in the second direction D2 due to the position of the first node extension 211, as illustrated in FIG. 16A. Additionally, the third and fourth contact plugs C3 and C4 may be aligned with each other in the second direction D2 due to the position of the second node extension 212.

First and second local interconnections L1a and L2a may be formed on the first interlayer insulating layer 155. The first local interconnection L1a is connected to the first and second contact plugs C1 and C2, and the second local interconnection L2a is connected to the third and fourth contact plugs C3 and C4. The first and second local interconnections L1a and L2a may have bar-shapes extending in the second direction D2. As a result, the positions of the first and second node extensions 211 and 212 may be controlled such that the first and second local interconnections L1a and L2a may have the bar-shapes.

The second interlayer insulating layer 160 may be formed on the local interconnections L1a and L2a and the first interlayer insulating layer 155. Thereafter, the subsequent processes described with reference to FIGS. 9A to 9E, 10A to 10E, and 11A to 11E may be performed to manufacture an SRAM cell illustrated in FIGS. 17A, 17B, and 17C.

According to the method of manufacturing the SRAM cell in the present embodiment, the positions of the first and second node extensions 211 and 212 may be controlled such that the first and second local interconnections L1a and L2a may have desired shapes.

Figure 17A:
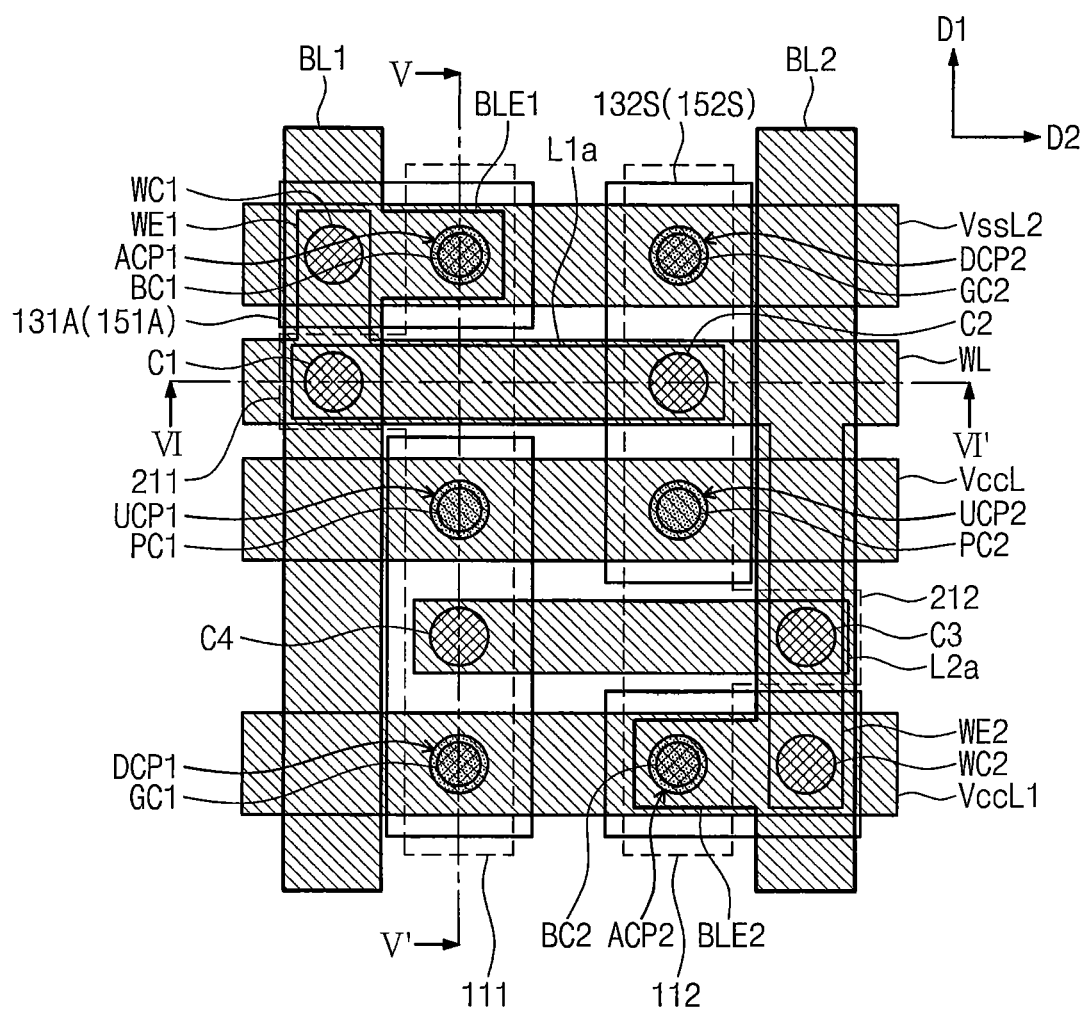
FIG. 17A is a plan view illustrating of SRAM cell according to other embodiments of the inventive concepts.
Figure 17B:
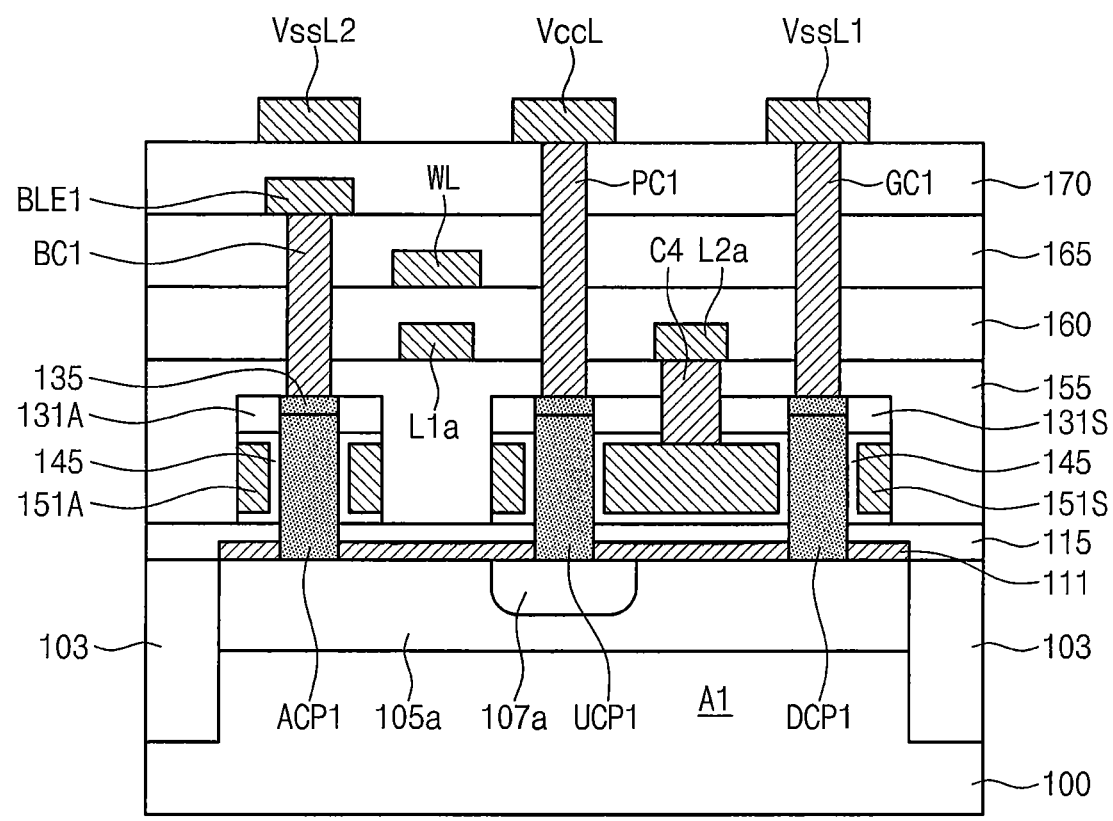
FIGS. 17B and 17C are cross-sectional views taken along lines V-V' and VI-VI' of FIG. 17A, respectively.
Figure 17C:
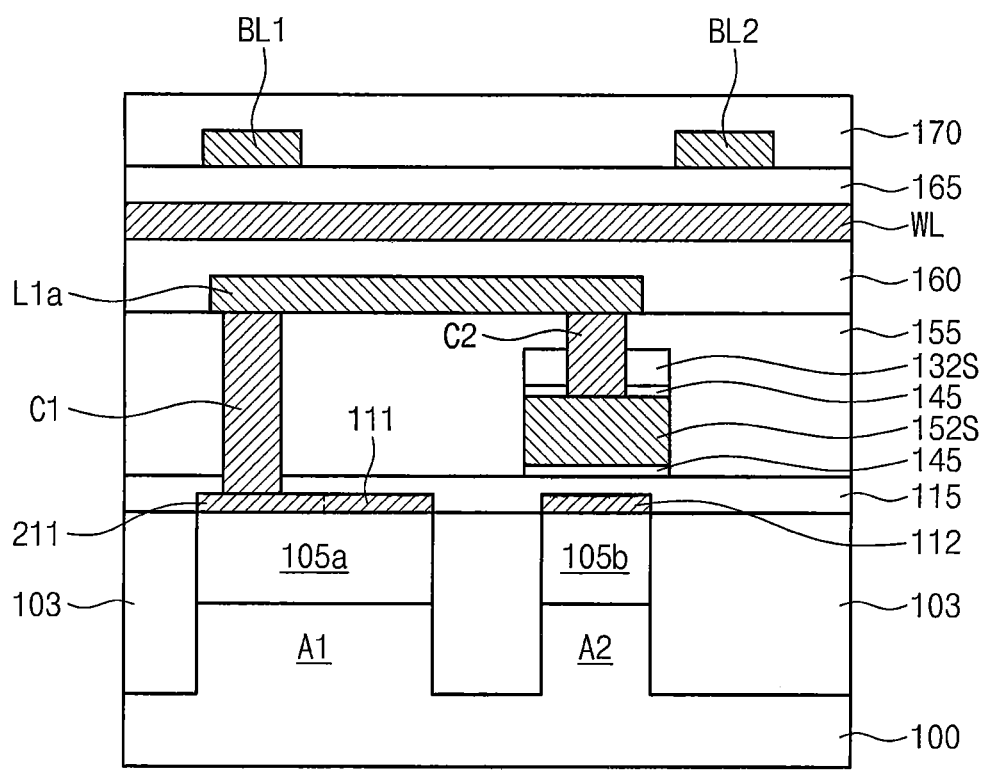
Figure 18A:
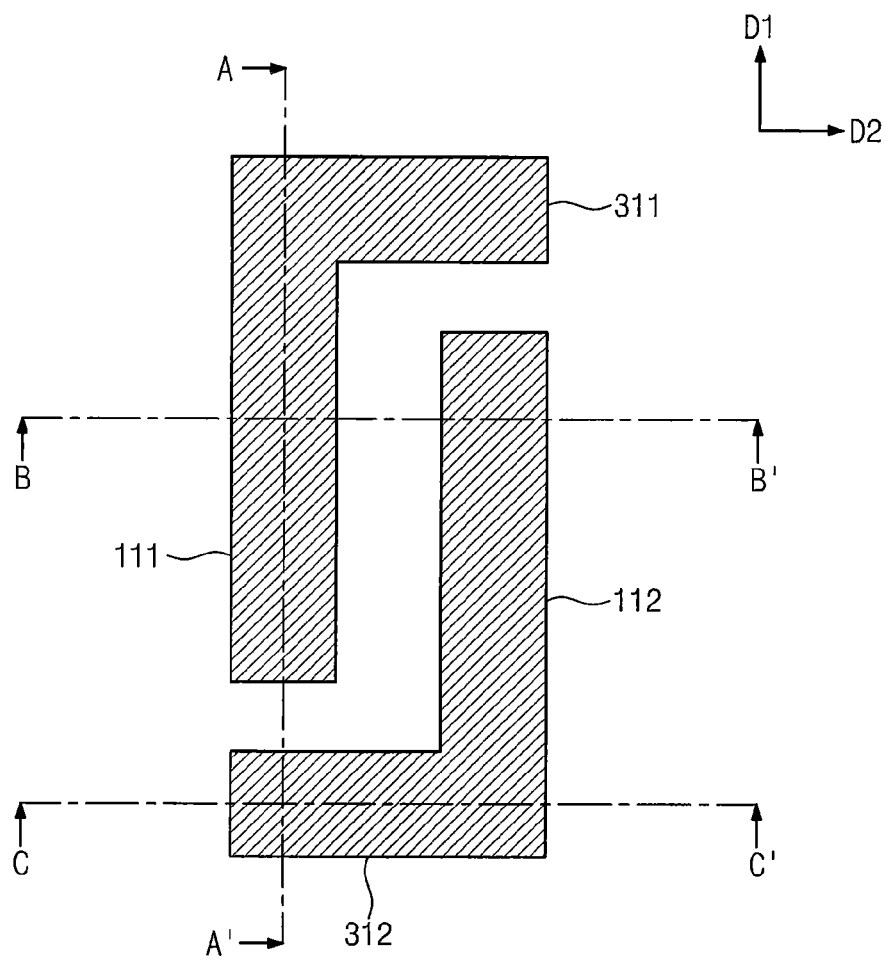
Figure 18B:
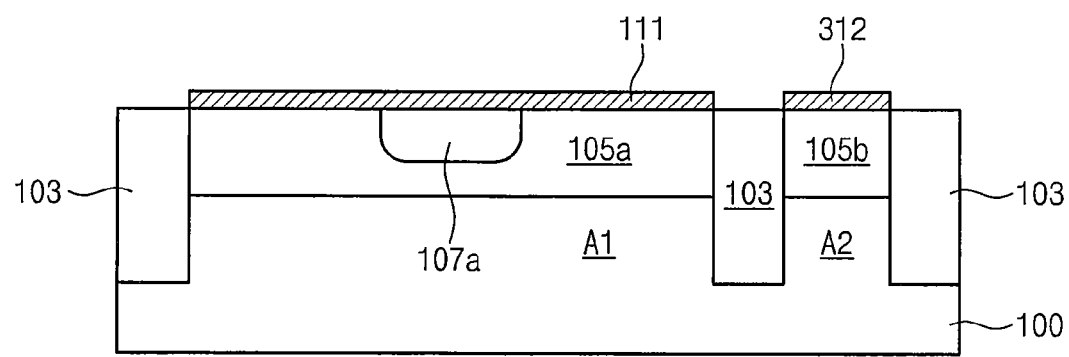
Figure 18C:
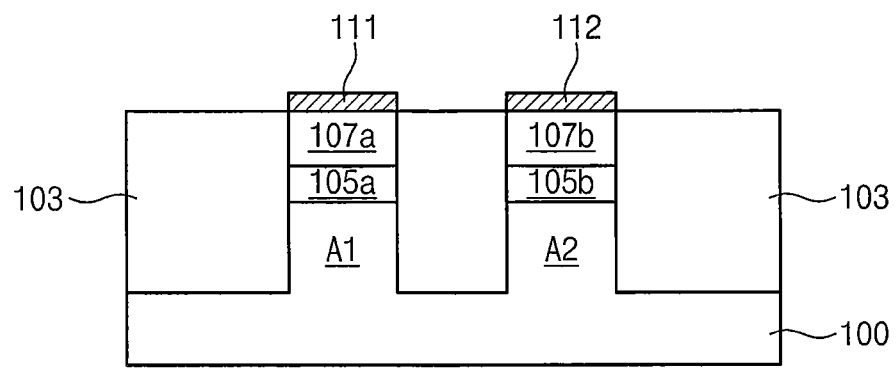
Figure 18D:
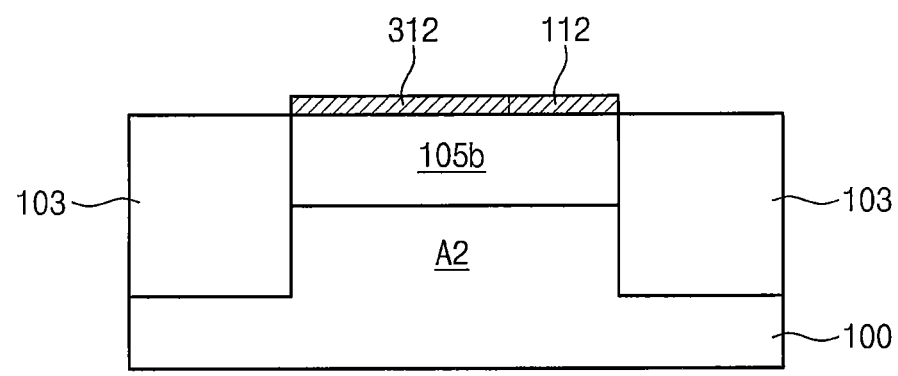

FIG. 17A is a plan view illustrating an SRAM cell according to some embodiments of the inventive concept. FIGS. 17B and 17C are cross-sectional views taken along lines V-V' and VI-VI' of FIG. 17A, respectively.

Referring to FIGS. 17A, 17B, and 17C, the first node extension 211 may be disposed to be aligned with the second contact plug C2 in the second direction D2. Thus, the first contact plug C1 connected to the first node extension 211 may be aligned with the second contact plug C2 in the second direction D2, and the first local interconnection L1a may have the bar-shape extending in the second direction D2.

Likewise, the second node extension 212 may be disposed to be aligned with the fourth contact plug C4 in the second direction D2. Thus, the third contact plug C3 connected to the second node extension 212 may be aligned with the fourth contact plug C4 in the second direction D2, and the second local interconnection L2a may have the bar-shape extending in the second direction D2.

The other elements of the SRAM cell according to the present embodiment may be the same as corresponding elements of the SRAM cell illustrated in FIGS. 11A to 11F.

The features of the modified embodiments of FIGS. 12, 13, 14A, and 14B may also be applied to the SRAM cell according to the present embodiment of FIGS. 17A to 17C.

FIGS. 18A to 21A are plan views illustrating methods of manufacturing an SRAM cell according to embodiments of the inventive concept. FIGS. 18B to 21B are cross-sectional views taken along lines A-A' of FIGS. 18A to 21A, respectively. FIGS. 18C to 21C are cross-sectional views taken along lines B-B' of FIGS. 18A to 21A, respectively. FIGS. 18D to 21D are cross-sectional views taken along lines C-C' of FIGS. 18A to 21A, respectively.

Referring to FIGS. 18A, 18B, 18C, and 181D, first and second node electrodes 111 and 112 may have bar-shapes extending in the first direction D1 when viewed from a plan view. The first and second node electrodes 111 and 112 are spaced apart from each other in the second direction D2. The first node electrode 111 includes a first edge region, a central region, and a second edge region which are arranged in the first direction D1. The second node electrode 112 includes a first edge region, a central region, and a second edge region which are arranged in the first direction D1. The central region of the first node electrode 111 may be aligned with the second edge region of the second node electrode 112 along the second direction D2.

A first node extension 311 may laterally extend from the second edge region of the first node electrode 111. The first node extension 311 may be adjacent to the second edge region of the second node electrode 112. A portion of the first node extension 311 may be aligned with the second node electrode 112 in the first direction D1.

A second node extension 312 may laterally extend from the first edge region of the second node electrode 112. The second node extension 312 may be adjacent to the first edge region of the first node electrode 111. A portion of the second node extension 312 may be aligned with the first node electrode 111 in the first direction D1.

In the present embodiment, the first P-type dopant region 107a may be disposed under the central region of the first node electrode 111, and the second P-type dopant region 107b may be disposed under the second edge region of the second node electrode 112. Thus, the first and second P-type dopant region 107b may be aligned with each other in the second direction D2.

Referring to FIGS. 19A, 19B, 19C, and 19D, the lower insulating layer 115 may be formed to cover the first and second node electrodes 111 and 112 and the first and second node extensions 311 and 312. Next, the vertical channel portions ACP1, UCP1, DCP1, ACP2, UCP2 and DCP2, the capping patterns 131A, 131S, 132A and 132S, and the gates 151A, 151S, 152A and 152S may be formed by the same method as described with reference to FIGS. 3A to 7A, 3B to 7B, 3C to 7C, 3D to 7D, and 3E to 7E.

Figure 19A:
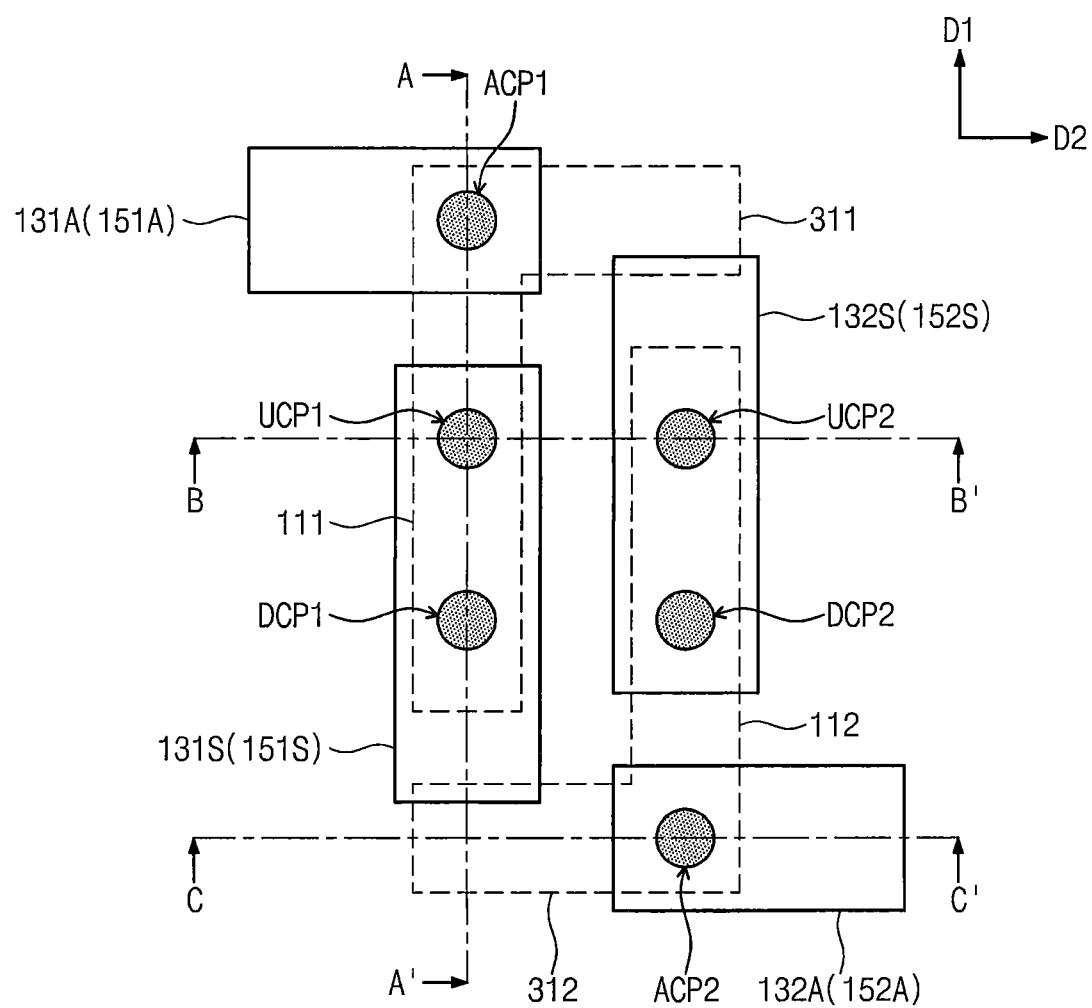
Figure 19B:
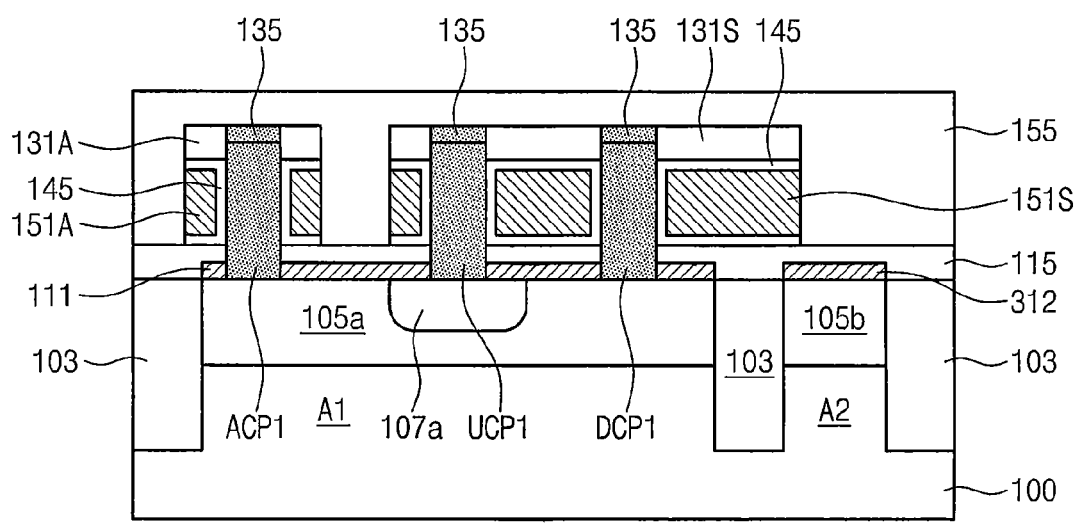
Figure 19C:
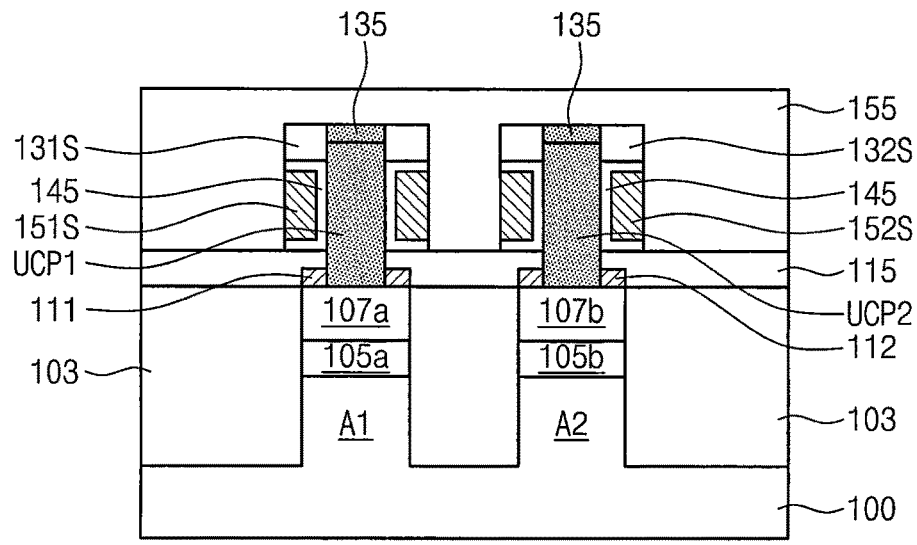
Figure 19D:
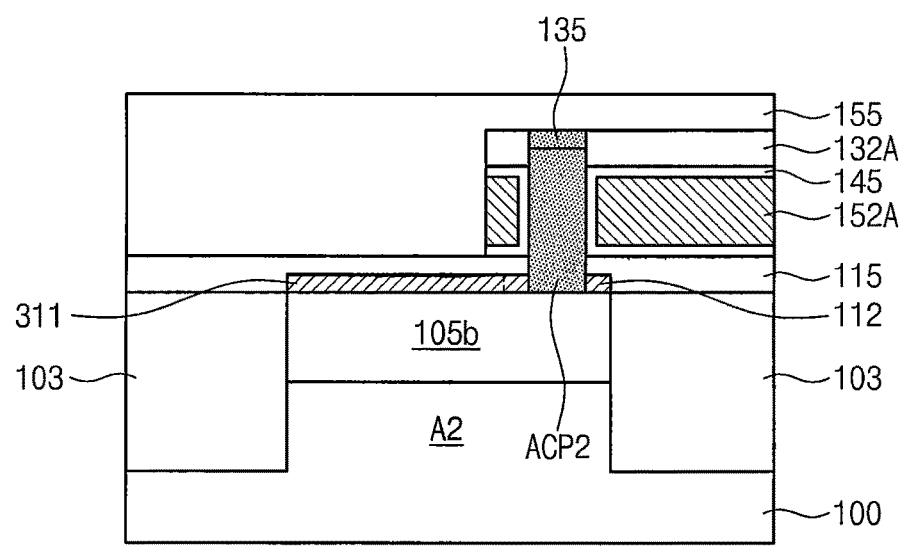
Figure 20A:
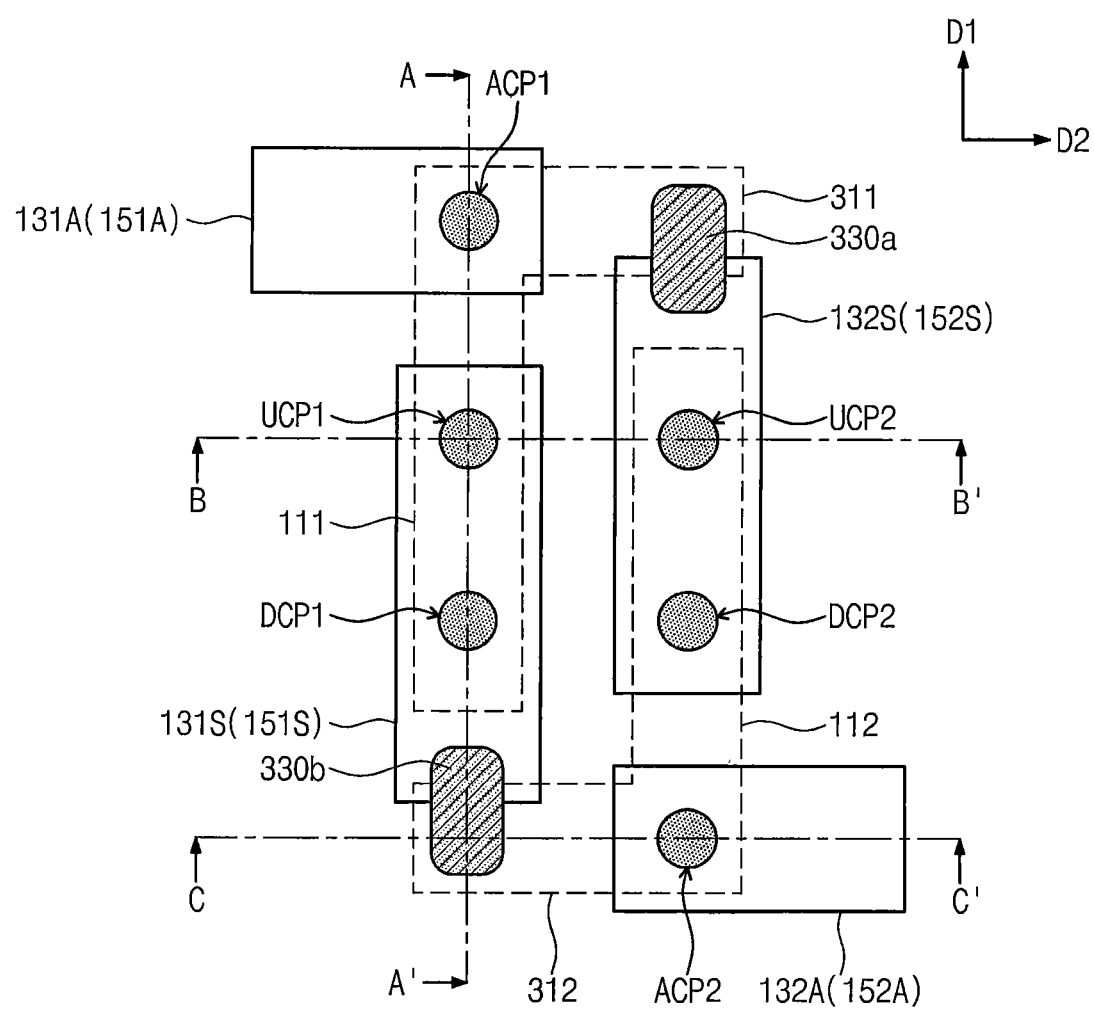
Figure 20B:
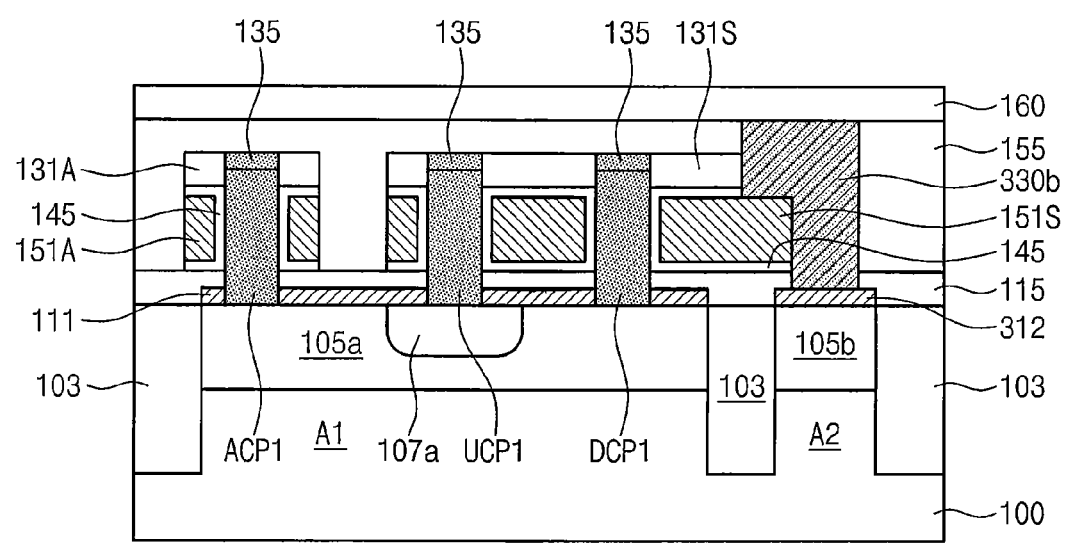
Figure 20C:
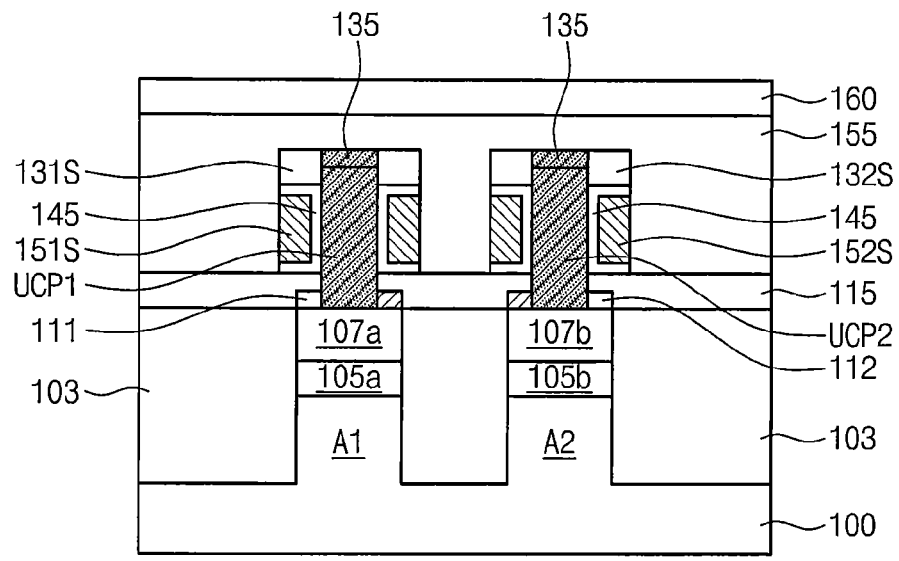
Figure 20D:
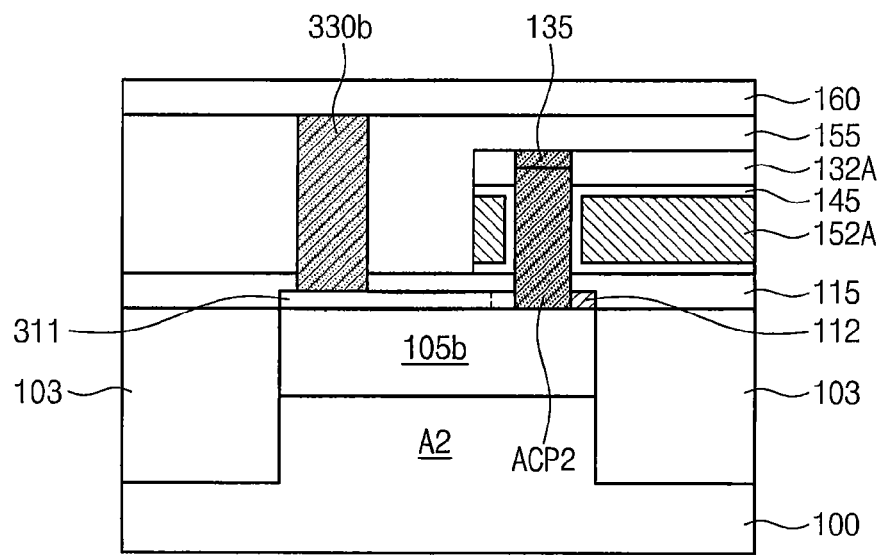
Figure 21A:
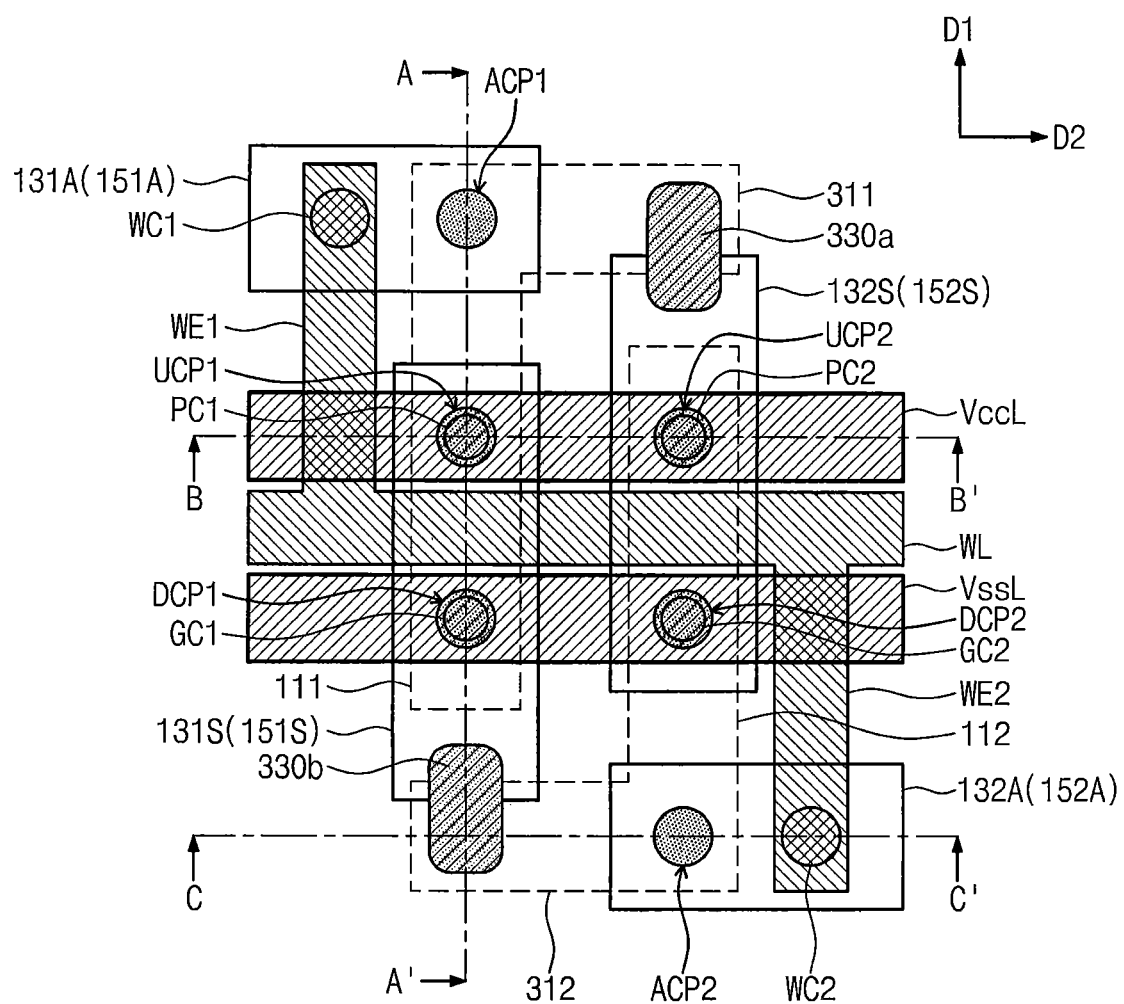
Figure 21B:
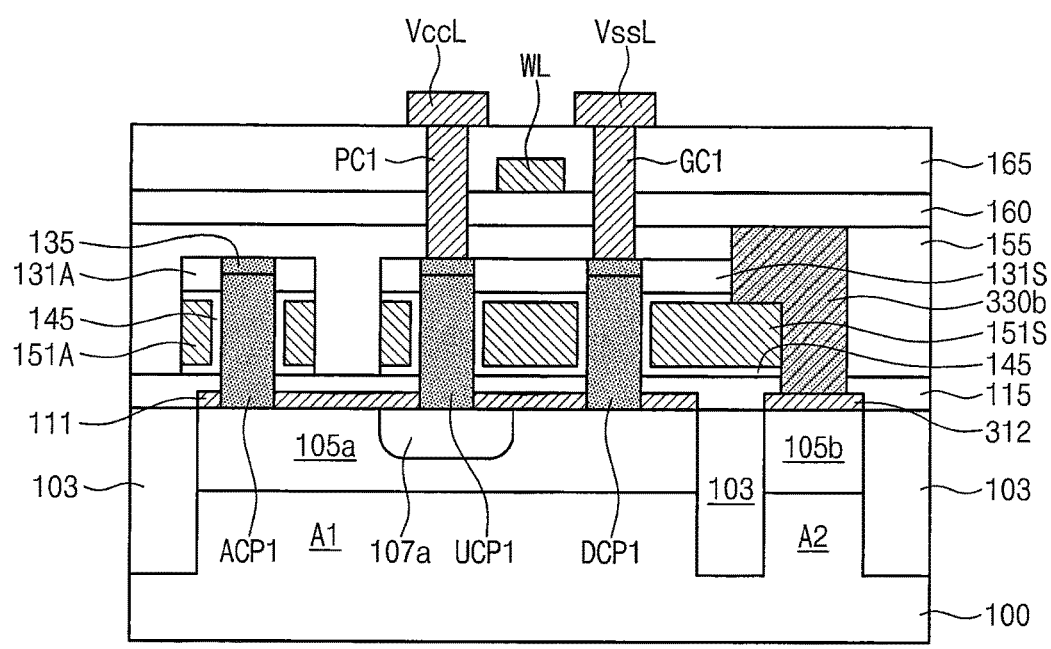
Figure 21C:
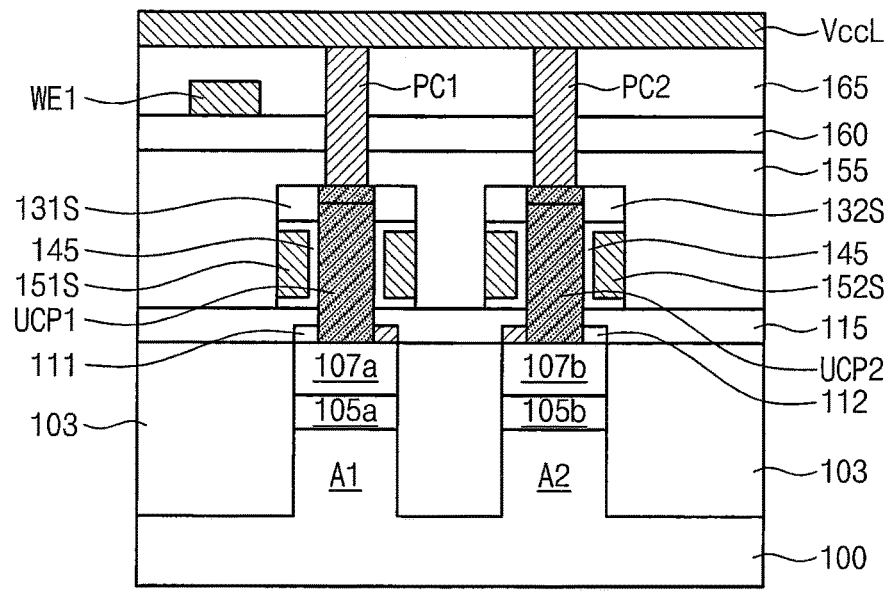
Figure 21D:
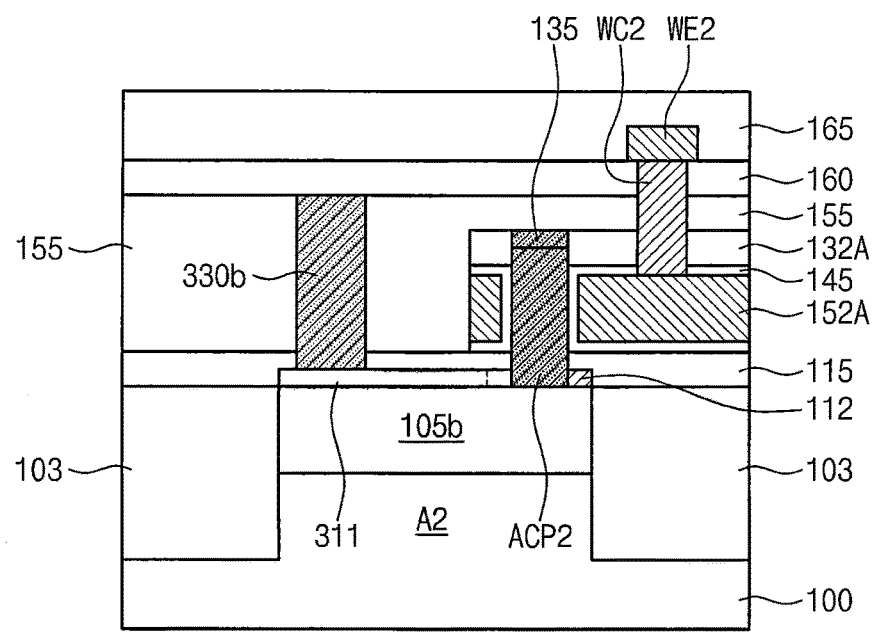

As illustrated in FIG. 19A, first ends of the first shared gate 151S and the first shared capping pattern 131S are adjacent to the second node extension 312. In some embodiments, the first ends of the first shared gate 151S and the first shared capping pattern 131S may overlap with a portion of the second node extension 312. Likewise, the first ends of the second shared gate 152S and the second shared capping pattern 132S are adjacent to the first node extension 311. In some embodiments, the first ends of the second shared gate 152S and the second shared capping pattern 132S may overlap with a portion of the first node extension 311.

As illustrated in FIG. 19A, due to the positions of the node electrodes 111 and 112 and the node extensions 311 and 312, the first pull-up vertical channel portion UCP1 may be disposed between the first access vertical channel portion ACP1 and the first pull-down vertical channel portion DCP1, but the second pull-down vertical channel portion DCP2 may be disposed between the second pull-up vertical channel portion UCP2 and the second access vertical channel portion ACP2. Thus, the first and second pull-up vertical channel portions UCP1 and UCP2 may be arranged in the second direction D2 , and the first and second pull-down vertical channel portions DCP1 and DCP2 may also be arranged in the second direction D2.

Next, the first interlayer insulating layer 155 may be formed on the substrate 100.

Referring to FIGS. 20A, 20B, 20C, and 20D, the first interlayer insulating layer 155, the shared capping patterns 131S and 132S, the gate dielectric layer 145, and the lower insulating layer 115 may be successively patterned to form first and second local connecting contact holes. At this time, the shared gates 151S and 152S and the node extensions 311 and 312 may be used as an etch stop layer. The first local connecting contact hole may expose the first node extension 311 and the second shared gate 152S. The second local connecting contact hole may expose the second node extension 312 and the first shared gate 151S.

A conductive layer may be formed to fill the first and second local connecting contact holes. The conductive layer may be planarized until the first interlayer insulating layer 155 is exposed, thereby forming first and second local interconnection contact plugs 330a and 330b. The first local interconnection contact plug 330a may be in contact with the first node extension 311 and the second shared gate 152S, and the second local interconnection contact plug 330b may be in contact with the second node extension 312 and the first shared gate 151S. As a result, the first node electrode 111 is electrically connected to the second shared gate 152S through the first local interconnection contact plug 330a, and the second node electrode 112 is electrically connected to the first shared gate 151S through the second local interconnection contact plug 330b. Thus, a latch structure of the SRAM cell may be realized.

The second interlayer insulating layer 160 may be formed on the local interconnection contact plugs 330a and 330b and the first interlayer insulating layer 155.

Referring to FIGS. 21A, 21B, 21C, and 21D, first and second word line contact plugs WC1 and WC2 may be formed to contact the first and second access gates 151A and 152A, respectively. A word line WL and word line extensions WE1 and WE2 may be formed on the second interlayer insulating layer 160. A first word line extension WE1 may extend from the word line WL to contact a top surface of the first word line contact plug WC1, and a second word line extension WE2 may extend from the word line to contact a top surface of the second word line contact plug WC2. Thus, the first and second access gates 151A and 152A may be electrically connected to the word line WL. The word line WL may extend in the second direction D2.

The third interlayer insulating layer 165 may be formed on the word line WL and the second interlayer insulating layer 160. First and second ground contact plugs GC1 and GC2 and first and second power contact plugs PC1 and PC2 may be formed to penetrate the third, second and first interlayer insulating layers 165, 160 and 155. The first and second ground contact plugs GC1 and GC2 may be electrically connected to top ends of the first and second pull-down vertical channel portions DCP1 and DCP2, respectively. The first and second power contact plugs PC1 and PC2 may be electrically connected to top ends of the first and second pull-up vertical channel portions UCP1 and UCP2, respectively.

A power line VccL and a ground line VssL may be formed on the third interlayer insulating layer 165. The power line VssL may be connected to the first and second power contact plugs PC1 and PC2, and the ground line VssL may be connected to the first and second ground contact plugs GC1 and GC2. The power and ground lines VccL and VssL may extend in parallel along the second direction D2.

Next, a fourth interlayer insulating layer 107, bit line contact plugs BC1 and BC2 and bit lines BL1 and BL2 of FIGS. 22A to 22D may be formed to manufacture the SRAM cell illustrated in FIGS. 22A to 22D.

According to the present embodiment, the positions of the node electrodes 111 and 112 and the node extensions 311 and 312 may be controlled, so that electrical connection of the nodes may be completed using the first and second local interconnection contact plugs 330a and 330b instead of the local interconnections of the embodiments described above. Thus, an occupied area of the SRAM cell may be reduced.

Figure 22A:
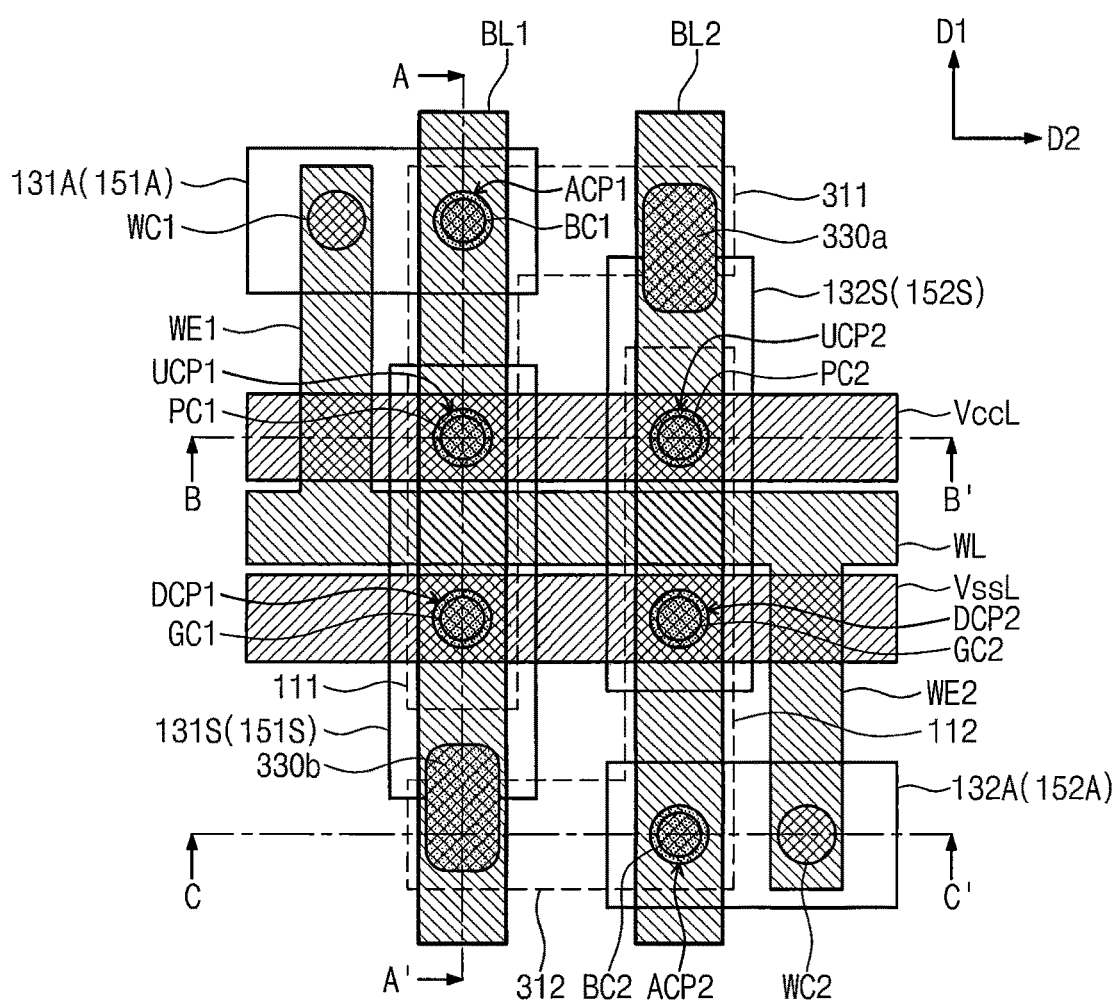
FIG. 22A is a plan view illustrating a SRAM cell according to embodiments of the inventive concept.
Figure 22B:
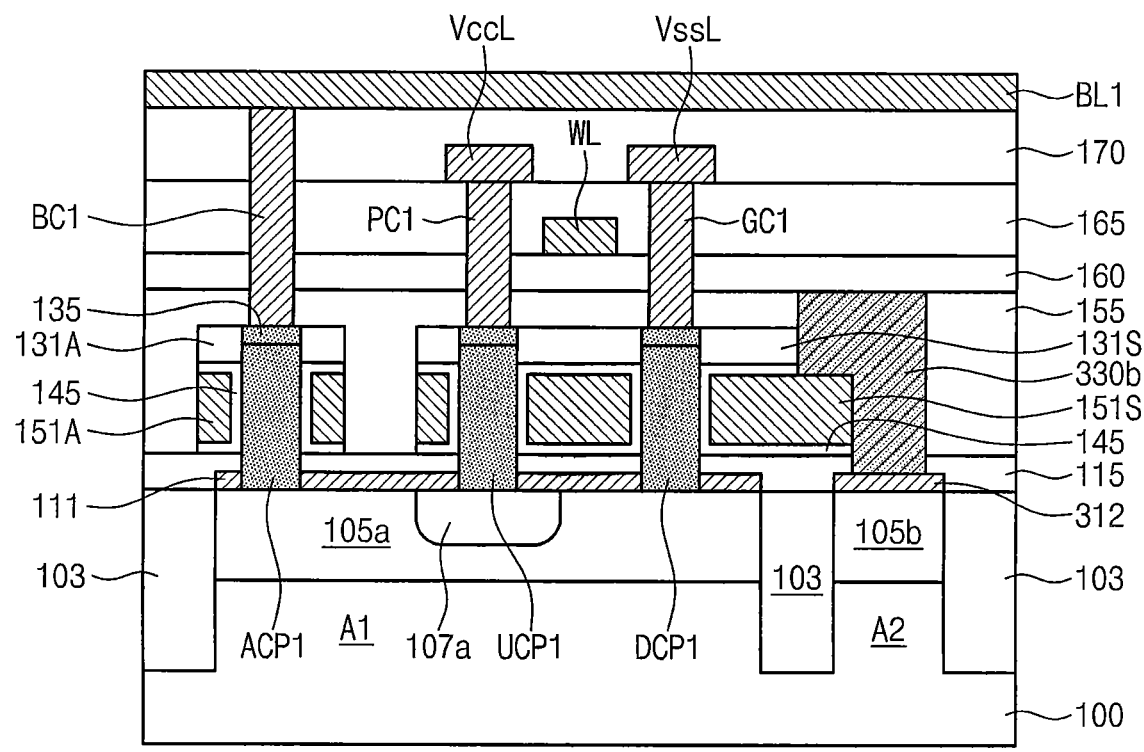
FIGS. 22B, 22C, and 22D are cross-sectional views taken along lines A-A', B-B', and C-C' of FIG. 22A, respectively.
Figure 22C:
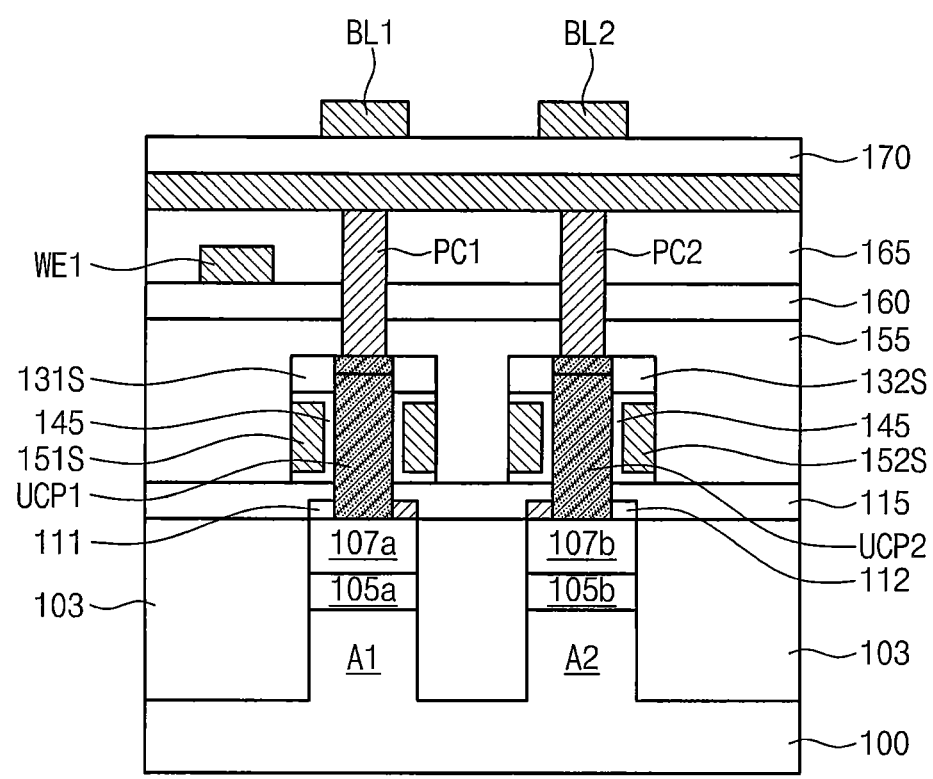
Figure 22D:
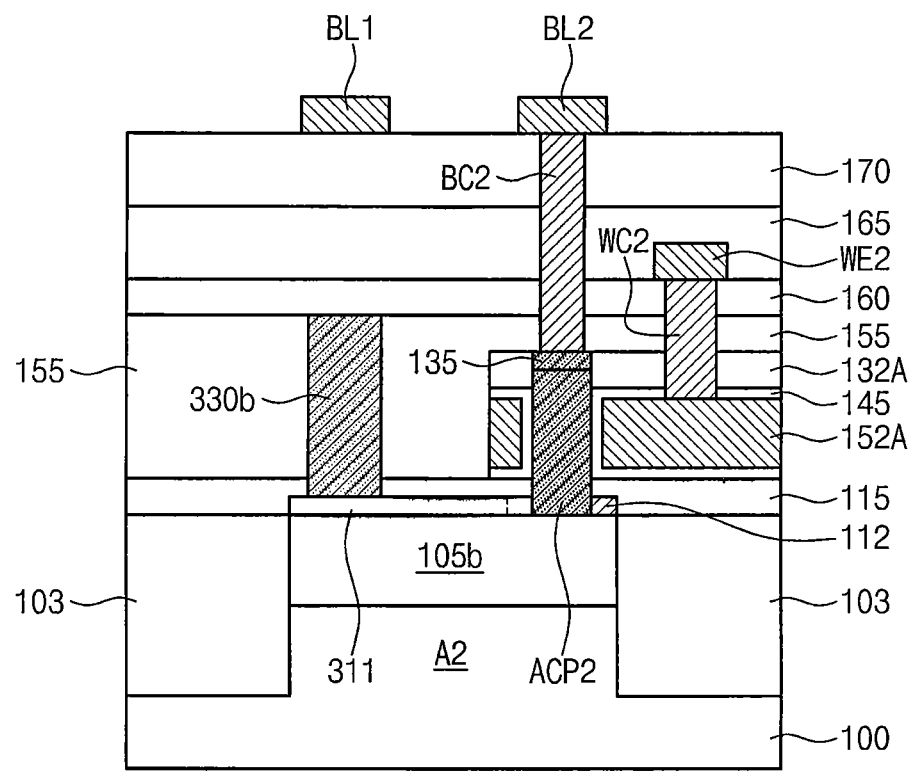

FIG. 22A is a plan view illustrating an SRAM cell according to still other embodiments of the inventive concepts. FIGS. 22B, 22C, and 22D are cross-sectional views taken along lines A-A', B-B', and C-C' of FIG. 22A, respectively.

Referring to FIGS. 22A, 22B, 22C, and 22D, the node electrodes 111 and 112 may be disposed on the active portions A1 and A2, respectively. The first and second node extensions 311 and 312 may laterally extend from the first and second node electrodes 111 and 112, respectively. The node electrodes 111 and 112 and the node extensions 311 and 312 are the same as described with reference to FIGS. 18A to 18D.

The lower insulating layer 115 covers the node electrodes 111 and 112 and the node extensions 311 and 312. The gates 151A, 151S, 152A and 152S may be disposed on the lower insulating layer 115. The capping patterns 131A, 131S, 132A and 132S may be disposed on the gates 151A, 151S, 152A and 152S, respectively. The vertical channel portions ACP1, UCP1, DCP1, ACP2, UCP2 and DCP2 may penetrate the capping patterns 131A, 131S, 132A and 132S, the gates 151A, 151S, 152A and 152S, the lower insulating layer 115 and the node electrodes 111 and 112, so as to be in contact with the active portions A1 and A2.

As described with reference to FIGS. 19A to 19D, the first and second pull-up vertical channel portions UCP1 and UCP2 may be aligned with each other in the second direction D2 , and the first and second pull-down vertical channel portions DCP1 and DCP2 may also be aligned with each other in the second direction D2.

The first interlayer insulating layer 155 may cover the substrate 100. The first local interconnection contact plug 330a may penetrate the first interlayer insulating layer 155, the second shared capping pattern 132S, the gate dielectric layer 145 and the lower insulating layer 155. The first local interconnection contact plug 330a may be in direct contact with the first node extension 311 and the second shared gate 152S. The second local interconnection contact plug 330b may penetrate the first interlayer insulating layer 155, the first shared capping pattern 131S, the gate dielectric layer 145 and the lower insulating layer 155. The second local interconnection contact plug 330b may contact the second node extension 312 and the first shared gate 151S.

As a result, in the present embodiment, the positions of the node electrodes 111 and 112 and the node extensions 311 and 312 may be controlled, so that the electrical connection of the nodes may be completed using the first and second local interconnection contact plugs 330a and 330b. Thus, the occupied area of the SRAM cell may be reduced.

The second interlayer insulating layer 160 may be disposed on the first interlayer insulating layer 155 and the local interconnection contact plugs 330a and 330b, and the word line WL may be disposed on the second interlayer insulating layer 160. The word line WL may be electrically connected to the first and second access gates 151A and 152A through the first and second word line extensions WE1 and WE2 and the first and second word line contact plugs WC1 and WC2.

The third interlayer insulating layer 165 may be disposed on the second interlayer insulating layer 160 and the word line WL, and the power and ground lines VccL and VssL may be disposed on the third interlayer insulating layer 165. The power line VccL may be electrically connected to the top ends of the first and second pull-up vertical channel portions UCP1 and UCP2 through the first and second power contact plugs PC1 and PC2. The ground line VssL may be electrically connected to the top ends of the first and second pull-down vertical channel portions DCP1 and DCP2 through the first and second ground contact plugs GC1 and GC2.

The fourth interlayer insulating layer 170 may be disposed on the third interlayer insulating layer 165 and the power and ground lines VccL and VssL, and the first and second bit lines BL1 and BL2 may be disposed on the fourth interlayer insulating layer 170. The first and second bit lines BL1 and BL2 may extend in the first direction D1 to cross over the word line WL.

The first bit line BL1 may be electrically connected to the top end of the first access vertical channel portion ACP1 through the first bit line contact plug BC1 penetrating the fourth, third, second and first interlayer insulating layers 170, 165, 160 and 155. The second bit line BL2 may be electrically connected to the top end of the second access vertical channel portion ACP2 through the second bit line contact plug BC2 penetrating the fourth, third, second and first interlayer insulating layers 170, 165, 160 and 155. The first and second bit lines BL1 and BL2 may overlap with the first and second node electrodes 111 and 112, respectively. Thus, the occupied area of the SRAM cell may be reduced.

The inventive concepts are not limited to the vertical and horizontal positions of the lines WL, VccL, VssL, BL1 and BL2 according to the present embodiment. In the present embodiment, the vertical and horizontal positions of the lines WL, VccL, VssL, BL1 and BL2 may be variously modified.

Figure 23:
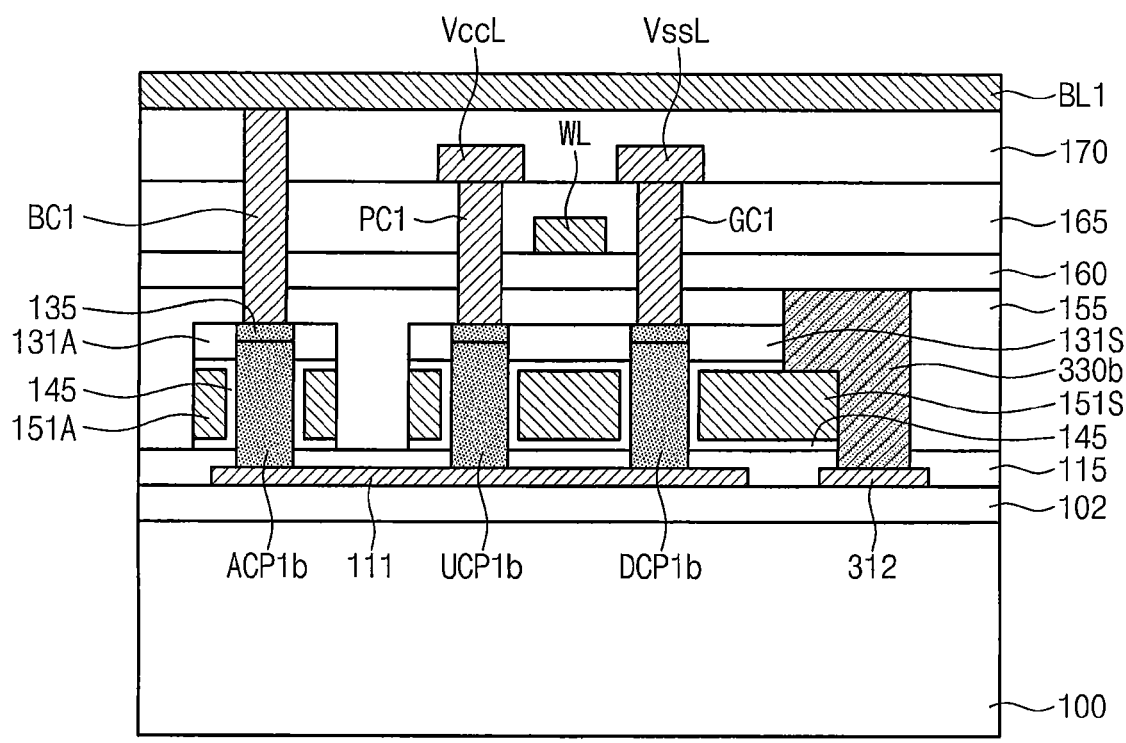
FIG. 23 is a cross-sectional view taken along a line A-A' to illustrate embodiments of an SRAM cell according to embodiments of the inventive concept.
Figure 24A:
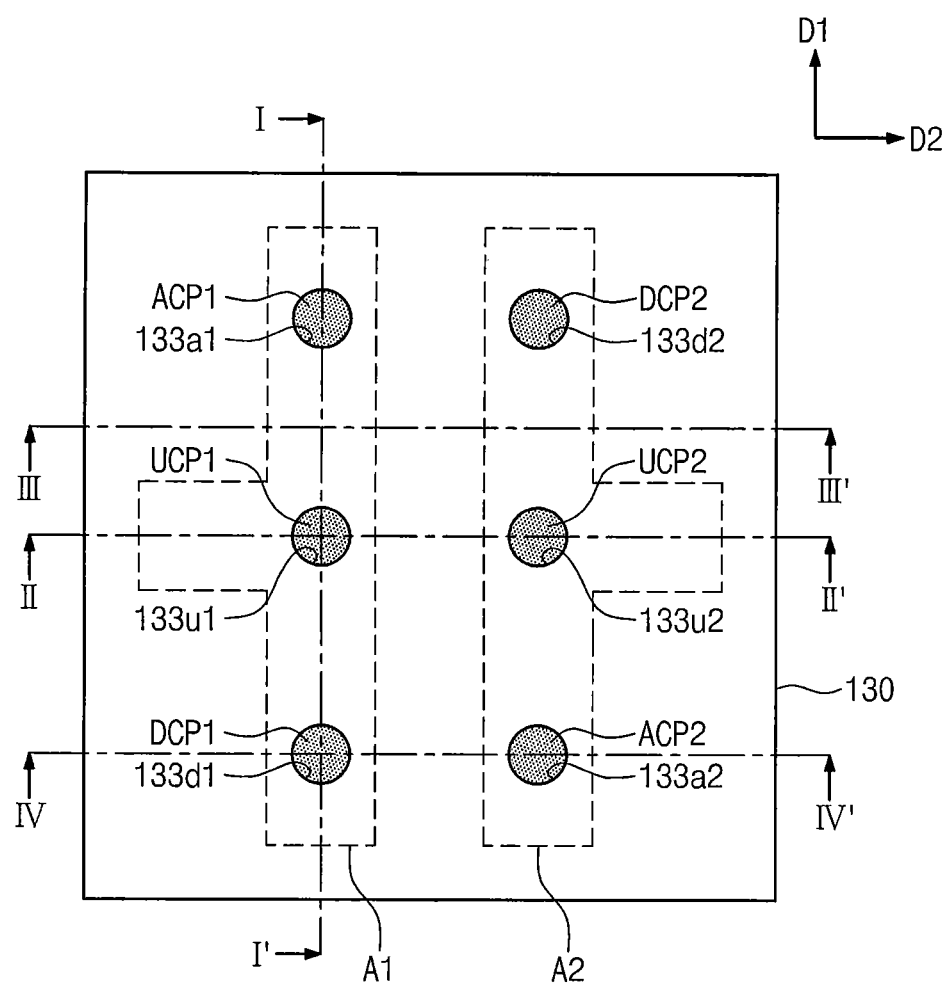
Figure 24B:
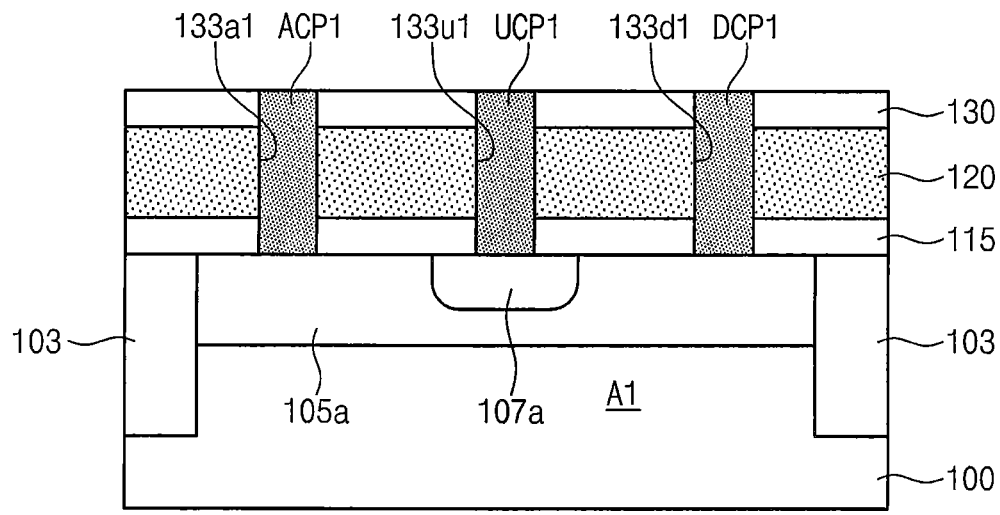
Figure 24C:
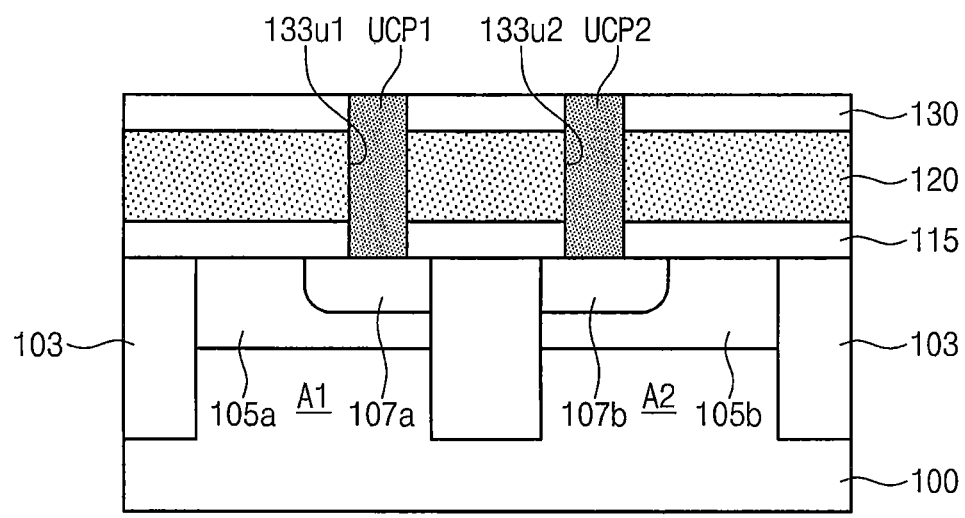
Figure 24D:
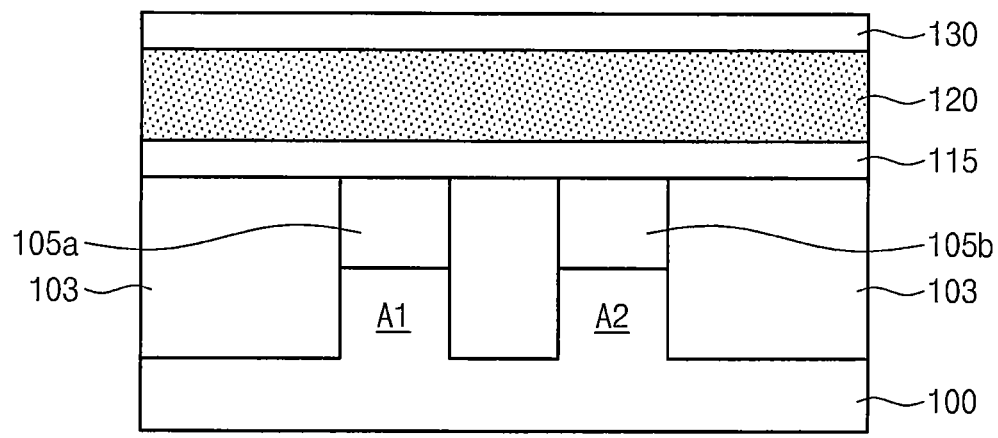
Figure 24E:
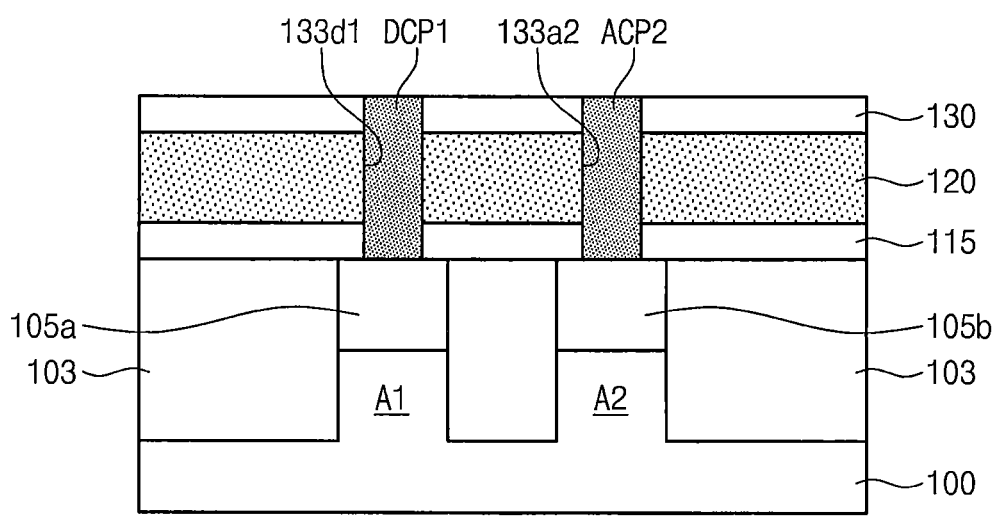
Figure 25A:
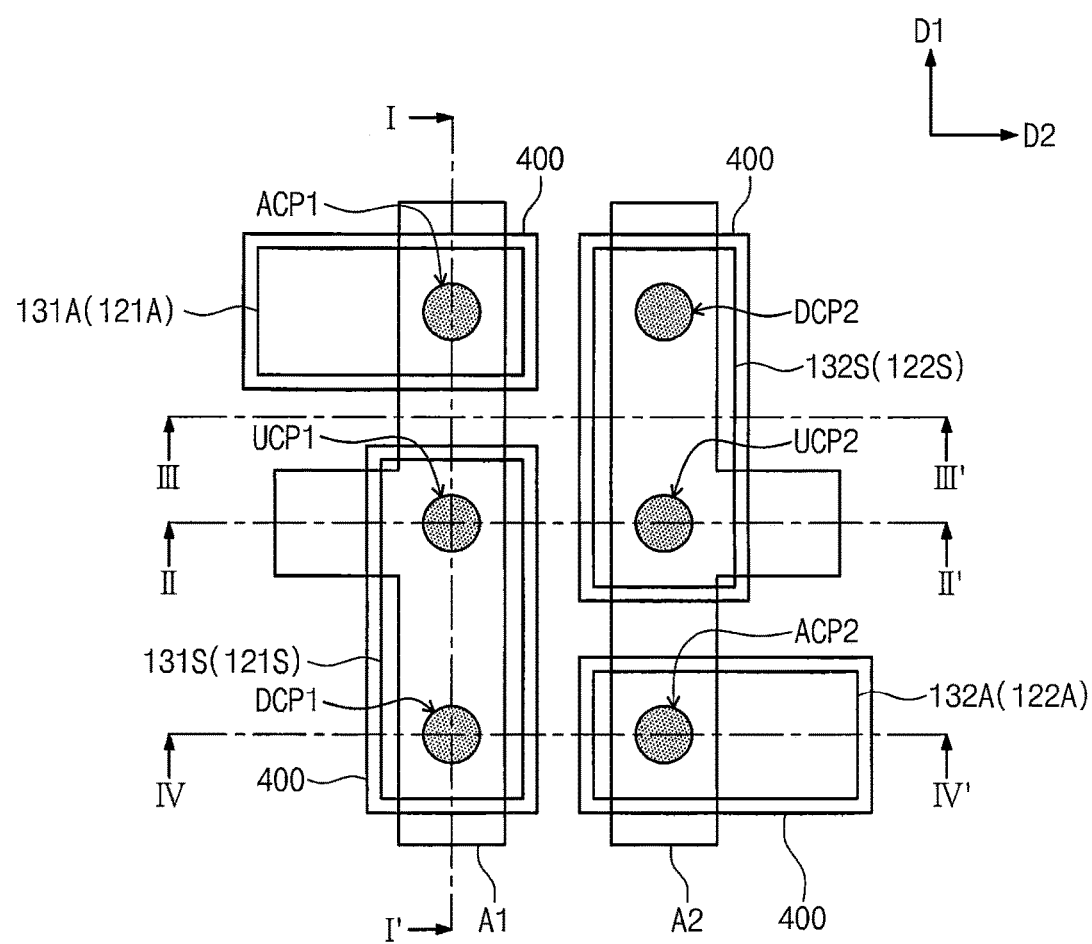
Figure 25B:
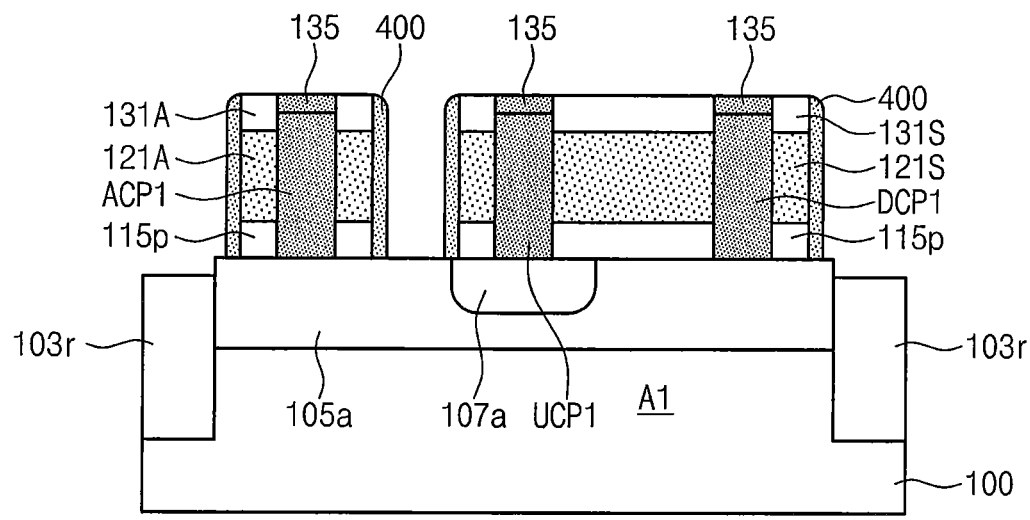
Figure 25C:
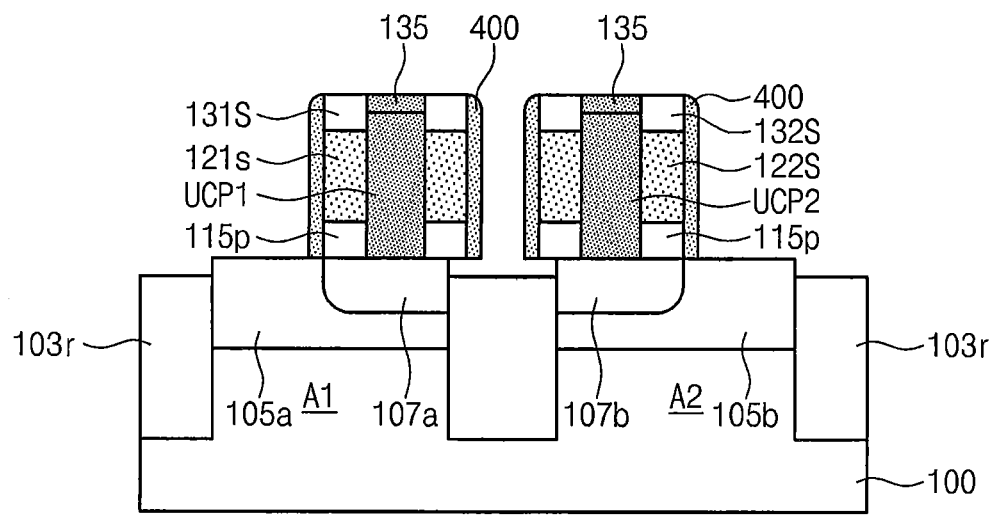
Figure 25D:
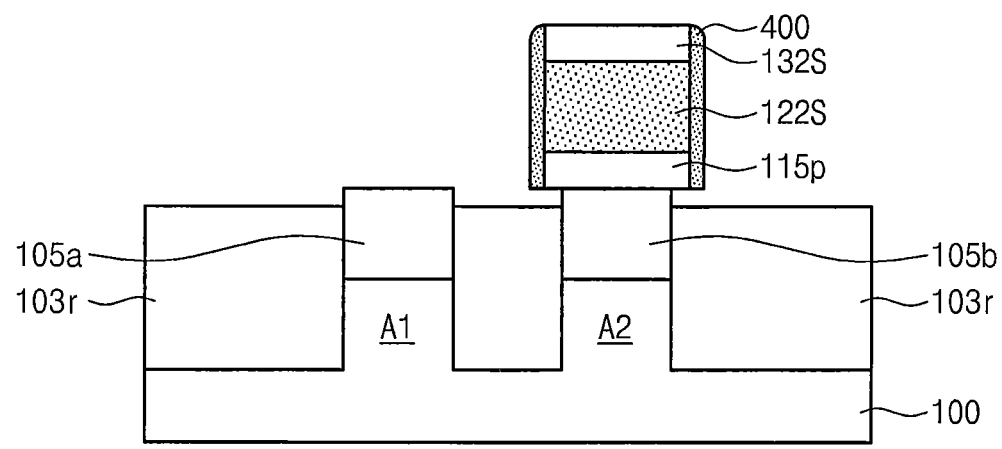
Figure 25E:
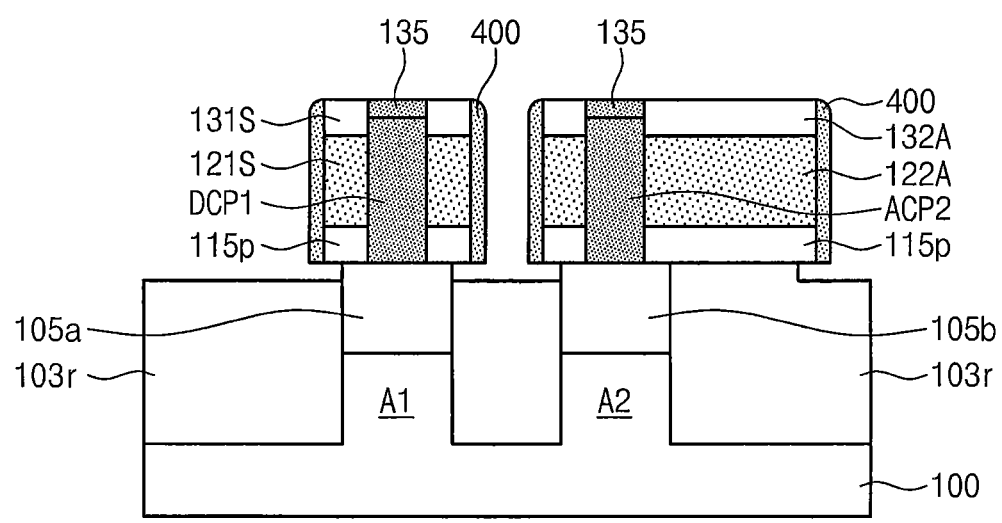
Figure 26A:
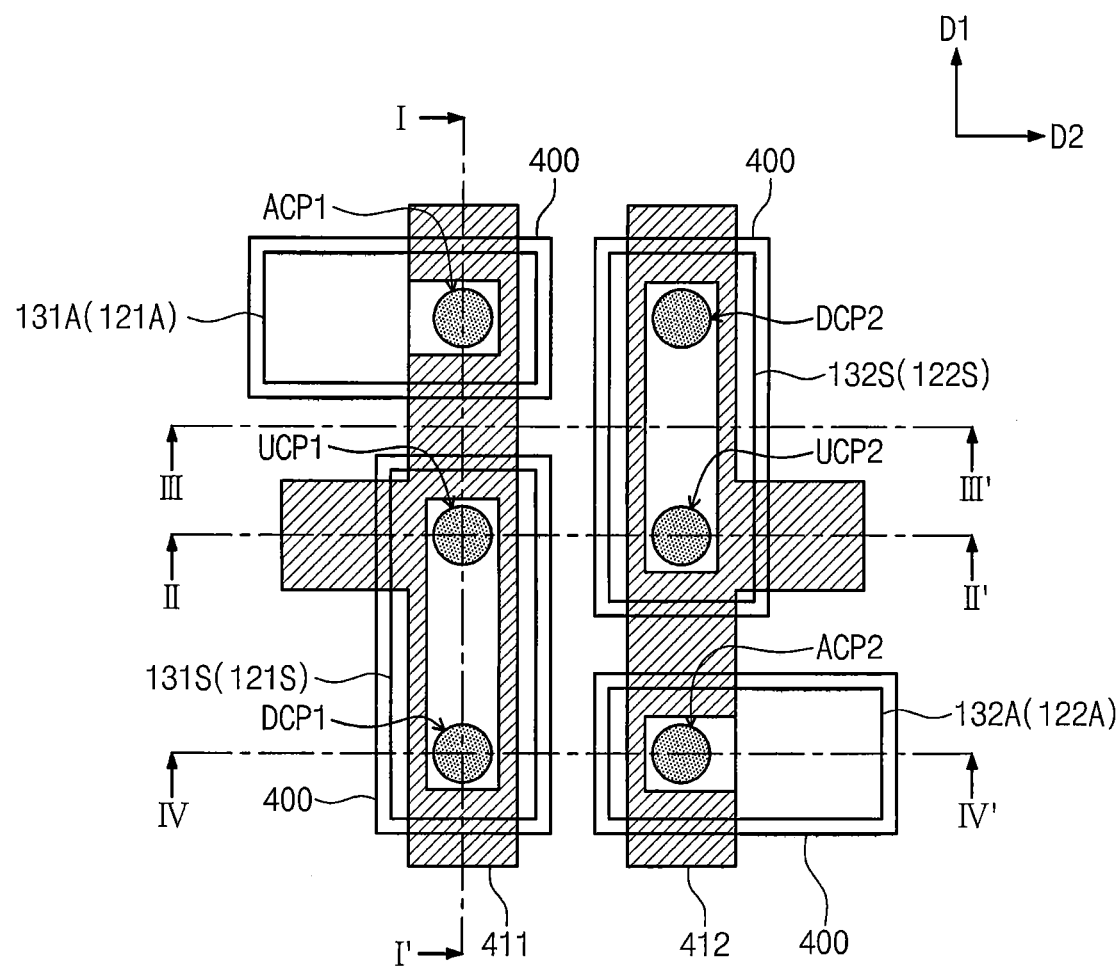
Figure 26B:
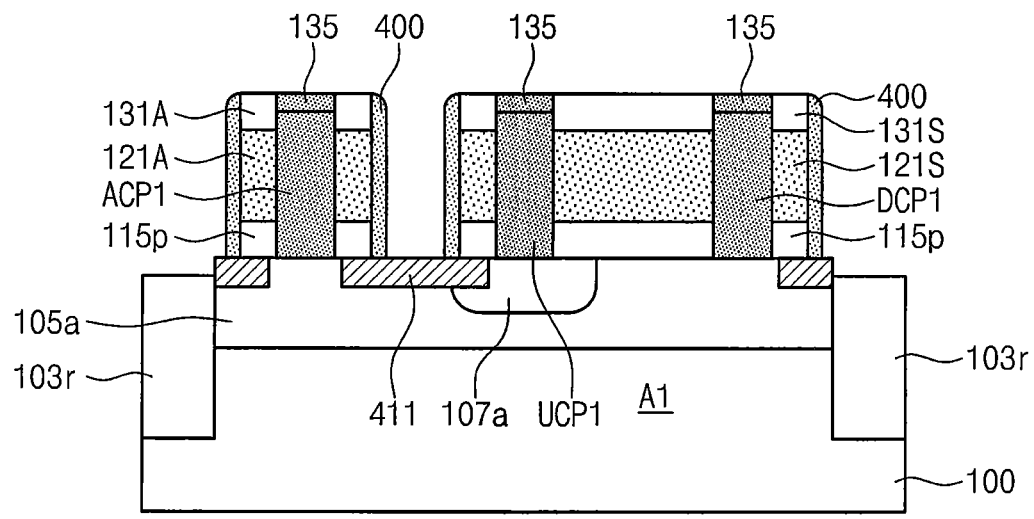
Figure 26C:
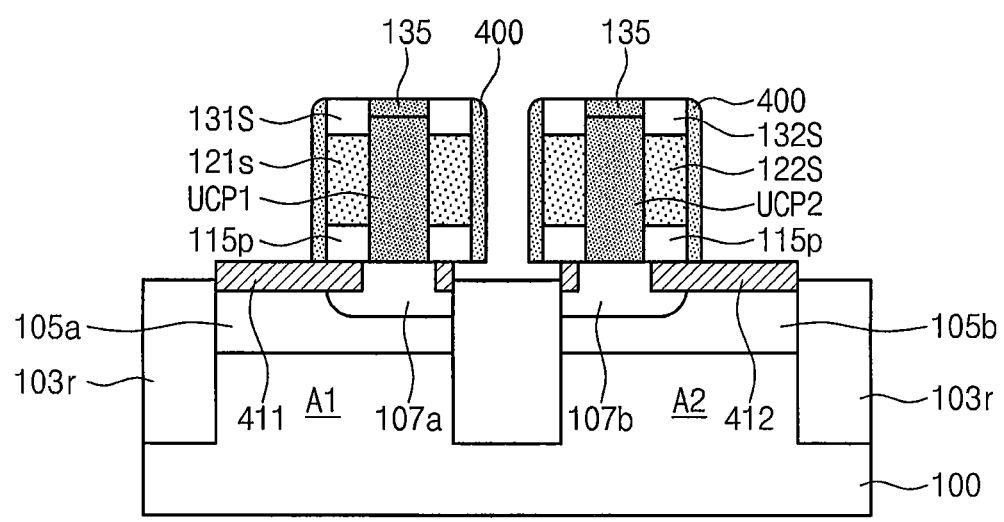
Figure 26D:
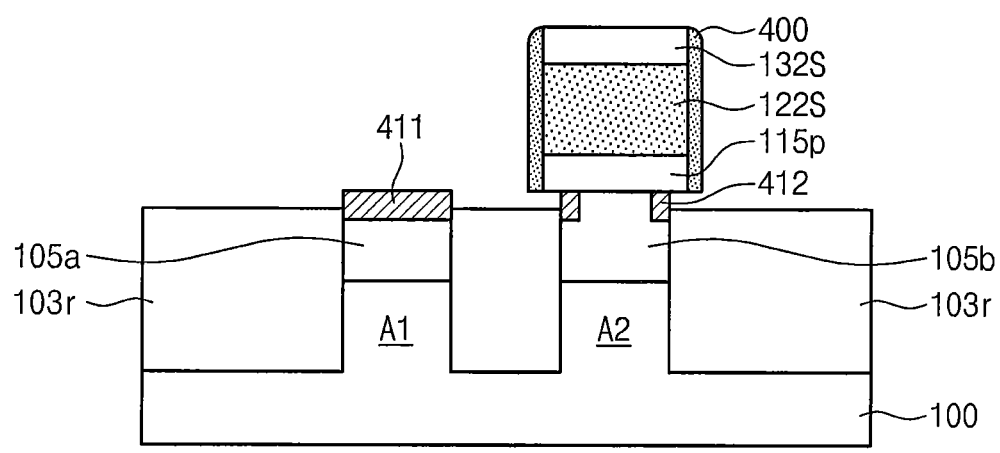
Figure 26E:
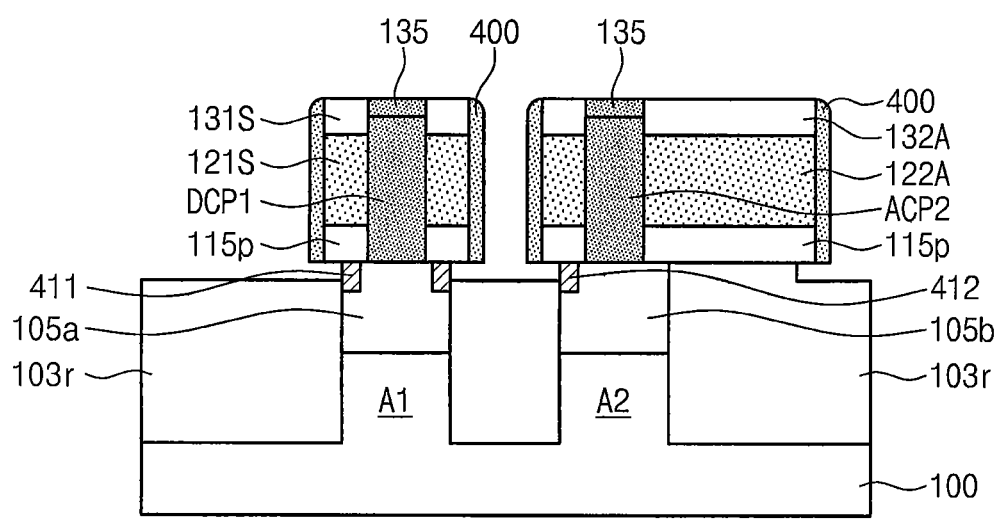
Figure 27A:
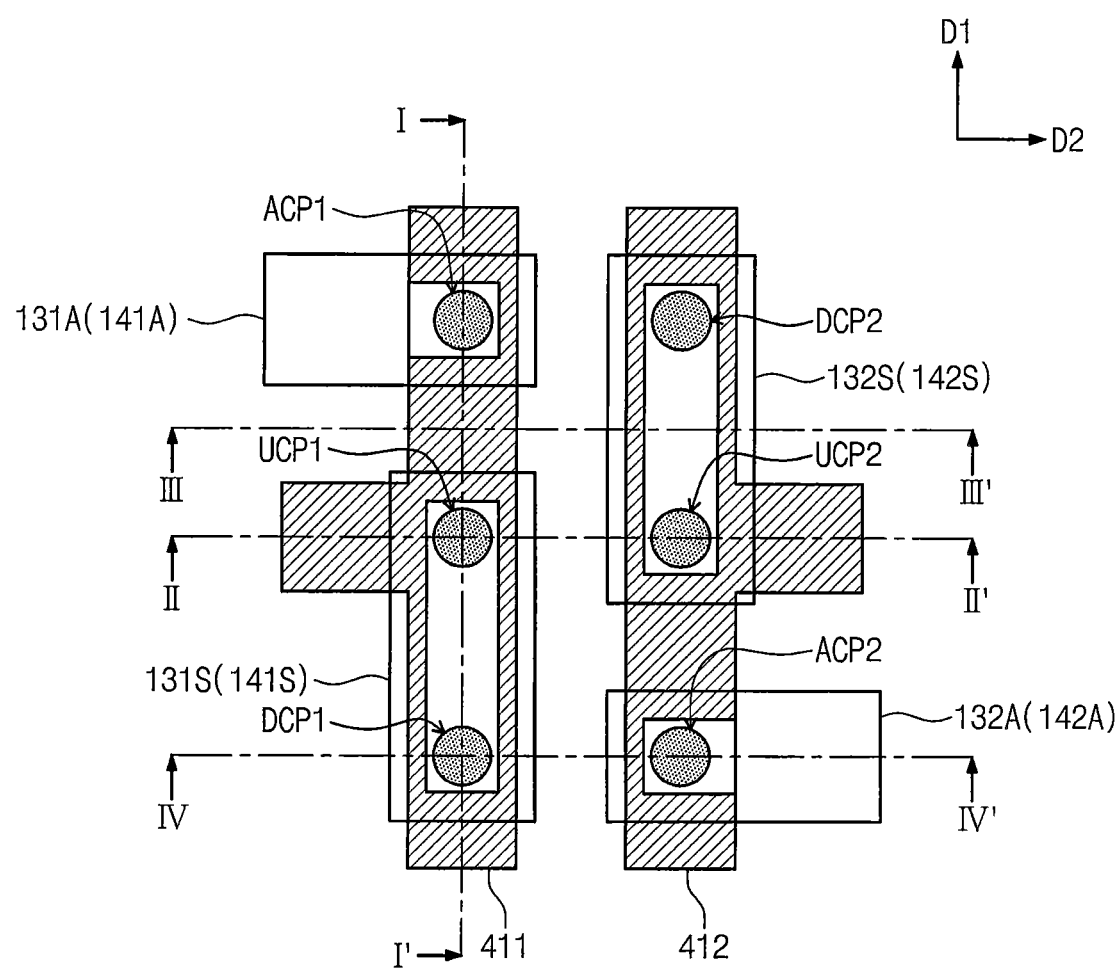
Figure 27B:
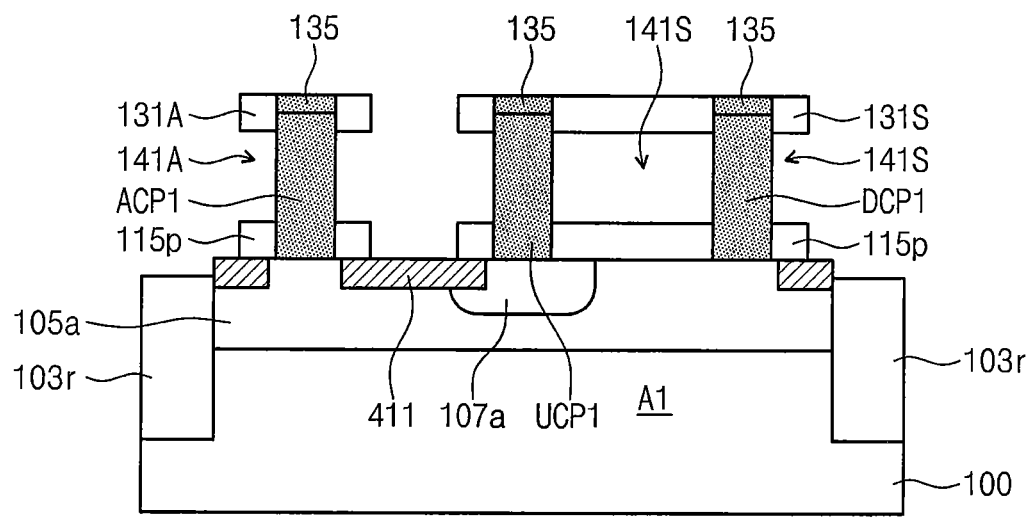
Figure 27C:
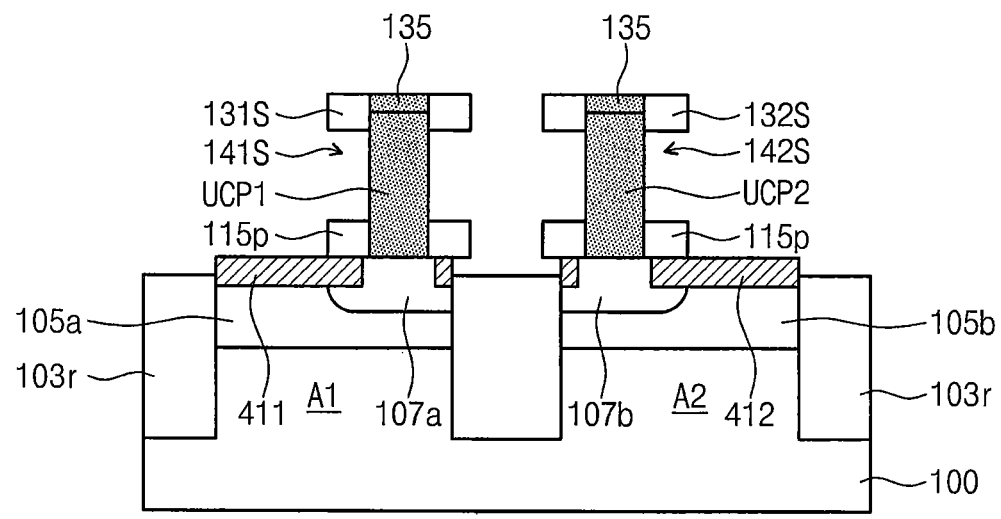
Figure 27D:
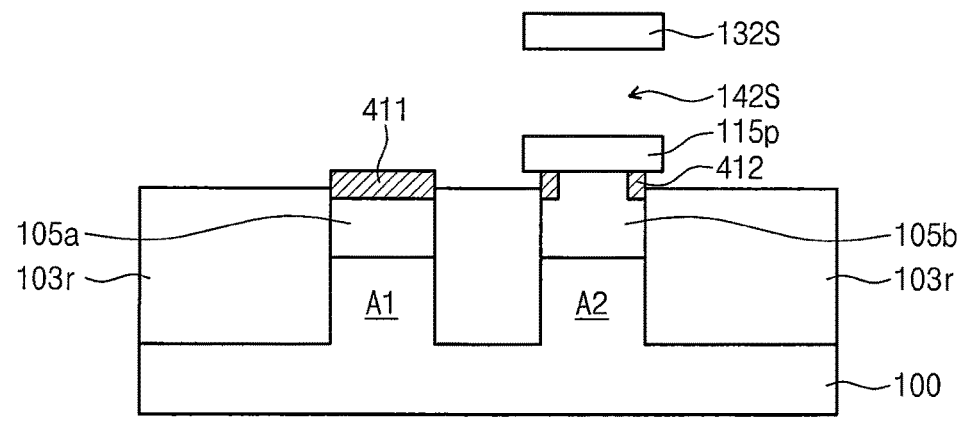
Figure 27E:
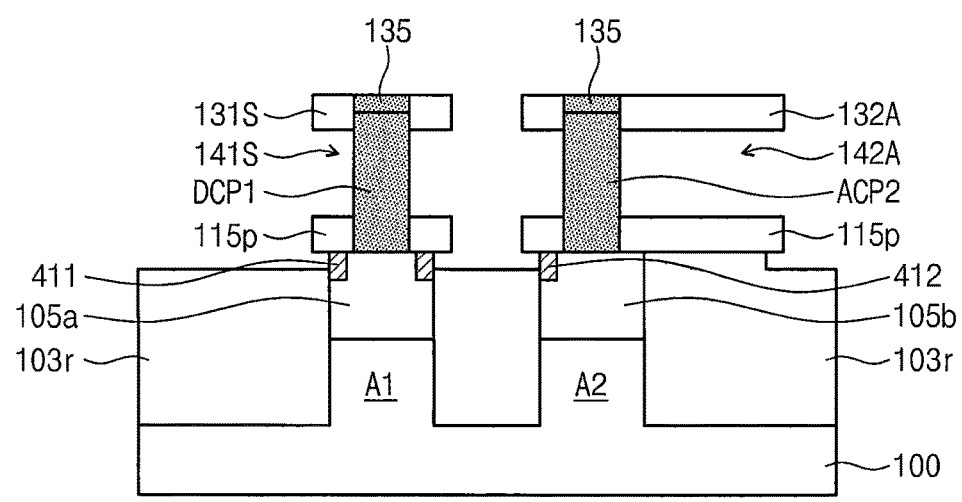

The features of the modified embodiments described with reference to FIGS. 12, 13, 14A and 14B may also be applied to the SRAM cell according to the present embodiment. For example, first access, first pull-up and first pull-down vertical channel portions ACP1$b$, UCP1$b$ and DCP1$b$ may be in contact with the top surface of the first node electrode 111, as illustrated in FIG. 23. Likewise, second access, second pull-up and second pull-down vertical channel portions may contact the top surface of the second node electrode. In this case, a buffer insulating layer 102 may be between the substrate 100 and the first and second node electrodes, and/or the active portions and the dopant regions may be omitted.

In the embodiments described above, the first and second node electrodes 111 and 112 may be formed before the vertical channel portions ACP1, UCP1, DCP1, ACP2, UCP2 and DCP2. Alternatively, node electrodes may be formed after the vertical channel portions ACP1, UCP1, DCP1, ACP2, UCP2 and DCP2.

FIGS. 24A to 27A are plan views illustrating a method of manufacturing an SRAM cell according to embodiments of the inventive concept. FIGS. 24B to 27B are cross-sectional views taken along lines I-I' of FIGS. 24A to 27A, respectively. FIGS. 24C to 27C are cross-sectional views taken along lines II-II' of FIGS. 24A to 27A, respectively. FIGS. 24D to 27D are cross-sectional views taken along lines III-III' of FIGS. 24A to 27A, respectively. FIGS. 24E to 27E are cross-sectional views taken along lines IV-IV' of FIGS. 24A to 27A, respectively.

Referring to FIGS. 24A, 24B, 24C, 24D, and 24E, the dopant regions 105$a$, 105$b$, 107$a$ and 107$b$ may be formed as described with reference to FIGS. 2A to 2E, and the lower insulating layer 115 may be formed on the substrate 100. In the present embodiment, node electrodes are not formed before the formation of the lower insulating layer 115. In the present embodiment, the first and second active portions A1 and A2 include extensions extending in parallel to the second direction D2, respectively. Positions of the extensions of the first and second active portions A1 and A2 may respectively correspond to the positions of the first and second node extensions 111$c$ and 112$c$ when viewed from a plan view.

The sacrificial layer 120 and the capping insulating layer 130 may be sequentially formed on the lower insulating layer 115. Next, the channel holes 133$a$1, 133$a$2, 133$u$1, 133$u$2, 133$d$1 and 133$d$2 may be formed to penetrate the capping insulating layer 130, the sacrificial layer 120, and the lower insulating layer 115.

The vertical channel portions ACP1, UCP1, DCP1, ACP2, UCP2 and DCP2 may be formed in the channel holes 133$a$1, 133$a$2, 133$u$1, 133$u$2, 133$d$1 and 133$d$2, respectively. As described above, the vertical channel portions ACP1, UCP1, DCP1, ACP2, UCP2 and DCP2 may be formed by the epitaxial process using the active portions A1 and A2 exposed by the channel holes 133$a$1, 133$a$2, 133$u$1, 133$u$2, 133$d$1 and 133$d$2 as a seed. In some embodiments, the vertical channel portions ACP1, UCP1, DCP1, ACP2, UCP2 and DCP2 may be formed by a selective epitaxial growth (SEG) process.

Figure 28:
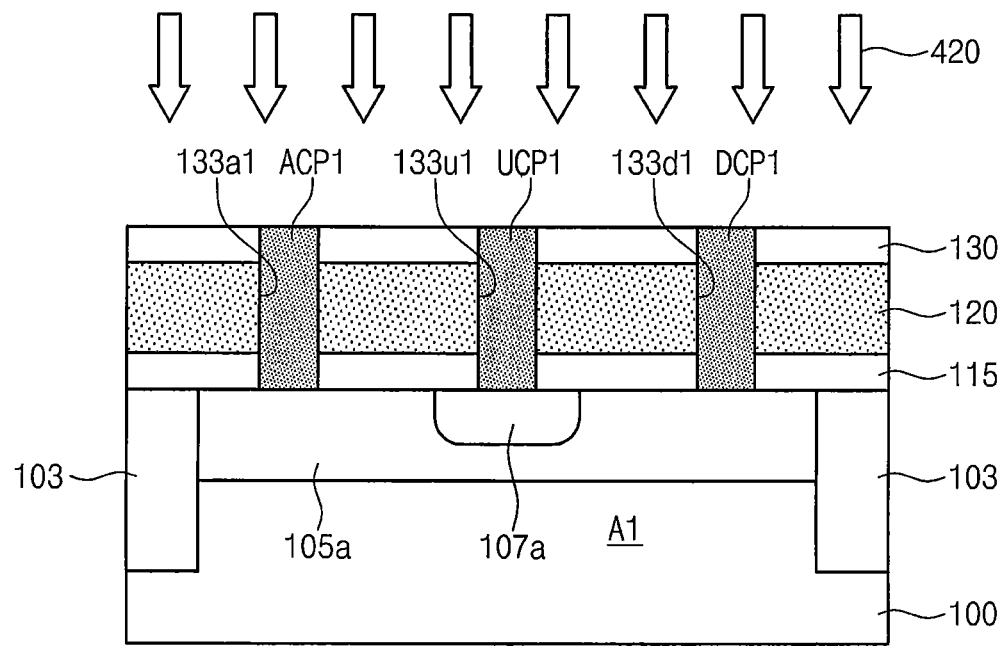
FIG. 28 is a cross-sectional view illustrating methods of manufacturing an SRAM cell according to embodiments of the inventive concept.

In other embodiments, the vertical channel portions ACP1, UCP1, DCP1, ACP2, UCP2 and DCP2 may be formed using a laser-induced epitaxial growth process, described, for example, with reference to FIG. 28. FIG. 28 is a cross-sectional view corresponding to the line I-I' of FIG. 24A. Referring to FIG. 28, the channel holes 133$a$1, 133$a$2, 133$u$1, 133$u$2, 133$d$1 and 133$d$2 may be filled with a poly-crystalline semiconductor material (e.g., poly-silicon). A laser beam 420 may be impinged on the poly-crystalline semiconductor material to recrystallize the poly-crystalline semiconductor material. The poly-crystalline semiconductor material may be recrystallized by the laser beam 420 using the active portions A1 and A2 exposed by the channel holes 133$a$1, 133$a$2, 133$u$1, 133$u$2, 133$d$1 and 133$d$2 as a seed. This laser-induced epitaxial growth process may be applied to the embodiments described above.

Referring to FIGS. 25A, 25B, 25C, 25D, and 25E, the upper electrodes 135 may be formed on top ends of the vertical channel portions ACP1, UCP1, DCP1, ACP2, UCP2 and DCP2, respectively, as described with reference to FIGS. 4A to 4E.

Figure 29:
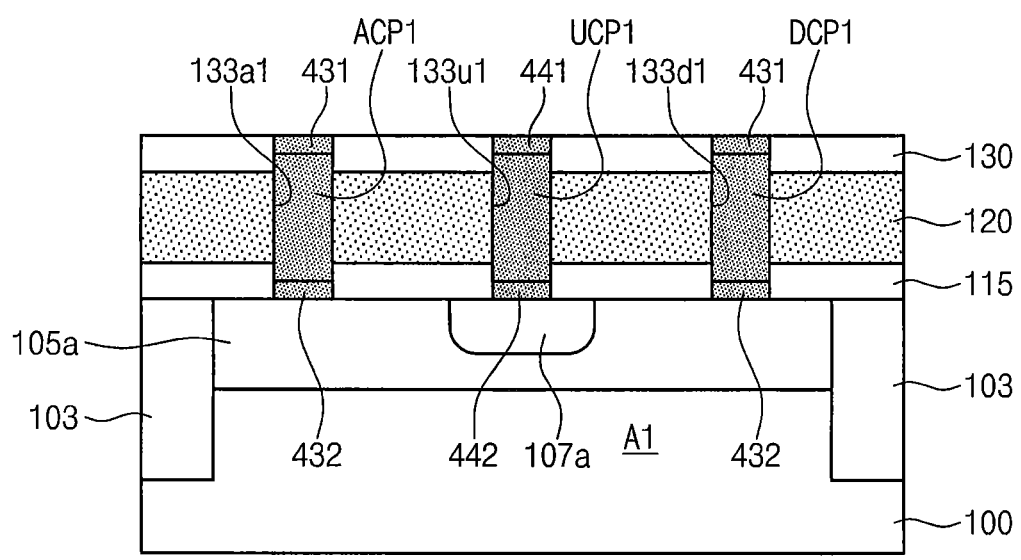
FIG. 29 is a cross-sectional view illustrating methods of manufacturing an SRAM cell according to embodiments of the inventive concept.

In other embodiments, source/drain regions may be respectively formed in a top end portion and a bottom end portion of each of the vertical channel portions ACP1, UCP1, DCP1, ACP2, UCP2 and DCP2, as described, for example, with reference to FIG. 29. FIG. 29 is a cross-sectional view corresponding to the line I-I' of FIG. 24A. Referring to FIG. 29, a first low energy ion implantation process may be performed to form first N-type source/drain regions 431 in top end portions of the access and pull-down vertical channel portions ACP1, ACP2, DCP1 and DCP2 included in NMOS transistors, respectively. A first high energy ion implantation process may be performed to form second N-type source/drain regions 432 in bottom end portions of the access and pull-down vertical channel portions ACP1, ACP2, DCP1 and DCP2, respectively. The implantation energy of the first high energy ion implantation process is greater than the implantation energy of the first low energy ion implantation process. In some embodiments, the dose of the first high energy ion implantation process may be substantially equal to the dose of the first low energy ion implantation process. When the first low and high energy ion implantation processes are performed, the pull-up vertical channel portions UCP1 and UCP2 are covered with a mask pattern. A second low energy ion implantation process may be performed to form first P-type source/drain regions 441 in top end portions of the pull-up vertical channel portions UCP1 and UCP2, respectively. A second high energy ion implantation process may be performed to form second P-type source/drain regions 442 in bottom end portions of the pull-up vertical channel portions UCP1 and UCP2, respectively. The implantation energy of the second high energy ion implantation process is greater than the implantation energy of the second low energy ion implantation process. In some embodiments, the dose of the second high energy ion implantation process may be substantially equal to the dose of the second low energy ion implantation process. When the second low and high energy ion implantation processes are performed, the access and pull-down vertical channel portions ACP1, ACP2, DCP1 and DCP2 are covered with a mask pattern.

Referring again to FIGS. 25A, 25B, 25C, 25D, and 25E, the capping insulating layer 130, the sacrificial layer 120, and the lower insulating layer 115 may be successively patterned to form first to fourth sacrificial patterns 121A, 121S, 122A and 122S, first to fourth capping patterns 131A, 131S, 132A and 132S, and lower insulating patterns 115p. At this time, the active portions A1 and A2 between the sacrificial patterns 121A, 121S, 122A and 122S are exposed. Each of the lower insulating patterns 115p may have a substantially same planar shape as the sacrificial pattern 121A, 121S, 122A or 122S thereon.

Next, a spacer layer may be conformally formed on the substrate 100, and the spacer layer may be anisotropically etched until the active portions A1 and A2 are exposed, thereby forming spacers 400 on sidewalls of the patterns 115p, 121A, 121S, 122A, 122S, 131A, 131S, 132A and 132S. In some embodiments, the spacers 400 may be formed of the same material as the sacrificial patterns 121A, 121S, 122A or 122S. For example, the spacers 400 may be formed of silicon nitride.

After the formation of the spacers 400, the device isolation pattern 103 may be recessed. A top surface of the recessed device isolation pattern 103r may be lower than top surfaces of the active portions A1 and A2. The device isolation pattern 103 may be recessed by an isotropic etching process (e.g., a wet etching process).

Referring to FIGS. 26A, 26B, 26C, 26D, and 26E, a silicidation process may be performed on the exposed active portions A1 and A2 to form first and second node electrodes 411 and 412. In more detail, a metal layer may be formed on the substrate 100, and the metal layer may react with the exposed active portions A1 and A2 to form the first and second node electrodes 411 and 412. Subsequently, an unreacted metal layer may be removed. For example, the metal layer may include tungsten, nickel, titanium, or cobalt. Thus, the first and second node electrodes 411 and 412 according to the present embodiment may be formed of tungsten silicide, nickel silicide, titanium silicide, or cobalt silicide.

The first node electrode 411 contacts the first N-type dopant region 105a and the first P-type dopant region 107a. Thus, the first N-type and P-type dopant regions 105a and 107a may be electrically connected to each other by the first node electrode 411. Likewise, the second node electrode 412 contacts the second N-type dopant region 105b and the second P-type dopant region 107b. Thus, the second N-type and P-type dopant regions 105b and 107b may be electrically connected to each other by the second node electrode 412. As a result, bottom ends of the first access, pull-up and pull-down vertical channel portions ACP1, UCP1 and DCP1 are electrically connected to each other by the first node electrode 411. Bottom ends of the second access, pull-up and pull down vertical channel portions ACP2, UCP2 and DCP2 are electrically connected to each other by the second node electrode 412.

An extension of the first node electrode 411, which is formed on the extension of the first active portion A1, may function as the first node extension 111c illustrated in FIGS. 2A to 2E. An extension of the second node electrode 412, which is formed on the extension of the second active portion A2, may function as the second node extension 112c illustrated in FIGS. 2A to 2E.

In some embodiments, the first and the second node electrodes 411 and 412 may be spaced apart from bottom surfaces of the vertical channel portions ACP1, UCP1, DCP1, ACP2, UCP2 and DCP2. Alternatively, metal atoms may be diffused under the bottom surfaces of the vertical channel portions ACP1, UCP1, DCP1, ACP2, UCP2 and DCP2 during the silicidation process. In this case, the first node electrode 411 may contact the bottom surfaces of the first access, pull-up and pull-down vertical channel portions ACP1, UCP1 and DCP1, and the second node electrode 412 may contact the bottom surfaces of the second access, pull-up and pull down vertical channel portions ACP2, UCP2 and DCP2.

Referring to FIGS. 27A, 27B, 27C, 27D, and 27E, the spacers 400 and the sacrificial patterns 121A, 121S, 122A and 122S may be removed to form empty regions 141A, 141S, 142A and 142S after the formation of the node electrodes 411 and 412, Thereafter, subsequent processes may be performed as described with reference to FIGS. 5A to 11A, 5B to 11B, 5C to 11C, 5D to 11D, and 5E to 11E. Thus, an SRAM cell of FIGS. 30A to 30E may be manufactured.

Figure 30A:
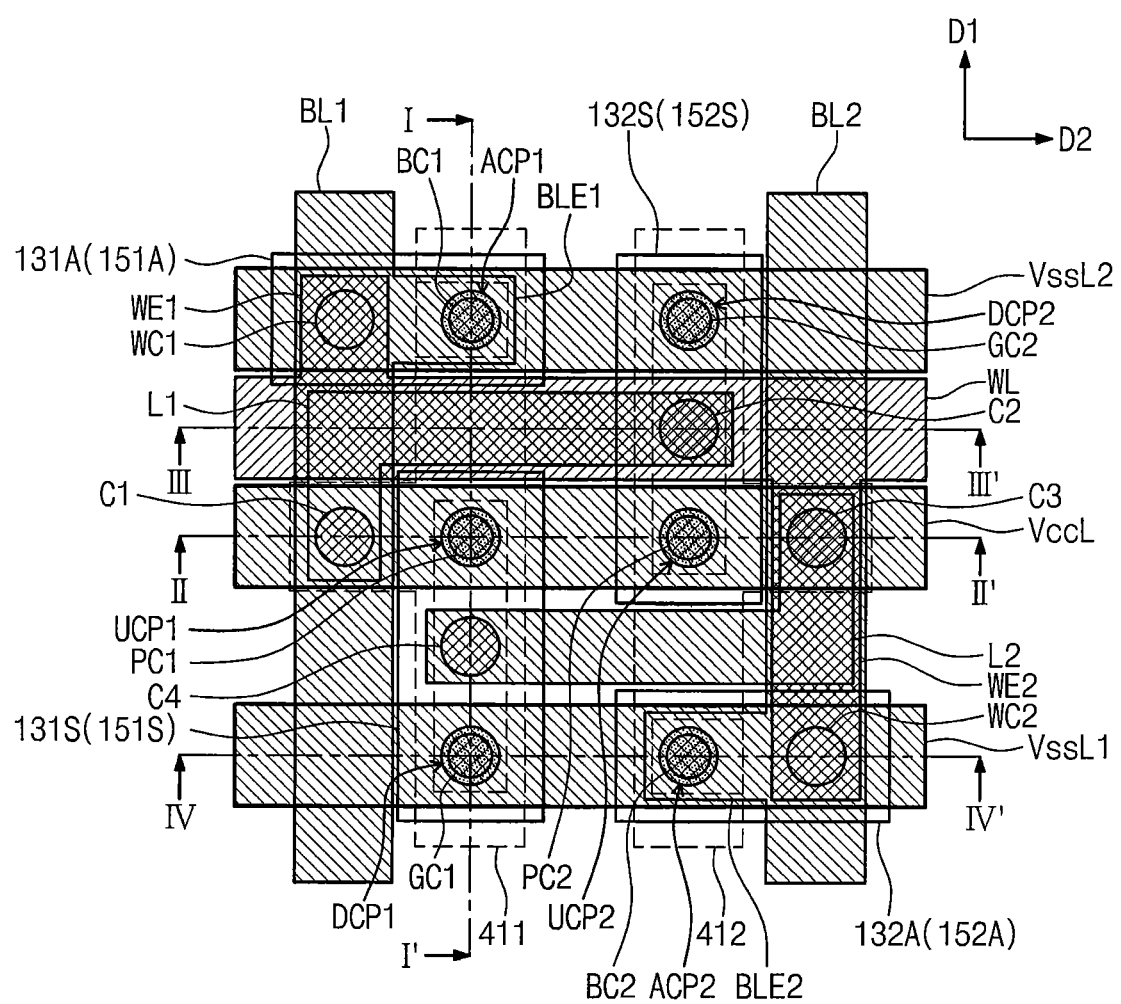
FIG. 30A is a plan view illustrating an SRAM cell according to embodiments of the inventive concept.
Figure 30B:
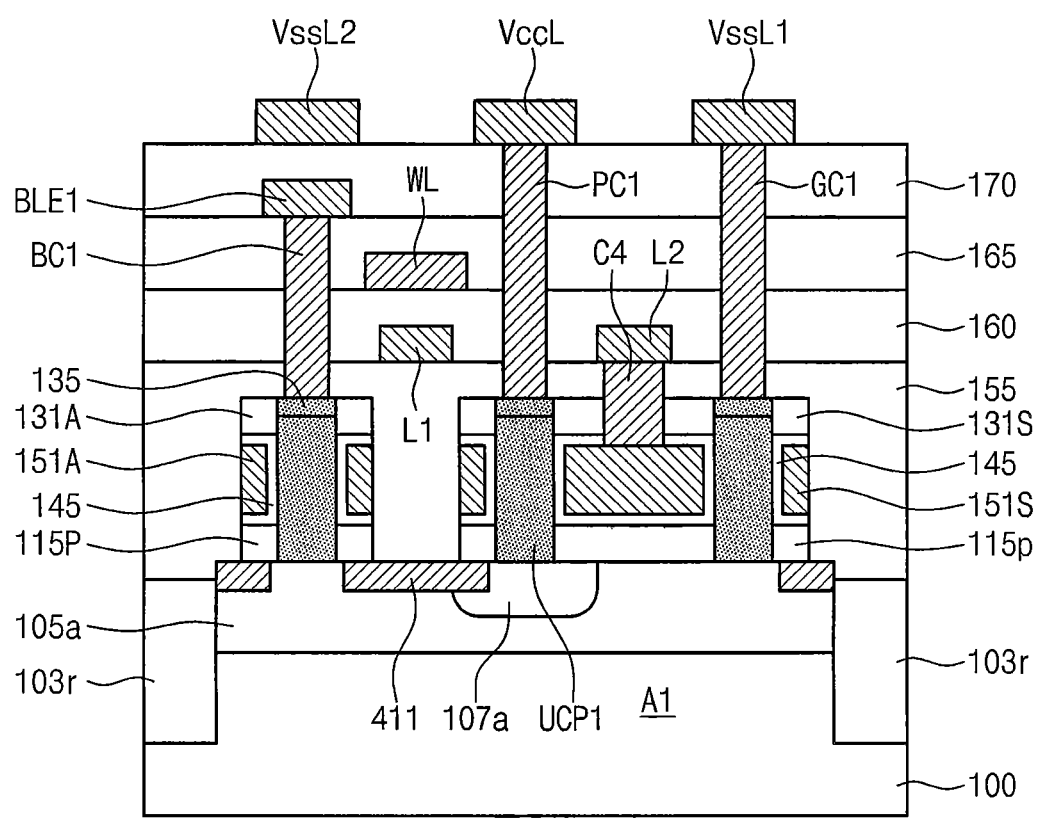
FIGS. 30B, 30C, 30D, and 30E are cross-sectional views taken along lines I-I', II-II', III-III', and IV'-IV' of FIG. 30A, respectively.
Figure 30C:
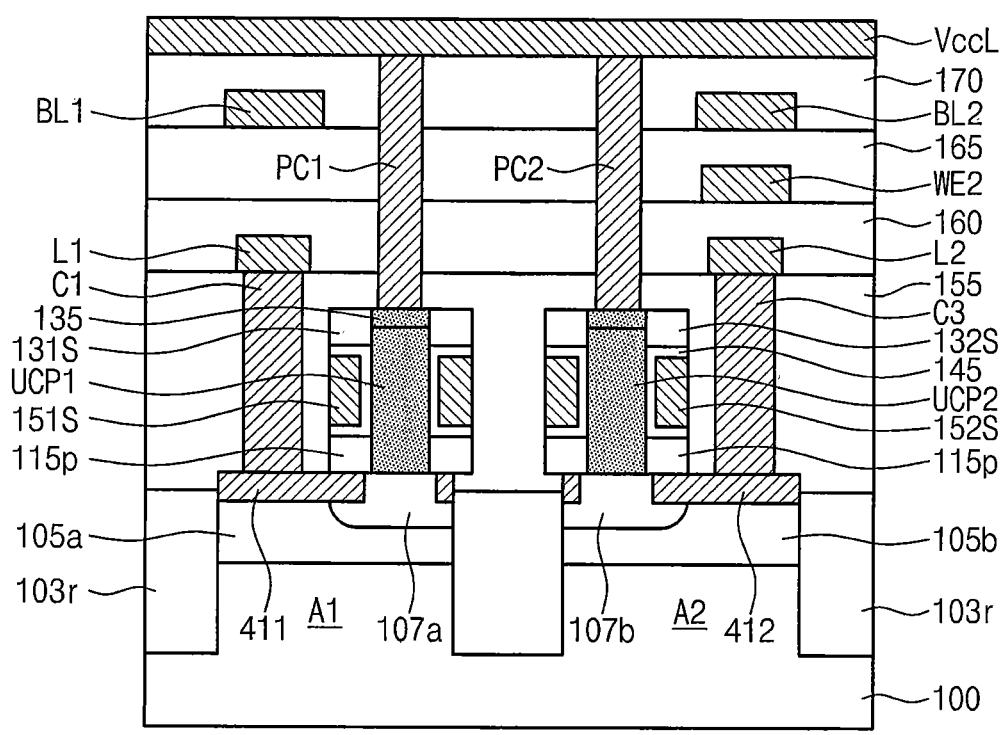
Figure 30D:
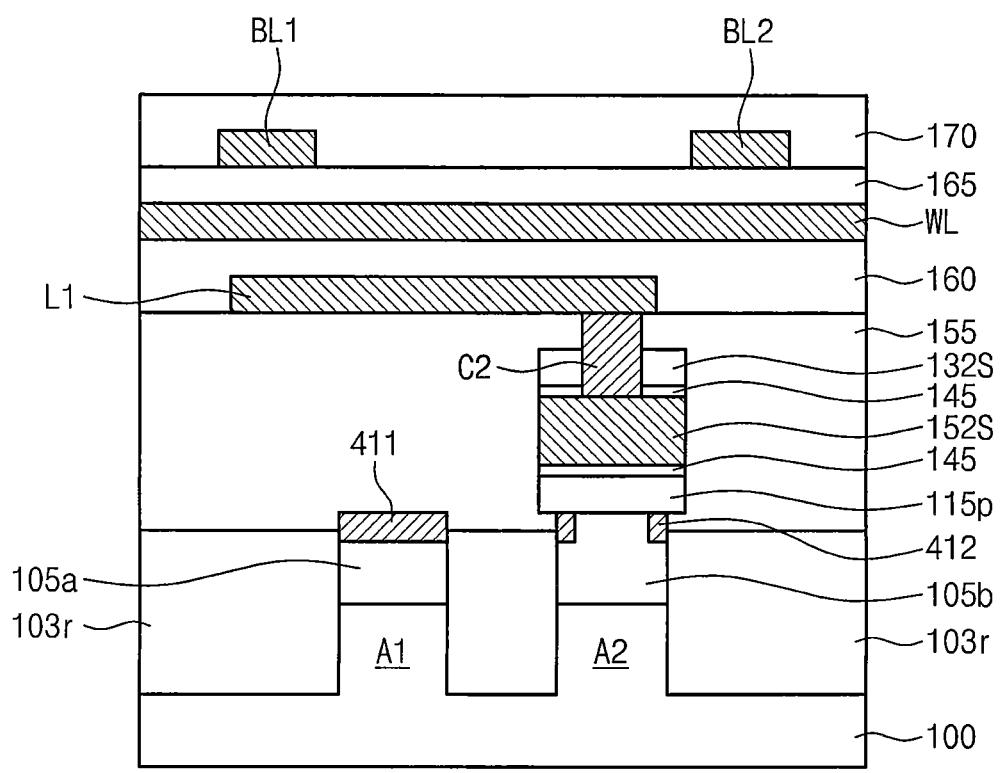
Figure 30E:
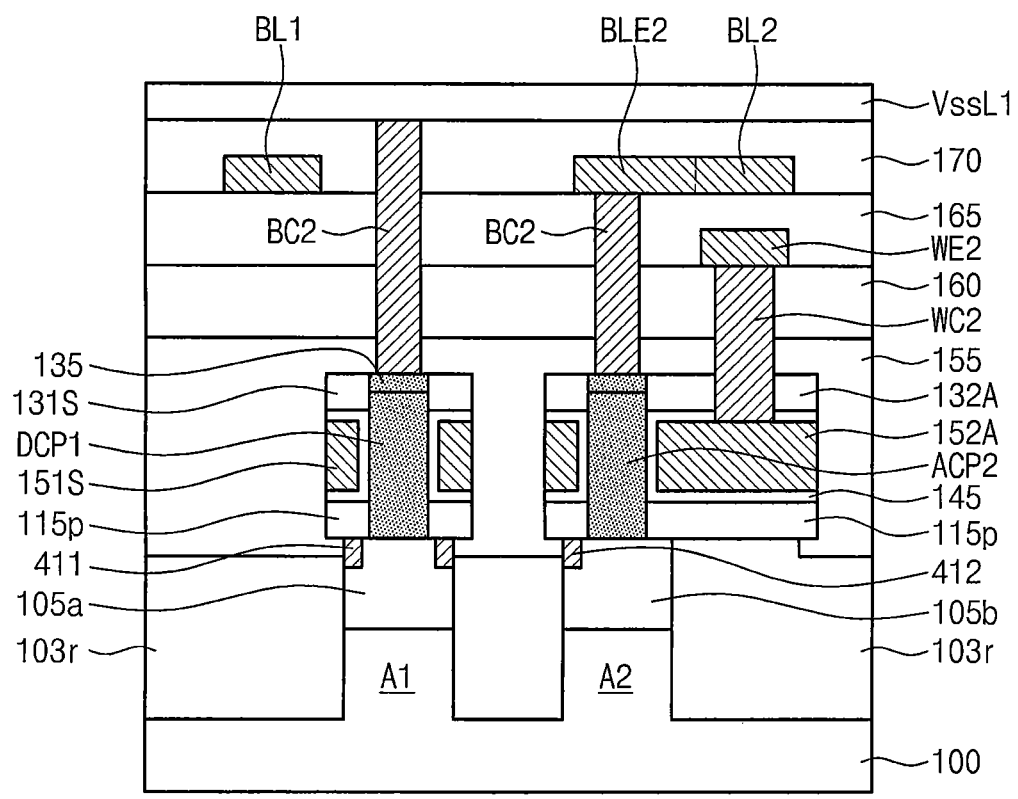

FIG. 30A is a plan view illustrating an SRAM cell according to embodiments of the inventive concept. FIGS. 30B, 30C, 30D, and 30E are cross-sectional views taken along lines I-I', II-II', III-III', and IV'-IV' of FIG. 30A, respectively.

Referring to FIGS. 30A, 30B, 30C, 30D, and 30E, the first node electrode 411 may be formed on the first active portion A1 not covered by the first access gate 151A and the first shared gate 151S. The first node electrode 411 may extend under the first access and shared gates 151A and 151S. The first node electrode 411 electrically connects the first N-type dopant region 105a to the first P-type dopant region 107a. The bottom ends of the first access, pull-up and pull-down vertical channel portions ACP1, UCP1 and DCP1 are in contact with the first N-type and P-type dopant regions 105a and 107a. Thus, the bottom ends of the first access, pull-up and pull-down vertical channel portions ACP1, UCP1 and DCP1 are electrically connected to each other by the first node electrode 411. Likewise, the second node electrode 412 may be formed on the second active portion A2 not covered by the second access gate 152A and the second shared gate 152S. The second node electrode 412 may extend under the second access and shared gates 152A and 152S. The second node electrode 412 electrically connects the second N-type dopant region 105b to the second P-type dopant region 107b. The bottom ends of the second access, pull-up and pull-down vertical channel portions ACP2, UCP2 and DCP2 contact the second N-type and P-type dopant regions 105b and 107b. Thus, the bottom ends of the second access, pull-up and pull-down vertical channel portions ACP2, UCP2 and DCP2 are electrically connected to each other by the second node electrode 412.

As described above, the extension of the first node electrode 411, which is disposed on the extension of the first active portion A1, functions as the first node extension 111c of FIGS. 11A to 11E. The extension of the second node electrode 412, which is disposed on the extension of the second active portion A2, functions as the second node extension 112c of FIGS. 11A to 11E. Thus, the extension of the first node electrode 411 is electrically connected to the second shared gate 152S through the first local interconnection L1, and the extension of the second node electrode 412 is electrically connected to the first shared gate 151S through the second local interconnection L2.

The semiconductor device including the SRAM cell described herein may be realized as one of various kinds of semiconductor devices such as SRAM devices, logic devices and system-on-chips.

The semiconductor devices including the SRAM cell may be encapsulated using various packaging techniques. For example, the semiconductor devices including the SRAM cell may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 31:
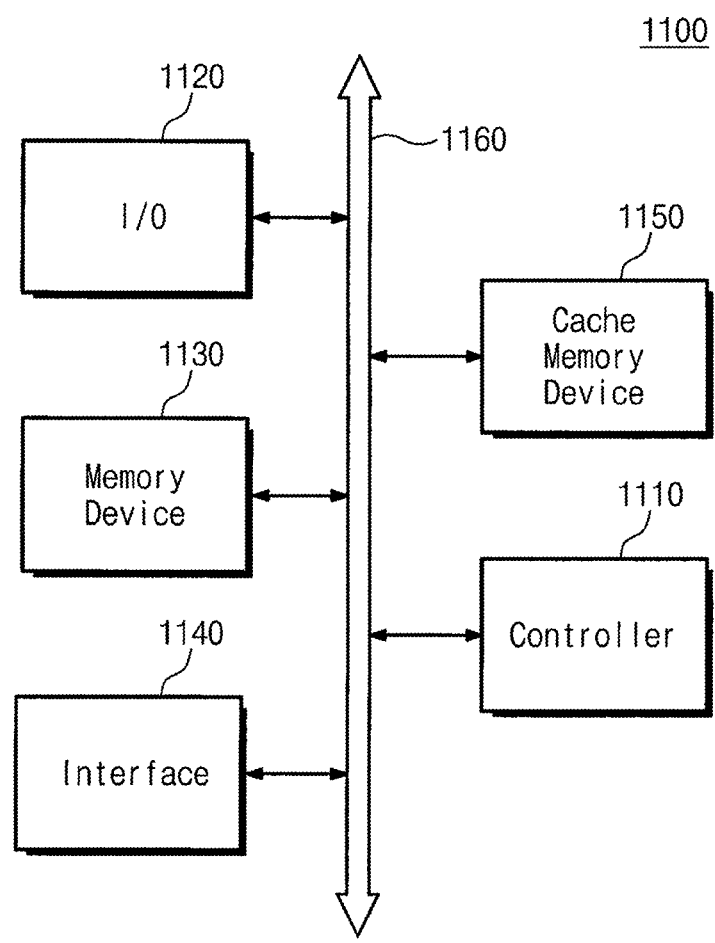
FIG. 31 is a schematic block diagram illustrating an electronic system according to example embodiments of the inventive concept.

FIG. 31 is a schematic block diagram illustrating an electronic system according to example embodiments of the inventive concepts.

Referring to FIG. 31, an electronic system 1100 according to embodiments of the inventive concept may include a controller 1110, an input/output (I/O) unit 1120, a memory device 1130, an interface unit 1140, a cache memory device 1150, and a data bus 1160. At least two of the controller 1110, the I/O unit 1120, the memory device 1130, the interface unit 1140, and the cache memory device 1150 may communicate with each other through the data bus 1160. The data bus 1160 may correspond to a path through which electrical signals are transmitted.

The controller 1110 may include at least one of a microprocessor, a digital signal processor, a microcontroller, and other logic devices having a similar function to any one thereof. The I/O unit 1120 may include a keypad, a keyboard and/or a display unit. The memory device 1130 may store data and/or commands. The memory device 1130 may include a non-volatile memory device (e.g., a flash memory device, a phase change memory device, and/or a magnetic memory device). Additionally, the memory device 1130 may further include a volatile memory device. In this case, the memory device 1130 may include the semiconductor device including at least one of the SRAM cells according to the aforementioned embodiments. The interface unit 1140 may transmit data to a communication network or may receive data from a communication network. The interface unit 1140 may operate wirelessly or via cable. For example, the interface unit 1140 may include an antenna for wireless communication or a transceiver for cable communication. The cache memory device 1150 may be used as an operational memory of the controller 1110. The cache memory device 1150 may include the semiconductor device including at least one of the SRAM cells according to the aforementioned embodiments. In some embodiments, the cache memory device 1150 and the controller 1110 may be realized as a system-on-chip.

The electronic system 1100 may be applied to a personal digital assistant (PDA), a portable computer, a web tablet, a wireless phone, a mobile phone, a digital music player, a memory card or other electronic products. The other electronic products may receive or transmit information data wirelessly.

As described above, the SRAM cell includes the transistors including the vertical channel portions. Thus, the occupied planar area of the SRAM cell may be reduced.

While the inventive concepts have been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed:

1. A static random access memory (SRAM) cell comprising:
   a first access gate, a first shared gate, a second access gate, and a second shared gate laterally spaced apart from each other on a substrate;
   a first access vertical channel portion penetrating the first access gate;
   a first pull-up vertical channel portion and a first pull-down vertical channel portion which penetrate the first shared gate;
   a second access vertical channel portion penetrating the second access gate;
   a second pull-up vertical channel portion and a second pull-down vertical channel portion which penetrate the second shared gate;
   a gate dielectric layer between each of the vertical channel portions and corresponding ones of the gates;
   a first node electrode electrically connected to bottom end portions of the first access, first pull-up and first pull-down vertical channel portions; and
   a second node electrode electrically connected to bottom end portions of the second access, second pull-up and second pull-down vertical channel portions,
   wherein the first node electrode is electrically connected to the second shared gate, and
   wherein the second node electrode is electrically connected to the first shared gate.

2. The SRAM cell of claim 1, further comprising:
   a first node extension laterally extending from the first node electrode and electrically connected to the second shared gate; and a second node extension laterally extending from the second node electrode and electrically connected to the first shared gate.

3. The SRAM cell of claim 2, wherein the first node extension is electrically connected to the second shared gate through a first local interconnection or a first local interconnection contact plug, and
wherein the second node extension is electrically connected to the first shared gate through a second local interconnection or a second local interconnection contact plug.

4. The SRAM cell of claim 1, wherein the first node electrode is under the first access gate and the first shared gate,
wherein the first access vertical channel portion, the first pull-up vertical channel portion, and the first pull-down vertical channel portion penetrate the first node electrode to contact the substrate,
wherein the second node electrode is under the second access gate and the second shared gate, and
wherein the second access vertical channel portion, the second pull-up vertical channel portion, and the second pull-down vertical channel portion penetrate the second node electrode to contact the substrate.

5. The SRAM cell of claim 4, wherein the first and second access vertical channel portions, the first and second pull-up vertical channel portions, and the first and second pull-down vertical channel portions include a single-crystalline semiconductor material.

6. The SRAM cell of claim 4, further comprising:
a device isolation pattern in the substrate and defining a first active portion and a second active portion;
a first N-type dopant region and a second N-type dopant region in the first active portion and the second active portion, respectively; and
a first P-type dopant region and a second P-type dopant region in the first N-type dopant region and the second N-type dopant region, respectively,
wherein the first node electrode is in contact with the first N-type dopant region and the first P-type dopant region,
wherein the second node electrode is in contact with the second N-type dopant region and the second P-type dopant region,
wherein the first access vertical channel portion and the first pull-down vertical channel portion are in contact with the first N-type dopant region,
wherein the first pull-up vertical channel portion is in contact with the first P-type dopant region,
wherein the second access vertical channel portion and the second pull-down vertical channel portion are in contact with the second N-type dopant region, and
wherein the second pull-up vertical channel portion is in contact with the second P-type dopant region.

7. The SRAM cell of claim 1, wherein the first access vertical channel portion, the first pull-up vertical channel portion, and the first pull-down vertical channel portion are electrically connected to a top surface of the first node electrode, and
wherein the second access vertical channel portion, the second pull-up vertical channel portion, and the second pull-down vertical channel portion are electrically connected to a top surface of the second node electrode.

8. A static random access memory (SRAM) cell comprising:

a first access gate, a first shared gate, a second access gate, and a second shared gate laterally spaced apart from each other on a substrate;
a first access vertical channel portion penetrating the first access gate;
a first pull-up vertical channel portion and a first pull-down vertical channel portion which penetrate the first shared gate;
a second access vertical channel portion penetrating the second access gate;
a second pull-up vertical channel portion and a second pull-down vertical channel portion which penetrate the second shared gate;
a gate dielectric layer between each of the vertical channel portions and corresponding ones of the gates;
a first access capping pattern and a first shared capping pattern on the first access gate and the first shared gate, respectively; and
a second access capping pattern and a second shared capping pattern on the second access gate and the second shared gate, respectively,
wherein bottom end portions of each of the first access vertical channel portion, the first pull-up vertical channel portion and the first pull-down vertical channel portion are electrically connected to the second shared gate, and
wherein bottom end portions of each of the second access vertical channel portion, the second pull-up vertical channel portion and the second pull-down vertical channel portion are electrically connected to the first shared gate, and
wherein the gate dielectric layer extends between a top surface of each of the gates and a bottom surface of each of the capping patterns and between a bottom surface of each of the gates and the substrate.

9. The SRAM cell of claim 1, further comprising:
a word line electrically connected to the first and second access gates;
a first bit line electrically connected to a top end of the first access vertical channel portion; and
a second bit line electrically connected to a top end of the second access vertical channel portion,
wherein, in an operating mode, a power source voltage is applied to top ends of the first and second pull-up vertical channel portions, and a ground voltage is applied to top ends of the first and second pull-down vertical channel portions.

10. The SRAM cell of claim 1, wherein the first and second access vertical channel portions, the first and second pull-up vertical channel portions, and the first and second pull-down vertical channel portions include one of a group IV semiconductor material, a group III-V compound semiconductor material, and a carbon nanotube.

11. A static random access memory (SRAM) cell comprising:
a first pull-up transistor, a first pull-down transistor, a second pull-up transistor, a second pull-down transistor, a first access transistor, and a second access transistor, all being coupled together in a 6 transistor SRAM cell, wherein each of the transistors is configured as a vertical channel transistor;
the first pull-up transistor comprises a first pull-up vertical channel transistor that is coupled to a power supply voltage;
the first pull-down transistor comprises a first pull-down vertical channel transistor that is coupled to a reference voltage and coupled to the first pull-up vertical channel transistor to provide a first inverter circuit of the SRAM cell;

the second pull-up transistor comprises a second pull-up vertical channel transistor coupled to the power supply voltage;

the second pull-down transistor comprises a second pull-down vertical channel transistor coupled to the reference voltage and coupled to the second pull-up vertical channel transistor to provide a second inverter circuit of the SRAM cell that is cross-coupled to the first inverter circuit;

the first access transistor comprises a first access vertical channel transistor coupled to a first bit line, a word line, the first inverter circuit, and to the second inverter circuit; and the second access transistor comprises a second access vertical channel transistor coupled to a second bit line, the word line, and to the first inverter circuit;

wherein bottom ends of respective vertical channels in each of the first access vertical channel transistor, the first pull-up vertical channel transistor and the first pull-down vertical channel transistor are in contact with a planar first node electrode that is electrically connected to a second shared gate in the second inverter circuit; and wherein bottom ends of each of respective vertical channels in each of the second access vertical channel transistor, the second pull-up vertical channel transistor and the second pull-down vertical channel transistor are in contact with a planar second node electrode that is electrically connected to a first shared gate in the first inverter circuit.

12. The SRAM cell of claim 11 further comprising:
a first node planar extension laterally extending from the planar first node electrode to the second shared gate; and
a second node planar extension laterally extending from the planar second node electrode to the first shared gate.

13. The SRAM cell of claim 12, wherein the first access vertical channel, the first pull-up vertical channel, and the first pull-down vertical channel are electrically connected to a top surface of the planar first node electrode, and
wherein the second access vertical channel, the second pull-up vertical channel, and the second pull-down vertical channel are electrically connected to a top surface of the planar second node electrode.

* * * * *